(12) United States Patent
Maenishi

(10) Patent No.: US 7,890,204 B2
(45) Date of Patent: Feb. 15, 2011

(54) METHOD OF DETERMINING MOUNTING CONDITION

(75) Inventor: Yasuhiro Maenishi, Saga (JP)

(73) Assignee: Panasonic Corporation, Osaka (JP)

( * ) Notice: Subject to any disclaimer, the term of this patent is extended or adjusted under 35 U.S.C. 154(b) by 357 days.

(21) Appl. No.: 12/279,072

(22) PCT Filed: Mar. 20, 2007

(86) PCT No.: PCT/JP2007/056521

§ 371 (c)(1),
(2), (4) Date: Aug. 12, 2008

(87) PCT Pub. No.: WO2007/119541

PCT Pub. Date: Oct. 25, 2007

(65) Prior Publication Data

US 2009/0204251 A1      Aug. 13, 2009

(30) Foreign Application Priority Data

Mar. 28, 2006  (JP)  ............................. 2006-087746
Mar. 29, 2006  (JP)  ............................. 2006-091381

(51) Int. Cl.
*G06F 19/00* (2006.01)
(52) U.S. Cl. .................... 700/121; 700/32; 702/182
(58) Field of Classification Search .................. 700/32, 700/114, 117, 228, 121; 702/182; 29/743, 29/832, 740, 739; 228/180, 21
See application file for complete search history.

(56) References Cited

U.S. PATENT DOCUMENTS

| | | | |
|---|---|---|---|
| 5,560,533 A | | 10/1996 | Maenishi |
| 5,564,183 A | * | 10/1996 | Satou et al. .................... 29/840 |
| 5,862,587 A | | 1/1999 | Higashi |
| 6,317,843 B1 | * | 11/2001 | Minamimoto et al. .......... 714/4 |
| 2005/0065620 A1 | | 3/2005 | Maenishi et al. |

FOREIGN PATENT DOCUMENTS

| | | |
|---|---|---|
| JP | 2001-230598 | 8/2001 |
| JP | 2002-111298 | 4/2002 |
| JP | 3461915 | 8/2003 |

OTHER PUBLICATIONS

International Search Report issued Oct. 1, 2007 in the International (PCT) Application of which the present application is the U.S. National Stage.
Written Opinion of the International Searching Authority issued Oct. 1, 2007 in the International (PCT) Application of which the present application is the U.S. National Stage.

* cited by examiner

*Primary Examiner*—Kidest Bahta
(74) *Attorney, Agent, or Firm*—Wenderoth, Lind & Ponack, L.L.P.

(57) ABSTRACT

To provide a method for determining a mounting condition to be set for at least one apparatus among apparatuses for manufacturing component-mounted boards. The method includes: determining, from among the apparatuses, a specific apparatus which satisfies a predetermined standard in performance associated with a manufacturing operation; obtaining the mounting condition associated with the manufacturing operation from the specific apparatus determined in the determining; and setting the mounting condition obtained in the obtaining for an apparatus other than the specific apparatus.

9 Claims, 27 Drawing Sheets

| Manufacturer code | Category code | Individual code (Model code - Apparatus number) | --- |
|---|---|---|---|
| AAA | G-AM | M123-2 | |

FIG. 13

| Component B | | | |
|---|---|---|---|
| Component A | | | |
| Pick-up rate | Mounting rate | Recognition error rate | Mounting accuracy |
| M123-1 | 96% | | |
| M123-2 | 98% | | |
| M123-3 | 99% | | ← Highest performance → Determined as specific apparatus |
| M123-4 | 95% | | |

FIG. 14

| Pick-up rate | specific apparatus | Mounting rate | specific apparatus | -------- |
|---|---|---|---|---|
| Component A | M 1 2 3 − 3 | Component A | M 1 2 3 − 3 | |
| Component B | M 1 2 3 − 1 | Component B | M 1 2 3 − 2 | |
| Component C | M 1 2 3 − 2 | Component C | M 1 2 3 − 1 | |
| Component D | M 1 2 3 − 3 | Component D | M 1 2 3 − 3 | |
| Component E | M 1 2 3 − 1 | Component E | M 1 2 3 − 1 | |
| ⋮ | | ⋮ | | |

FIG. 15

| | Mounting conditions |
|---|---|
| Pick-up rate | Nozzle, Pick-up operation pattern, Correction value for pick-up rate |
| Mounting rate | Nozzle, Head speed, θ speed, Mounting operation pattern |
| Recognition error rate | Component dimensions, Amounts of light (from top, middle and bottom light projectors), Camera, Option data for recognition |
| Mounting accuracy | Mounting conditions of pick-up rate and mounting rate + NC data |

FIG. 17
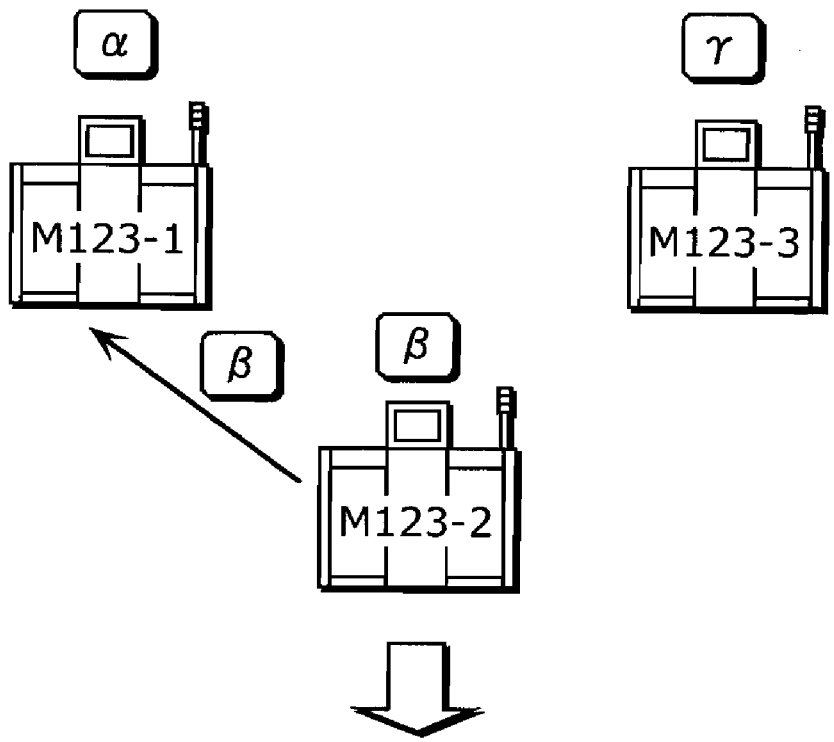
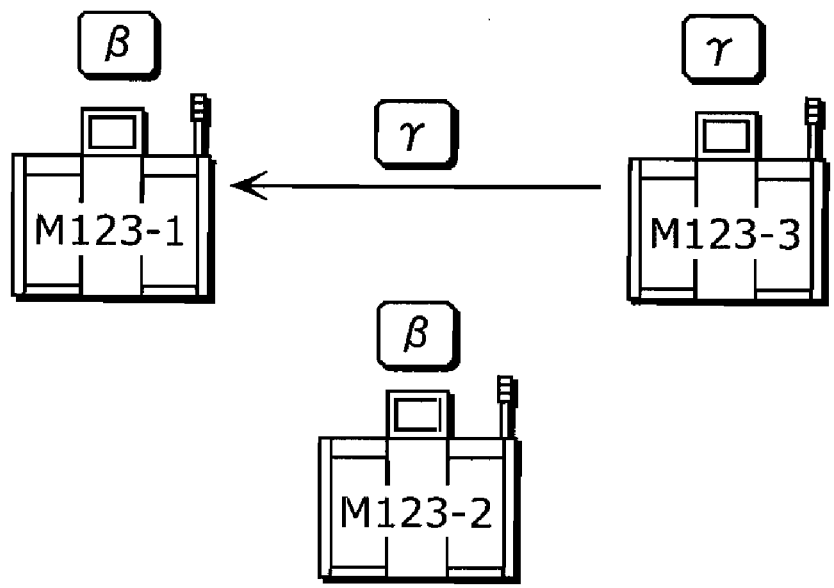

| Skill data table (M123) | |
|---|---|
| Individual code | Operator level |
| M123-1 | 2 |
| M123-2 | 3 |
| M123-3 | 1 |
| M123-4 | 2 |

| Conversion table (M group: head speed) | |
|---|---|
| M123 | M221 |
| 1 | 1 |
| 2 | 1 |
| 3 | 1 |
| 4 | 2 |
| 5 | 2 |

METHOD OF DETERMINING MOUNTING CONDITION

TECHNICAL FIELD

The present invention relates to a mounting condition determining method of determining mounting conditions for apparatuses which manufacture component-mounted boards.

BACKGROUND ART

Recently, manufacturers of component-mounted boards, in particular, major manufacturers manufacture various types of component-mounted boards. Such manufacturers manufacture a large number of component-mounted boards using plural manufacturing lines (hereinafter, simply referred to as "lines") configured with plural manufacturing apparatuses (hereinafter, simply referred to as "apparatuses") such as component mounting apparatuses.

In general, an operator in charge of a line is assigned to each line. Each operator sets and modifies the mounting conditions for each apparatus in the line.

Mounting conditions include information for identifying structural elements such as a nozzle used for mounting components onto boards, information for controlling the operations and positions of the respective structural elements, and information for improving manufacturing statuses of apparatuses such as component mounting apparatuses by setting specific value indicating a mounting condition for each apparatus or modifying the previously set value indicating the mounting condition for each apparatus.

A mounting condition or a combination of mounting conditions may be used. Examples of mounting conditions include a component moving speed at which the components are mounted onto boards, a nozzle to be used, the dimensions of the components, a camera for optically recognizing information about the components such as component pick-up statuses, the position of the camera, light projectors for projecting light to the components, the amount of light from the light projectors, and numerical control (NC) data including information indicating the positions as mounting points at which the components are mounted onto boards.

Optimizing mounting conditions for the respective apparatuses makes it possible to increase the productivities of the respective apparatuses and the whole manufacturing system configured with these apparatuses.

For this purpose, a technique of setting the common mounting conditions for plural apparatuses is disclosed (for example, refer to Patent Reference 1).

In the case of this technique, in the manufacturing system configured with plural lines structured with the same apparatuses, an analyzing apparatus for analyzing manufacturing statuses of the respective lines exists. The analyzing apparatus is capable of transmitting, to each line, problem-solving information obtained through the analysis.

For example, when errors in mounting components occurs in a line exceeding a predetermined rate, the analyzing apparatus is capable of analyzing the cause and makes each line employ the mounting conditions for solving the problem based on the analysis.

[Patent Reference] Japanese Patent No. 3461915

Here, as described above, it is general that operators who set mounting conditions vary among the plural lines in the manufacturing system.

In addition, mounting conditions determined based on the experience and knowledge of the operator are set for the apparatuses in each line. In this way, component-mounted boards are manufactured under mounting conditions different among lines.

In this case, since the knowledge and skills of the respective operators vary, a line may be operated with a productivity lower than usual.

In addition, even in the case where an apparatus such as a component mounting apparatus has a minor problem and thus it cannot provide a usual performance, the operator may continue to operate the apparatus, by changing a parameter associated with a mounting condition so as to reduce the influence of the problem.

In other words, the apparatus may be operated with a manufacturing efficiency lower than usual due to a minor problem.

In this way, the state where a part of the lines in the manufacturing system is inefficiently operated is the state where the whole manufacturing system is inefficiently operated. In other words, at present, component-mounted boards may be continuously manufactured in a state where the manufacturing system is inefficiently operated.

For this reason, increasing the productivity of a manufacturing system in an operating status like this using the above technique has been considered. However, the conventional technique is for ex-post analyzing and solving a problem triggered by the occurrence of the problem.

Therefore, for example, it is not until mounting errors occur in a line exceeding a predetermined rate that any measure is taken for solving the problem Thus, for example, even in the case where an apparatus constituting a line is operating with a productivity lower than required, the apparatus waits until the analyzing apparatus gives the apparatus mounting conditions which may increase the productivity.

To prevent this, it has been proposed to make the analyzing apparatus analyze the cause and to give the apparatus mounting conditions for improving the problem as feedback in order to improve the above status at an early stage, even in the case where a problem such as a minor error occurs in each apparatus.

In this case, however, the processing load for analyzing errors and generating mounting conditions increases in the analyzing apparatus. In addition, each apparatus is required to frequently execute the processing for changing into mounting conditions transmitted from the analyzing apparatus. Therefore, the productivity in each apparatus may decrease instead of increasing. Thus, it is not practical.

In addition, in recent years, various types of apparatuses such as component mounting apparatuses suitable for mounting these components are prepared in compliance with the types of components to be mounted onto boards, and various types of component-mounted boards are manufactured using plural manufacturing lines (hereinafter, referred to as "lines") having different apparatus configuration.

Here, there are a lot of apparatuses including apparatuses of the same model and apparatuses having a common attribute, for example, an attribute of mounting the same components onto boards.

In this case, in plural lines of apparatuses having a common attribute, there are mounting conditions which should basically be changed to the commonly optimum mounting conditions because the apparatuses are the same models, the apparatuses handle the same components or the like.

However, the conventional technique makes it possible to optimize the mounting conditions for the lines having the same apparatus configuration.

Therefore, it is impossible to use the conventional technique in the manufacturing system where plural types of component-mounted boards are manufactured in the manufacturing lines having different apparatus configuration. Thus, the mounting conditions for apparatuses are to be set or modified by the operators respectively.

In addition, when the operator of a component mounting apparatus is changed to another operator, the post-change operator may determine whether or not each of the mounting conditions is suitable in accordance with the condition of the component mounting apparatus based on the experience and knowledge of the operator and modifies some of the settings of the mounting conditions. Hence, when the operator of a component mounting apparatus is changed to another operator, unnecessary operations such as the operation for re-modifying the settings of mounting conditions are required.

Therefore, it is impossible to use the conventional technique even when there are plural manufacturing lines having different apparatus configurations in the manufacturing system.

Therefore, the mounting conditions for each apparatus are set and adjusted by the operator. Thus, unnecessary operations and inefficiency in a manufacturing process as described above remain.

The present invention has been conceived considering the conventional problem, and aims at providing a mounting condition determination method for efficiently increasing the productivity of each of plural apparatuses in the manufacturing system.

SUMMARY OF THE INVENTION

In order to achieve the above object, the mounting condition determining method is a method for determining a mounting condition to be set for at least one apparatus among apparatuses for manufacturing component-mounted boards. The mounting condition determining method includes: determining, from among the apparatuses, a specific apparatus which satisfies a predetermined standard in performance associated with a manufacturing operation; obtaining the mounting condition associated with the manufacturing operation from the specific apparatus determined in the determining; and setting the mounting condition obtained in the obtaining for an apparatus other than the specific apparatus.

According to the method, it is possible to determine the excellent apparatus as the specific apparatus using the followings as indicators: a performance associated with each of various types of manufacturing operations in manufacturing processing of component-mounted boards, for example, the rates of successfully picking up and recognizing components, and mounting the components onto boards; or skills of the operators who set mounting conditions for the apparatuses. Further, it is possible to obtain the mounting condition associated with the manufacturing operation from the specific apparatus. In other words, it is possible to obtain a mounting condition which may increase the productivity of each component mounting apparatus.

Accordingly, it is possible to optimize the mounting conditions for plural apparatuses according to the mounting condition determining method of the present invention.

In addition, in the method, each of the apparatuses may belong to one of groups classified based on the attributes of the apparatuses. The mounting condition determining method may further include: identifying apparatuses belonging to a predetermined group, based on identification information for identifying each of the apparatuses, and in the determining, the specific apparatus may be determined from among the apparatuses belonging to the predetermined group identified in the identifying.

In this way, a specific apparatus is determined for each group classified based on an attribute of the apparatuses in the group. In other words, the apparatuses in each group have a common attribute such as the model of the apparatuses and the type of the components to be mounted onto boards.

In other words, when the apparatuses in the group have a common attribute, the same mounting condition can be set for the specific apparatus and the apparatus in the group.

Accordingly, setting such mounting condition that may increase the productivity obtained from the specific apparatus for each of the apparatuses in the group is an effective action for efficiently increasing the productivities of the apparatuses of each group.

In this way, the optimization of mounting conditions may be performed changing the mounting conditions for the apparatuses to better mounting conditions on a per group basis. In other words, it is possible to efficiently increase the productivities of plural apparatuses.

In addition, the mounting condition determining method of the present invention may further include receiving the identification information from the apparatus. In the method, in the case where the identification information received in the receiving indicates that the apparatus belongs to the predetermined group, the apparatus may be identified as the apparatus in the predetermined group in the identifying. The mounting condition determining method may further include collecting the performance information indicating the performance from the apparatuses in the group identified in the identifying. In the case where the performance indicated by the performance information collected in the collecting satisfies the predetermined standard in the determining, the apparatus in the group may be determined as the specific apparatus.

In this way, for example, when apparatuses are exchanged, it is possible to immediately determine a specific apparatus and set a mounting condition obtained from the specific apparatus for the other apparatus.

In addition, in the determining, the apparatus which provides the highest performance among the apparatuses belonging to the predetermined group may be determined as the specific apparatus which satisfies the predetermined standard.

In this way, it is possible to obtain a mounting condition which may increase the productivity of each apparatus to the maximum and to set the mounting condition for each apparatus.

In addition, the mounting condition determining method may be executed by the apparatus. The predetermined group may be the group to which the apparatus itself belongs. In the determining, an apparatus in the group providing a performance which is higher than the performance of the apparatus itself may be determined as the specific apparatus which satisfies the predetermined standard. Each performance is associated with the manufacturing operation. In the setting, the mounting condition obtained in the obtaining may be set for the apparatus itself in the group other than the specific apparatus.

In this way, it is possible for each apparatus to take an initiative in optimizing the mounting condition for the apparatus itself. For example, the apparatus can change the mounting condition into a better mounting condition at a timing suitable for the apparatus.

In addition, the mounting condition determining method is executed by the apparatus. The predetermined group is the group to which the apparatus itself belongs. In the case where the performance associated with the manufacturing operation in the apparatus itself is higher than a past performance associated with the manufacturing operation in the determining, the apparatus itself may be determined as the specific apparatus satisfying the predetermined standard. In the obtaining, the mounting condition associated with the manufacturing operation may be obtained from the apparatus itself. In the setting, the mounting condition may be set for the apparatus other than the specific apparatus by transmitting the mounting condition to the apparatus in the group other than the apparatus itself.

In this way, it is possible to give an effective mounting condition in the history of the apparatus itself to, for example, an apparatus which does not have a function for optimizing an own mounting condition. In other words, it is also possible to optimize the mounting condition for the apparatus without the function.

In addition, the apparatuses may communicate with a mounting condition determining apparatus. The mounting condition determining method may be executed by the mounting condition determining apparatus. In the setting, the mounting condition may be set for the apparatus in the group other than the specific apparatus by transmitting the mounting condition to the apparatus.

In this way, a mounting condition for each apparatus is optimized even if the apparatus does not have a function for optimizing the mounting condition. Furthermore, in the case where the manager of these apparatuses changes or modifies the function for optimizing a mounting condition for each apparatus, the manager can efficiently change or modify the function because it is only necessary for the manager to give an instruction to a single mounting condition determining apparatus. In addition, since each apparatus does not need to exchange information with the other apparatus, and thus, for example, there is no possibility that an excessive communication load is placed on a network circuit to which each apparatus is connected.

In addition, in the obtaining, the apparatus may obtain a mounting condition from the specific apparatus without receiving an instruction for obtaining the mounting condition from outside the apparatus itself. In the setting, the mounting condition obtained in the obtaining may be set for the apparatus itself other than the specific apparatus.

In this way, according to the mounting condition determining method of the present invention, the apparatus itself can obtain a mounting condition of the other apparatus without depending on an instruction from outside the apparatus itself. In addition, the apparatus itself can mount components onto boards under the obtained mounting condition.

In this way, the apparatus itself can voluntarily obtain a mounting condition which may increase the productivity of the apparatus itself. Therefore, it becomes possible to efficiently increase the productivity.

In addition, the mounting condition determining method of the present invention may further include: collecting performance information indicating a performance associated with the manufacturing operation from the apparatus and an other apparatus; and comparing the performance of the apparatus with the performance of the other apparatus. Each performance is associated with the manufacturing operation and indicated by the performance information collected in the collecting. In the method, in the case where the comparison in the comparing shows that the performance of the other apparatus is higher than the performance of the apparatus, the apparatus may obtain the mounting condition associated with the manufacturing operation of the other apparatus in the obtaining.

In this way, an apparatus can obtain a better mounting condition from the other apparatus and set the mounting condition for the apparatus itself.

Further, the comparison in the comparing shows that the performance associated with the manufacturing operation of the apparatus is higher, the method may include notifying the other apparatus of the mounting condition associated with the manufacturing operation in the apparatus.

In this way, the better mounting condition is set for the other apparatus which is the target in the comparison. In other words, it is possible to increase the productivity of the other apparatus.

In addition, in the collecting, the performance information may be collected from the plural apparatuses. In the comparing, the plural apparatuses may be compared with one another. In the obtaining, a mounting condition associated with the manufacturing operation may be obtained from one of the apparatuses which provides a performance higher than the performance associated with the manufacturing operation of the apparatus and which provides the highest performance among the plural apparatuses.

In this way, an apparatus can obtain the best mounting condition from plural apparatuses and set the mounting condition for the apparatus itself. In other words, the apparatus can obtain the mounting condition which can increase the productivity of the apparatus itself to the maximum, and mount components onto boards under the mounting condition.

In addition, the apparatus and the other apparatuses communicate with the mounting condition determining apparatus. The collecting and comparing are executed in the mounting condition determining apparatus. The obtaining may include: a first obtaining in which the mounting condition determining apparatus obtains mounting conditions associated with the manufacturing operation of the other apparatuses; and a second obtaining in which the apparatus obtains the mounting conditions from the mounting condition determining apparatus.

In this way, each apparatus can obtain a mounting condition which may increase the productivity of the apparatus itself and set the mounting condition for the apparatus itself without, for example, collecting task performance information and comparing the task performance information of the apparatus itself and the task performance information of the other apparatuses.

In addition, the mounting condition determining apparatus of the present invention is an apparatus for determining a mounting condition to be set for at least one apparatus among apparatuses for manufacturing component-mounted boards. The mounting condition determining apparatus includes: a determining unit which determines, from among the apparatuses, a specific apparatus satisfying a predetermined standard in performance associated with a manufacturing operation; an obtaining unit which obtains the mounting condition associated with the manufacturing operation from the specific apparatus determined by the determining unit; and a setting unit which sets the mounting condition obtained by the obtaining unit for an apparatus other than the specific apparatus.

In this way, the mounting condition determining apparatus of the present invention can set a mounting condition which may further increase the productivity for each apparatus. In addition, the mounting condition determining apparatus of the present invention may be incorporated in each apparatus, or a single mounting condition determining apparatus may exist independently of each apparatus. The mounting condition determining apparatus may set the mounting condition for each apparatus.

Further, the present invention can be realized as a program including unique steps in the mounting condition determining method of the present invention, as a recording medium such as a CD-ROM on which the program is stored, as an integrated circuit which executes the unique steps in the mounting condition determining method of the present invention. The program can be distributed via a communication medium such as a communication network.

The present invention makes it possible to provide a mounting condition determining method for efficiently increasing the productivity of the plural apparatuses in a manufacturing system.

Further Information about the Technical Background of the Application

The disclosure of Japanese Patent Application No. 2006-87746 filed on Mar. 28, 2006 including specification, drawings and claims is incorporated herein by reference in its entirety.

The disclosure of Japanese Patent Application No. 2006-91381 filed on Mar. 29, 2006 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIG. 13 is a diagram showing an example of task performance information collected by a collecting unit in the first embodiment;

FIG. 14 is a diagram showing an example of a group of specific apparatuses determined by a determining unit in the first embodiment;

FIG. 15 is a diagram showing an example of association between each type of task performance information such as a pick-up rate and mounting conditions;

FIG. 17 is a schematic diagram showing how plural component mounting apparatuses execute the method for determining and obtaining mounting conditions to be set for the apparatuses themselves through comparison with other apparatus;

Detailed Description of the Invention

Embodiments of the present invention will be described below with reference to the drawings.

First Embodiment

Figure 1:
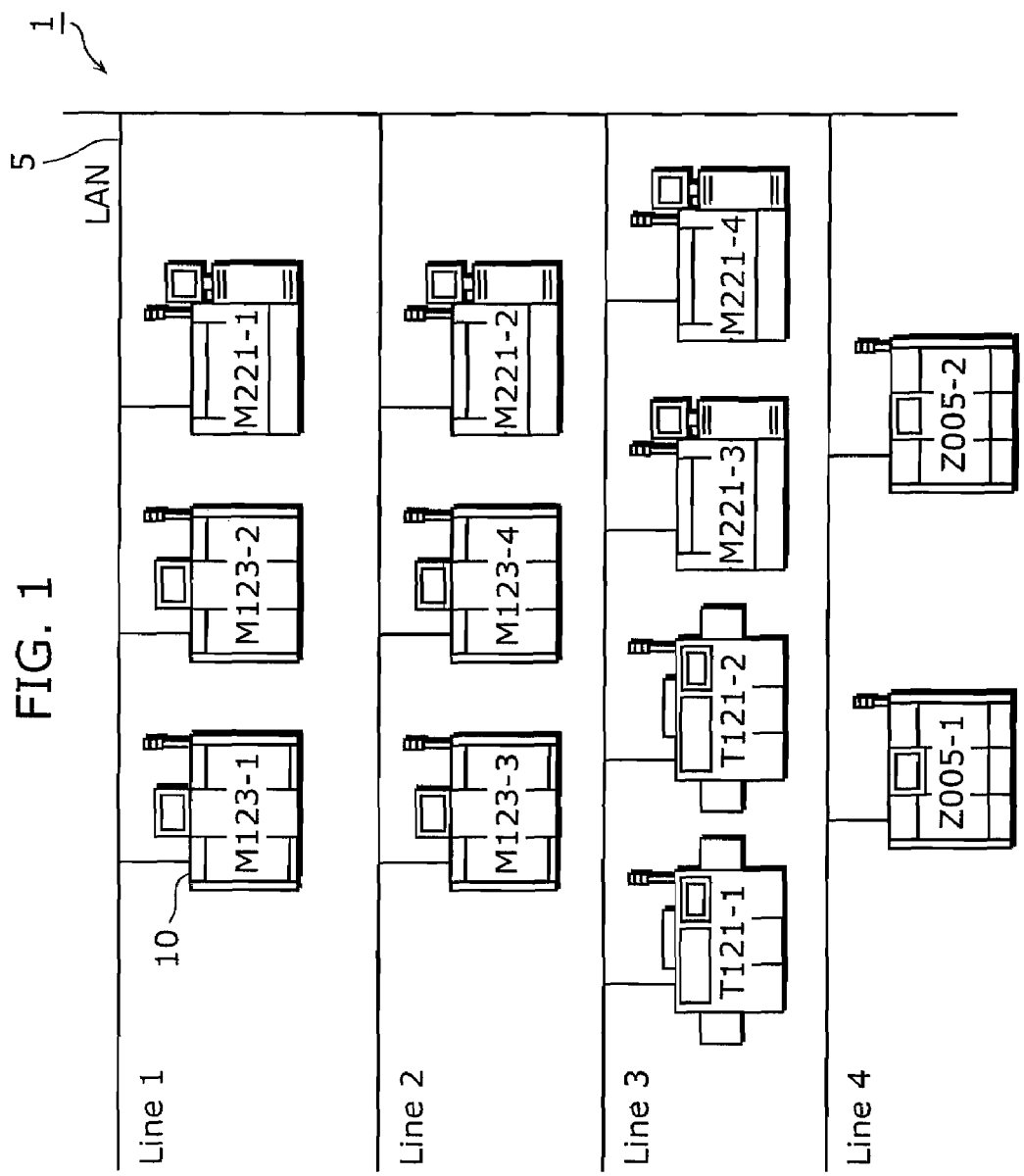
FIG. 1 is a schematic diagram showing the outline of the hardware configuration of the manufacturing system in a first embodiment.

FIG. 1 is a schematic diagram showing the outline of the hardware configuration of the manufacturing system in a first embodiment.

As shown in FIG. 1, the manufacturing system 1 in the first embodiment is configured with four lines of apparatuses. Each line is configured suitably for the types of components mounted onto boards in manufacturing performed in the line.

In this embodiment, the respective apparatuses constituting these lines are component mounting apparatuses. Each component mounting apparatus can exchange information via LAN (Local Area Network) 5.

In addition, the codes such as "M123-1" assigned to component mounting apparatuses in the figure are individual codes which are kinds of identification information for identifying mounting apparatuses. With an individual code, a component mounting apparatus can be identified among plural component mounting apparatuses. In addition, for example, a simple code of "M123-1" indicates a component mounting apparatus with the individual code.

In addition, an individual code is structured to be "model code-apparatus number". This means that component mounting apparatuses having the same model codes are the same models.

In addition, each component mounting apparatus on LAN 5, transmitting information to the apparatuses using the individual codes of the apparatuses as the addresses of the information enables the component mounting apparatuses having the addressed individual codes to receive the information. As such a technique, for example, the Domain Name System (DNS) in Transmission Control Protocol/Internet Protocol (TCP/IP) is employed.

Note that the functional structures of each component mounting apparatus will be described later with reference to FIG. 3, taking the component mounting apparatus 10 with the individual code "M123-1" as an example.

The plural component mounting apparatuses shown in FIG. 1 can be classified into groups based on attributes such as models, components to be mounted onto boards and manufacturers, irrespective of lines to which the apparatuses are respectively belong.

Figure 2:
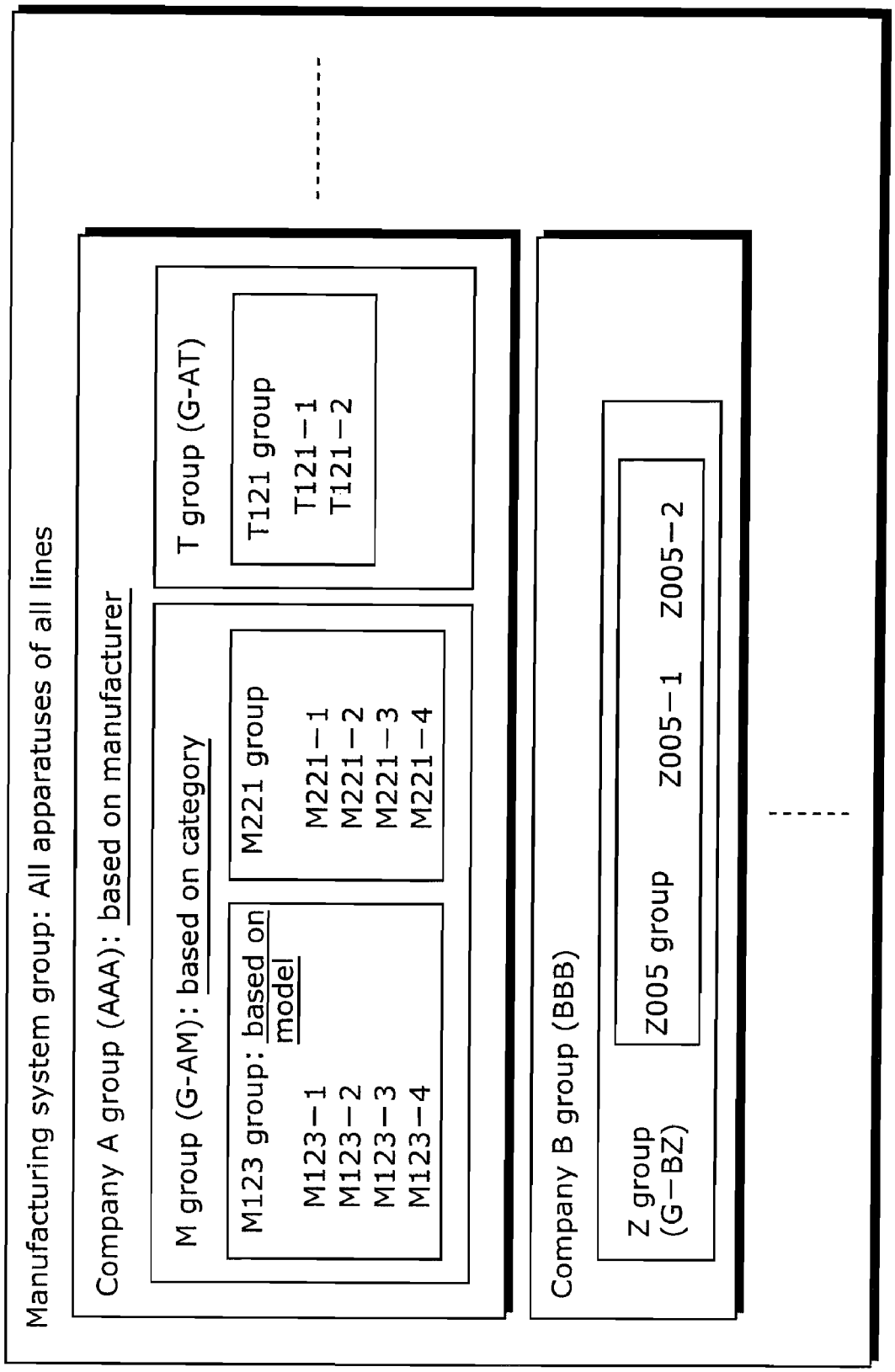
FIG. 2 is a diagram showing an example of classification of component mounting apparatuses constituting the manufacturing system in the first embodiment.

FIG. 2 is a diagram showing an example of classification of component mounting apparatuses constituting the manufacturing system in the first embodiment.

As shown in FIG. 2, the component mounting apparatuses belonging to the manufacturing system 1 are classified into groups based on manufacturers (hereinafter referred to as "manufacturer groups") which are large classification. The component mounting apparatuses in each manufacturer group are classified into groups based on categories (hereinafter referred to as "category groups") which are middle classification. In other words, plural models are classified into plural categories.

To be more specific, the respective models can be classified into plural categories based on similarity between models, mounting patterns and the like. In this embodiment, the models are classified into category groups based on the mounting patterns such as a modular device and a rotary device In addition, the component mounting apparatuses in each category group are classified into groups based on models (hereinafter referred to as "model groups") which are small classification, and each component mounting apparatus belongs to any one of the model groups.

In this way, each group is associated with attributes such as models and categories of the respective component mounting apparatuses.

In addition, the codes such as "AAA" in the figure are codes for identifying the respective groups. For example, "AAA" is a manufacturer code for identifying the company A's group, and "G-AM" is a category code for identifying the M group.

In this way, the respective component mounting apparatuses in the manufacturing system 1 are classified into groups based on attributes such as the manufacturers and models. Hence, the component mounting apparatuses in a group have common attributes such as the device configuration, compliance with a type of components to be mounted onto boards.

In other words, since the respective component mounting apparatuses in a group have an attribute common in the group, the apparatuses can set common mounting conditions.

For example, the component mounting apparatuses belonging to a model group are the same models. Hence, they are substantially equivalent in the device structures, performances and properties.

Therefore, a component mounting apparatus belonging to, for example, a model group can utilize mounting conditions for another component mounting apparatus in the group. The mounting conditions include the nozzle to be used and the speed at which components are moved.

Accordingly, finding mounting conditions optimum in a group and giving the mounting conditions to all the component mounting apparatuses in the group makes it possible to increase the productivity of each of the component mounting apparatus.

Figure 3:
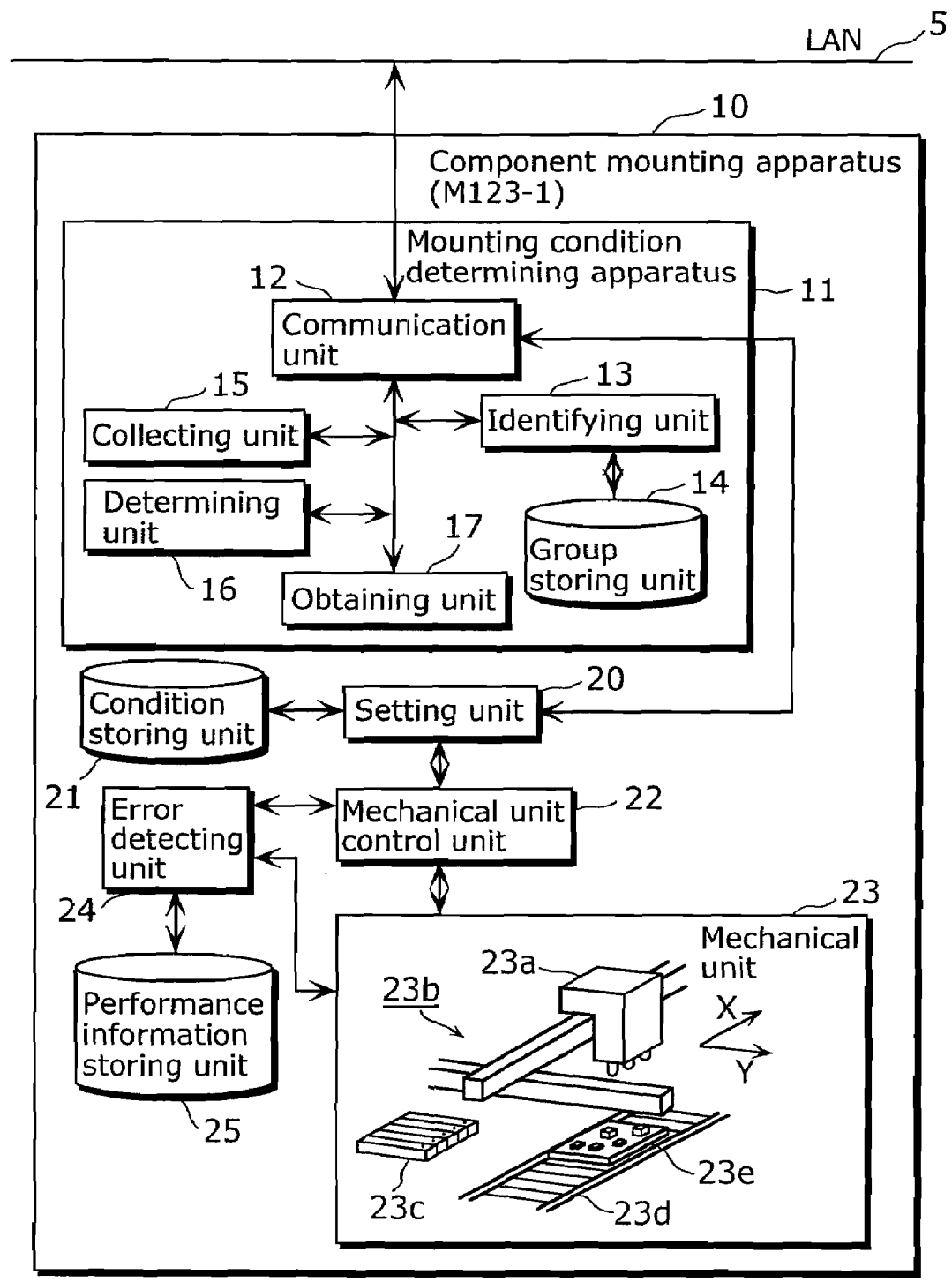
FIG. 3 is a functional block diagram showing the functional structures of the component mounting apparatus in the first embodiment.

FIG. 3 is a functional block diagram showing the functional structures of the component mounting apparatus in the first embodiment. Note that the structural units such as a power supply unit, a camera for optically recognizing information about components which each component mounting apparatus has are neither shown nor described. The structural units for illustrating the characteristics of the present invention are shown and described. This is applied to the other diagrams.

The component mounting apparatus 10 shown in FIG. 3 is the component mounting apparatus shown as "M123-1" in FIGS. 1 and 2.

As shown in FIG. 3, the component mounting apparatus 10 has a mounting condition determining apparatus 11. The mounting condition determining apparatus 11 is for determining mounting conditions to be set for the component mounting apparatus 10.

The mounting conditions determined by the mounting condition determining apparatus 11 are notified to a setting unit 20 which the component mounting apparatus 10 has. The setting unit 20 sets the mounting conditions at a mechanical control unit 22. The mechanical control unit 22 controls a mechanical unit 23 according to the set mounting conditions. In addition, the mounting conditions are stored in a condition storing unit 21.

The condition storing unit 21 is a storing device which stores mounting conditions. In this embodiment, information indicating a nozzle to be used at the time of mounting components onto boards, the dimensions of components, NC data and the like are stored as mounting conditions. In addition, when the mounting condition determining apparatus 11 notifies the setting unit 20 of the mounting conditions, the notified mounting conditions are written as new mounting conditions.

The mechanical unit 23 is structured with devices such as a mounting head 23a which picks up components and mounts the components onto boards and an XY robot which moves the mounting head 23a in the X-axis direction and Y-axis direction which are orthogonal to each other. Note that the X-axis direction is the direction parallel to the direction along which a board 23e is carried, and the Y-axis direction is the direction vertical to the X-axis direction and parallel to the principal surface of the board 23e.

The mounting head 23a is capable of picking up a component from the component supplying unit 23c while being moved in the X-axis direction and Y-axis direction by the XY robot 23b, and mounting the picked up component onto a board 23e which is being carried by a conveyer 23d.

Note that the structural units such as the mechanical unit 23 other than the mounting condition determining apparatus 11 in the component mounting apparatus 10 are realized as a mounting unit in the component mounting apparatus.

In addition, an error detecting unit 24 is a processing unit for detecting an error in the manufacturing operation executed by the component mounting apparatus 10, and generating task performance information.

Note that manufacturing operations refer to various types of operations in the manufacturing of component-mounted boards. The manufacturing operations include not only the substantial operations for mounting components onto boards, but also the operation for checking the substantial operations and the operation for confirming whether or not components are properly picked up by a nozzle.

In addition, task performance information indicates performances associated with manufacturing operations which component mounting apparatuses execute. For example, a pick-up rate of picking up components is generated as task performance information. A pick-up rate is a value indicating a successful component pick-up rate of a nozzle. For example, the pick-up rate obtained in the case where the error detecting unit 24 detects a failure in picking up a component in the operation of picking up one hundred components is 99%.

In addition to the pick-up rate, task performance information includes: a mounting rate which is a rate of successfully mounting picked up components onto boards; a mounting accuracy indicating an accuracy as to how the mounted components are placed on the boards; and a recognition error rate indicating a camera's unsuccessful recognition rate obtained when the camera optically recognizes information about components such as component pick-up statuses.

In the case of information such as a pick-up rate and a mounting rate, the higher the value is, the better the performance is. In contrast, in the case of a recognition error rate, the lower the value is, the better the performance is.

These pieces of task performance information are generated by the error detecting unit 24, for each component to be mounted and for each structural element such as a nozzle. In addition, the pieces of task performance information generated by the error detecting unit 24 are stored in a performance information storing unit 25.

Here, other component mounting apparatuses belonging to an M123 group to which the apparatus M123-1 belongs are the same models as the apparatus M123-1. The component mounting apparatuses have the same structures as the one shown as FIG. 3. The component mounting apparatuses in the other groups differ from the apparatus M123-1 in the devices constituting the mechanical unit 23. However, the component mounting apparatuses in the other groups are the same as the apparatus M123-1 in that each of them has the following functional structures: a mounting condition determining apparatus 11, a setting unit 20, a condition storing unit 21, a mechanical control unit 22, a mechanical unit 23, an error detecting unit 24, and a performance information storing unit 25.

Accordingly, likewise the component mounting apparatus 10, the component mounting apparatuses having such a mounting condition determining apparatus 11 are capable of executing various manufacturing operations under the mounting conditions notified from the mounting condition determining apparatus 11.

As shown in FIG. 3, the mounting condition determining apparatus 11 has a communication unit 12, an identifying unit 13, a group storing unit 14, a collecting unit 15, a determining unit 16, and an obtaining unit 17.

The communication unit 12 is an example of a setting unit in the mounting condition determining unit of the present invention, and it is a processing unit for exchanging information with other component mounting apparatuses and with the structural units other than the mounting condition determining apparatus 11 in the apparatus itself. Note that "the apparatus itself" refers to each apparatus having a mounting condition determining apparatus 11. For example, the component mounting apparatus 10 (M123-1) shown as FIG. 3 in this description is one of the apparatus itself.

The identifying unit 13 is a processing unit for identifying the apparatuses such as component mounting apparatuses belonging to a predetermined group, based on identification information for identifying each of the component apparatuses.

The predetermined group in this embodiment is the group to which the apparatus itself belongs. The result of identification by the identifying unit 13 is stored in the group storing unit 14. The information stored in the group storing unit 14 will be described later with reference to FIG. 11.

The collecting unit 15 is a processing unit for collecting task performance information from the apparatuses in the groups identified by the identifying unit 13. In this embodiment, task performance information is collected from each of the component mounting apparatuses belonging to the same group to which the apparatus itself belongs in addition to the apparatus itself.

Note that the types of task performance information which the collecting unit 15 collects from the apparatuses in the group are selected based on the group to which the apparatus itself belongs and which is determined as the target of the collection of task performance information.

A case of mounting arbitrarily selected four types of components A to D onto boards is assumed. Here, these four types of components A to D are commonly mounted by the apparatuses in the group to which M123 belongs.

In this case, the apparatuses belonging to the M123 group are the same in the models, the mechanic of mounting components onto boards and the functional structures. Therefore, the mounting conditions associated with the pick-up rates and mounting rates of the components A to D can be commonly utilized. Accordingly, in the case where the task performance information of the M123 group is determined as the target to be collected, the pick-up rates and mounting rates of the components A to D are collected.

The determining unit 16 is capable of comparing the performances such as pick-up rates of plural component mounting apparatuses. In addition, through the comparison, it is possible to determine not only which one of the two performances is higher but also the highest performance among plural performances.

In this embodiment, the determining unit 16 is a processing unit for determining a specific apparatus providing a performance associated with a manufacturing operation which satisfies a predetermined standard. The determining unit 16 determines a specific apparatus based on the task performance information which the collecting unit 15 collects from each component mounting apparatus.

A predetermined standard may be any standard as long as the performance is higher than the performance of at least the apparatus itself. In this embodiment, the apparatus in a group which transmits the task performance information indicating the highest performance among the apparatuses in the group is determined as a specific apparatus. In other words, the component mounting apparatus which provides the highest performance in a certain manufacturing operation in the group is determined as the specific apparatus.

The obtaining unit 17 is a processing unit for obtaining mounting conditions associated with the manufacturing operation from the specific apparatus determined by the determining unit 16. The association will be described later with reference to FIG. 15.

The mounting condition obtained by the obtaining unit 17 is notified to the setting unit 20 of the apparatus itself by the communication unit 12. As described above, the mechanical control unit 22 controls the mechanical unit 23 according to the mounting conditions.

Note that the communication unit 12 is capable of obtaining the task performance information and mounting conditions for the apparatus itself via the setting unit 20, and notifying the other component mounting apparatuses or the collecting unit 15 and obtaining unit 17 of the apparatus itself about the mounting conditions.

In this way, the mounting condition determining, as a specific apparatus, apparatus 11 of this embodiment determines the apparatus which provides the highest performance in a manufacturing operation and obtains the mounting conditions from the specific apparatus. In other words, determining the specific apparatus makes it possible to determine the optimum mounting conditions and further to set the optimum mounting conditions for the component mounting apparatus.

The operation of the component mounting apparatus 10 in the first embodiment structured in this way will be described with reference to FIGS. 4 to 17.

First, the basic operation of the component mounting apparatus 10 is described with reference to FIGS. 4 and 5.

Figure 4:
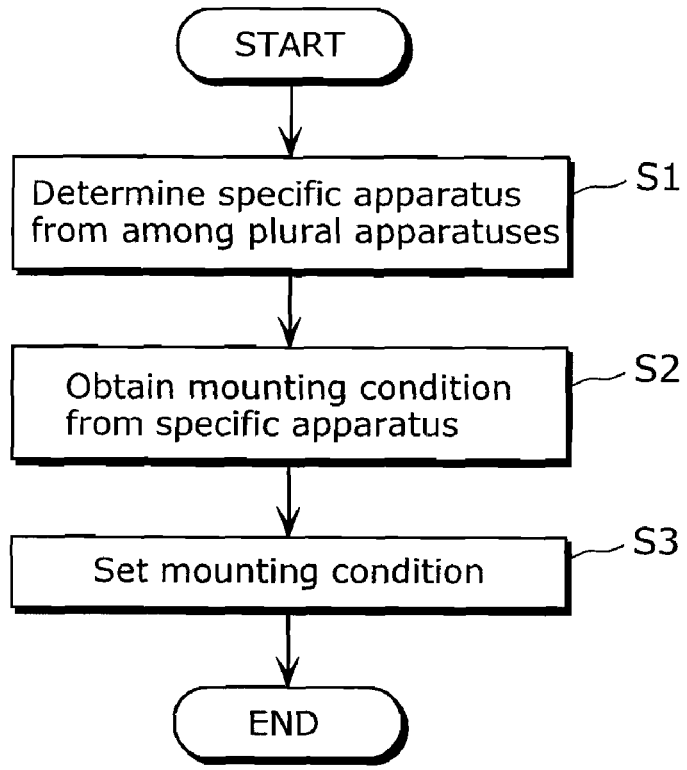
FIG. 4 is a flowchart indicating the basic operation concerning the setting of a mounting condition for the component mounting apparatus in the first embodiment.

FIG. 4 is a flowchart showing a basic operation flow concerning the setting of a mounting condition for the component mounting apparatus 10 in the first embodiment.

As shown in FIG. 4, the component mounting apparatus 10 determines a specific apparatus which is the component mounting apparatus providing a performance, associated with a type of manufacturing operation, satisfying a predetermined standard (S1).

In this embodiment, as described above, the component mounting apparatus which provides the highest performance in a type of operation is determined as a specific apparatus.

For example, the component mounting apparatus which provides the highest pick-up rate, the component mounting apparatus which provides the lowest recognition error rate and the like are determined as a specific apparatus.

Next, the component mounting apparatus 10 obtains a mounting condition associated with the manufacturing operation of the determined specific apparatus (S2).

Further, the component mounting apparatus 10 sets the obtained mounting condition for the apparatus itself (S3).

Note that the above operations such as the determination of specific apparatus are executed by, specifically, the mounting condition determining apparatus 11 which the component mounting apparatus 10 has.

In this way, the component mounting apparatus 10 of this embodiment is capable of obtaining the mounting condition set for the excellent component mounting apparatus and setting the mounting condition for the apparatus itself.

In addition, in this embodiment, the component mounting apparatus 10 voluntarily determines specific apparatus and obtains the mounting condition from the specific apparatus.

Figure 5:
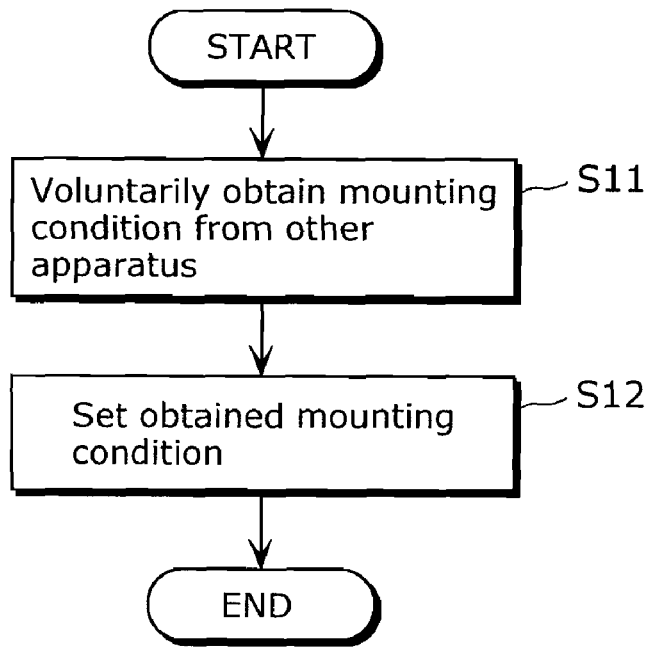
FIG. 5 is a flowchart indicating that the component mounting apparatus in the first embodiment voluntarily obtains a mounting condition.

FIG. 5 is a flowchart indicating that the component mounting apparatus 10 in the first embodiment voluntarily obtains mounting conditions.

As shown in FIG. 5, the component mounting apparatus 10 voluntarily obtains the mounting condition of the other apparatus, in other words, without receiving any instruction for obtaining the mounting condition from outside the apparatus itself (S11). Further, the component mounting apparatus 10 sets the obtained mounting condition for the apparatus itself (S12).

In this way, the component mounting apparatus 10 in this embodiment voluntarily obtains mounting condition of the other component mounting apparatus, without receiving any instruction from the operator or other apparatuses. This makes it possible to efficiently optimize the mounting conditions and efficiently increase the productivity.

Next, the operations of the component mounting apparatus 10 in the first embodiment are specifically described with reference to FIGS. 6 to 17.

Figure 6:
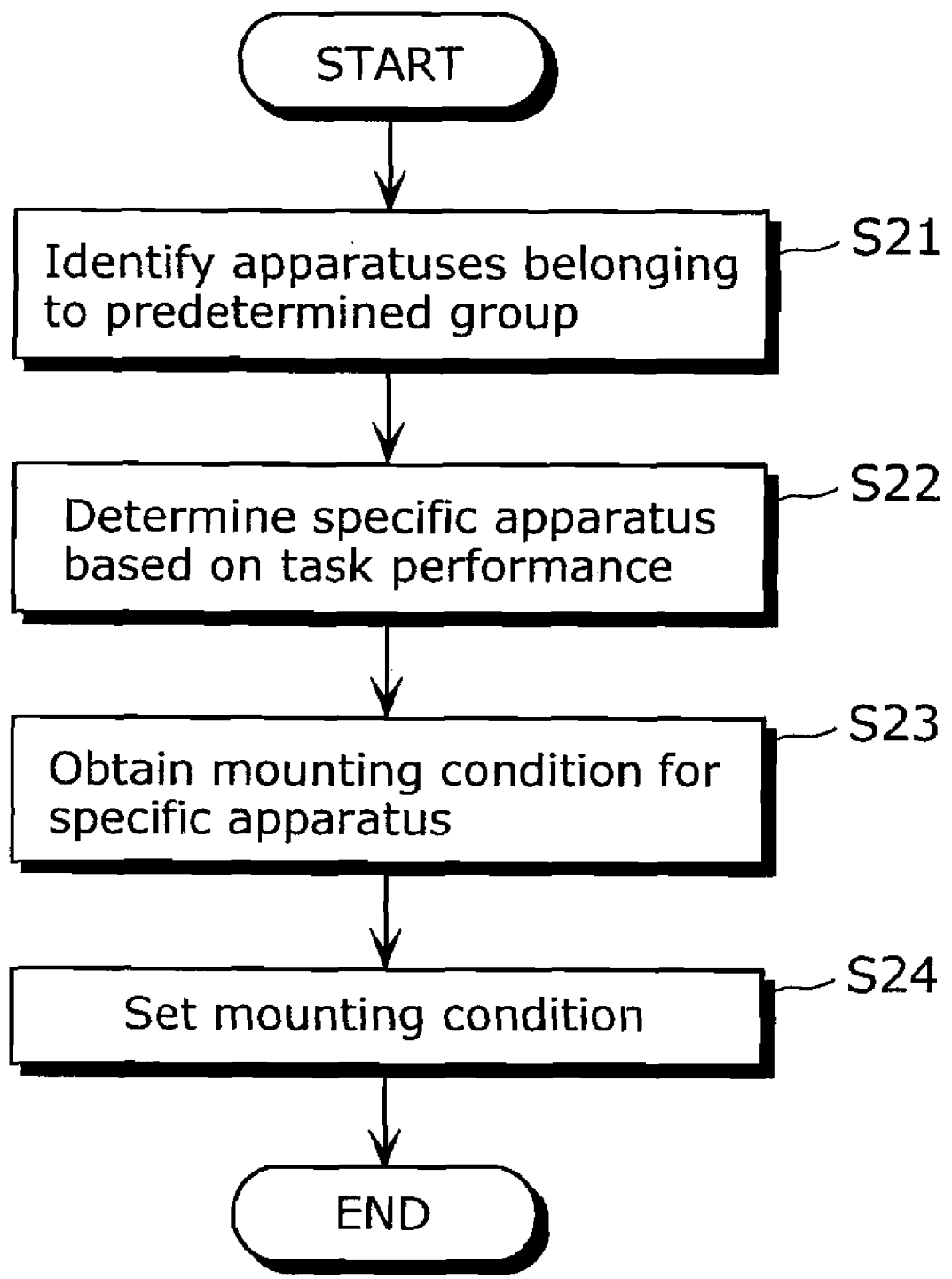
FIG. 6 is a flowchart indicating the specific operation concerning the setting of the mounting condition for the component mounting apparatus in the first embodiment.

FIG. 6 is a flowchart indicating a specific operation flow concerning the setting of the mounting condition executed by the component mounting apparatus 10 in the first embodiment.

The operation flow concerning the setting of the mounting condition executed by each component mounting apparatus including the component mounting apparatus 10 in the manufacturing system 1 are described with reference to FIG. 6. Note that the details of each operation will be described later with reference to the flowcharts of FIGS. 10 and 12.

First, the identifying unit 13 identifies the apparatuses belonging to a predetermined group from among the apparatuses in the manufacturing system 1 (S21). More specifically, the identifying unit 13 identifies the component mounting apparatuses belonging to the same group to which the apparatus itself belongs based on the identification information transmitted from each component mounting apparatuses.

The determining unit 16 determines a specific apparatus which is the component mounting apparatus providing a performance associated with a manufacturing operation which satisfies a predetermined standard (S22). More specifically, the determining unit 16 determines the component apparatus providing the highest performance as a specific apparatus based on the task performance information collected by the collecting unit 15.

The obtaining unit 17 obtains the mounting condition from the specific apparatus determined by the determining unit 16 (S23). For example, the obtaining unit 17 obtains the mounting condition associated with the pick-Lip rate of picking up components A, from the specific apparatus which provides the highest pick-up rate of picking up components A.

The mounting condition obtained by the obtaining unit 17 is notified to the setting unit 20 by the communication unit 12, and the setting unit 20 sets the mounting condition (S24).

By executing the above described operations (S21 to S24), each component mounting apparatus can find the mounting condition which are optimum for the group, classified based on attributes, to which the apparatus itself belongs, and furthermore obtain the mounting condition. For the reason that each component mounting apparatus mounts components onto boards under the obtained mounting condition, the mounting conditions such as component pick-up rates or mounting rates of mounting components onto boards are increased, resulting in an increase in productivity.

Note that there may be a case where expected performances cannot be obtained even when mounting conditions obtained from specific apparatuses are set.

For example, here is a case where a certain component mounting apparatus obtains mounting conditions from a specific apparatus which is the same model as the apparatus itself. In this case, even in the case where the same mounting conditions are set for the component mounting apparatus and the specific apparatus, the component mounting apparatus does not always perform the same operation as the one performed by the specific apparatus due to the individual difference between these apparatuses or the differences in the positions of the structural elements arranged in the respective apparatuses.

For this reason, whether or not the task performance associated with a mounting condition has increased may be confirmed after the component mounting apparatus sets the mounting condition (S24).

Figure 7:
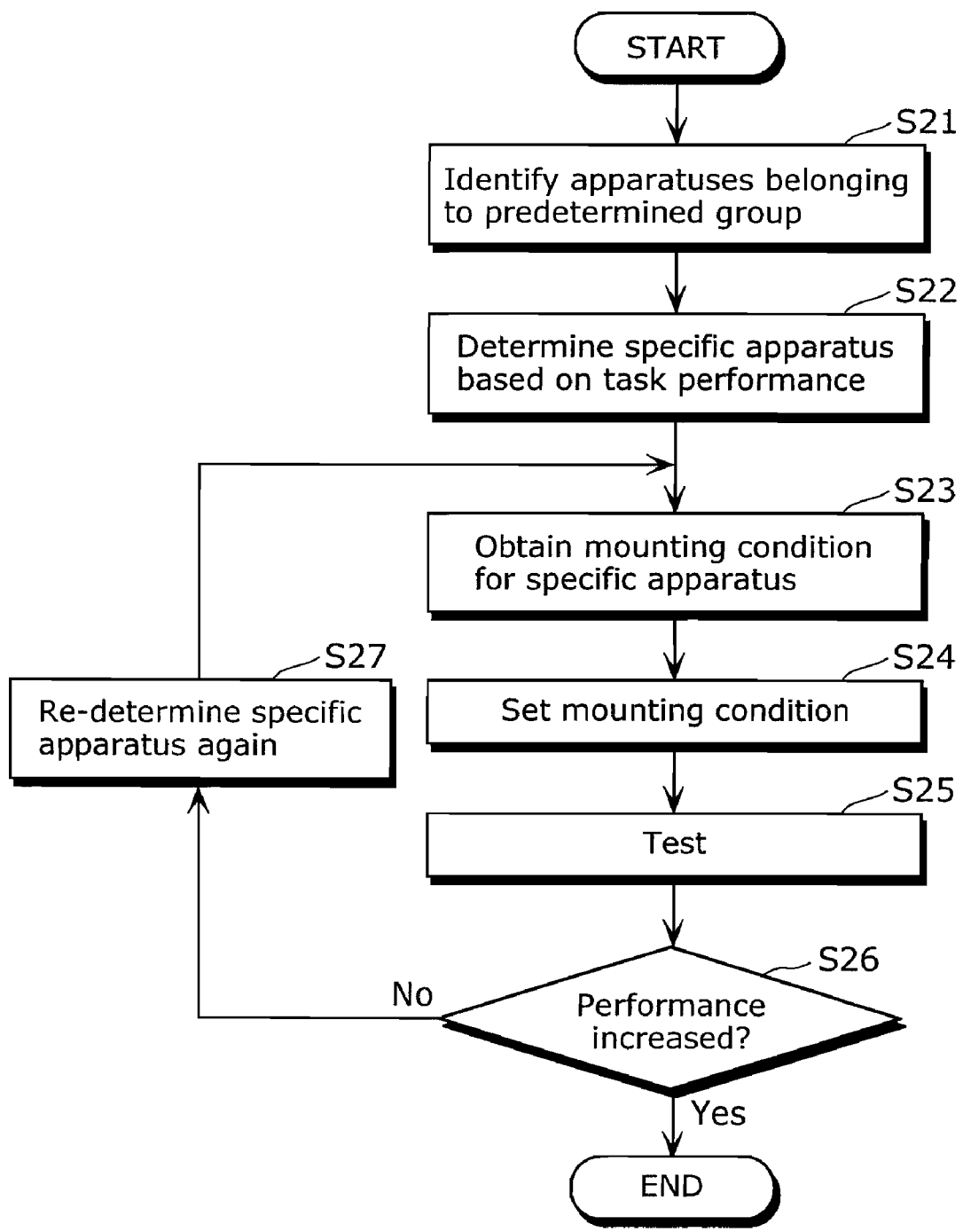
FIG. 7 is a diagram showing an example of operation flow in the case of adding the operation of confirming whether or not a task performance is improved to the flowchart shown as FIG. 6.

FIG. 7 is a diagram showing an example of an operation flow in the case of adding the operation of confirming whether or not a task performance is improved to the flowchart shown as FIG. 6.

As shown in FIG. 7, after setting the mounting condition obtained from the specific apparatus (S24), the component mounting apparatus 10 executes a test manufacturing of a component-mounted board under the mounting condition (S25). The component mounting apparatus confirms whether or not the task performance has increased from the pre-test task performance as a result of the test (S26).

For example, here is a case where the component mounting apparatus 10 which determines the apparatus providing the highest pick-up rate of picking up components as a specific apparatus and it obtains information for identifying the nozzle to be used as mounting conditions associated with a pick-Lip rate of picking up components from the specific apparatus.

In this case, the component mounting apparatus 10 changes to the nozzle indicated by the mounting conditions. In other words, the component mounting apparatus 10 sets the mounting conditions for the apparatus itself (S24). Further, for example, the component mounting apparatus 10 actually mounts a predetermined number of components onto a board (S25). In this way, the component mounting apparatus 10 calculates a pick-up rate of picking up components after the mounting condition is set and confirms whether or not the calculated pick-up rate has increased from the pick-Lip late before the mounting conditions are set (S26).

Note that the calculation of these pick-up rates is executed by the error detecting unit 24, and the confirmation is executed by the determining unit 16.

In the case where the pick-up rate of picking up components increases (Yes in S26), the component mounting apparatus 10 completes the operation concerning the settings of the mounting conditions, and for example, it directly proceeds to component mounting operation.

In addition, in the case where the pick-up rate of picking up component does not increase (No in S26), the component mounting apparatus 10 determines, as a new specific apparatus, an apparatus other than the specific apparatus determined immediately before (S27).

For example, the component mounting apparatus 10 determines, as the new specific apparatus, the component mounting apparatus which provides the second highest component pick-up rate in the group to which the apparatus itself belongs, and executes the operations from the obtainment of the mounting condition associated with the component pick-Lip rate (S23) to the test manufacturing under the mounting condition (S25).

Subsequently, the component mounting apparatus 10 repeats the sequence of operations from the re-determination of a specific apparatus (S27) to the confirmation of an increase in performance (S26) until it confirms an increase in the component pick-up rate (Yes in S26).

Note that when repeating the re-determination of a specific apparatus (S27), the component mounting apparatus 10 preferentially selects the apparatus providing a high pick-up rate from among the plural apparatuses and determines an apparatus as a specific apparatus. Further, in the case where there is no apparatus which provides a component pick-up rate higher than that of the apparatus itself in the group, the component mounting apparatus 10 does not execute the re-determination of a specific apparatus and returns to the mounting conditions immediately before the mounting conditions which have been set in S24.

In this way, the component mounting apparatus 10 is capable of judging whether the mounting condition obtained from a specific apparatus is truly optimum or not by confirming whether the task performance after the settings of the obtained mounting conditions increases or not.

Here, the identification of the apparatuses in the group shown in the flowcharts of FIGS. 6 and 7 (S21) is executed by the identifying unit 13. More specifically, the identification information referred to when this identification is executed is an individual code and the like, and the identification information is collected by requesting another component mounting apparatus to transmit it via LAN 5.

In addition, a signal including the identification information such as the individual code is referred to as a friend or foe signal in this embodiment. Upon receiving a request for a friend or foe signal, each component mounting apparatus transmits the friend or foe signal as a response to the request.

Figures 8, 9:
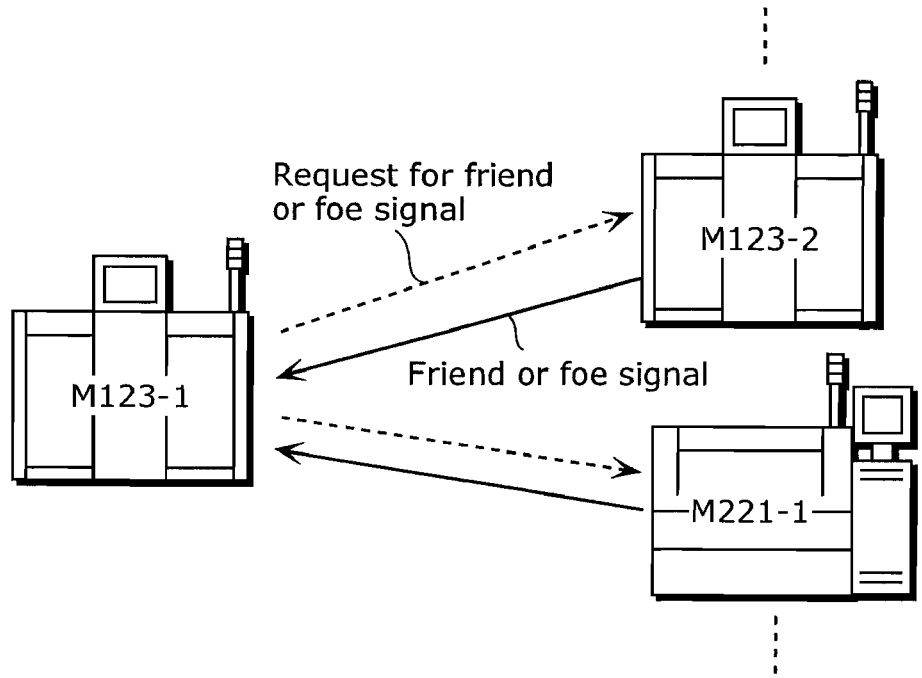
FIG. 8 is a schematic diagram showing the data structure of a friend or foe signal in the first embodiment.
FIG. 9 is a schematic diagram showing how the component mounting apparatus in the first embodiment requests for and receives the friend and foe signal.

FIG. 8 is a diagram showing the outline of the data structure of the friend or foe signal in the first embodiment.

As shown in FIG. 8, the friend or foe signal includes a manufacturer code, a category code and an individual code. Each of the individual codes or a combination of these codes included in the friend or foe signal constitutes the identification information in the mounting condition determining method of the present invention.

In addition, the friend or foe signal shown in FIG. 8 is an example of a friend or foe signal transmitted from the M123-2 which is a component mounting apparatus to another component-mounting apparatus. As shown in FIG. 8, this friend or foe signal includes: "AAA" which is the manufacturer code of the manufacturer A which manufactured the M123-2;

"G-AM" which is the category code of the group M which is the category group to which the M123-2 belongs; and the individual code "M123-2".

The individual code is made of a model code and an apparatus number as described above, and the mode code is the information indicating the model. In other words, "M123" included in the individual code of a component mounting apparatus means that the model of the component mounting apparatus is "M123". Note that the apparatus number is a number unique in the same models.

In the case where the M123-1 receives a friend or foe signal shown in FIG. 8, the M123-2 is capable of identifying that the M123-1 is an apparatus belonging to the same manufacturer group and category group as the groups to which the apparatus itself belongs based on the manufacturer code and category code (refer to FIG. 2). In addition, it is capable of identifying that the M123-1 belongs to the same model group to which the apparatus itself belongs based on the model code included in the individual code.

FIG. 9 is a schematic diagram illustrating how the component apparatus 10 in the first embodiment requests for and receives friend or foe signals. The M123-1 which is the component mounting apparatus 10 is capable of receiving friend or foe signals from all of the component mounting apparatuses by transmitting a request for a friend or foe signal to each of the component apparatuses such as the M123-2 in the manufacturing system 1. Likewise, other component mounting apparatuses are capable of receiving friend or foe signals from all of the component mounting apparatuses.

Note that, in the case where each component mounting apparatus receives a request for a friend or foe signal, the communication unit 12 of the apparatus transmits the friend or foe signal including the model code of the apparatus itself as a response to the request. The information such as the model code of the apparatus itself may be stored by the communication unit 12 or a mechanical unit such as a condition storing unit 21 other than the mounting condition determining unit 11 of the component mounting apparatus 10. In the case where the mechanical unit other than the mounting condition determining apparatus 11 stores the information such as a model code, it is only necessary for the communication unit 12 to receive the information from the mechanical unit, generate a friend or foe signal and transmit the friend or foe signal as a response to the request.

Figure 10:
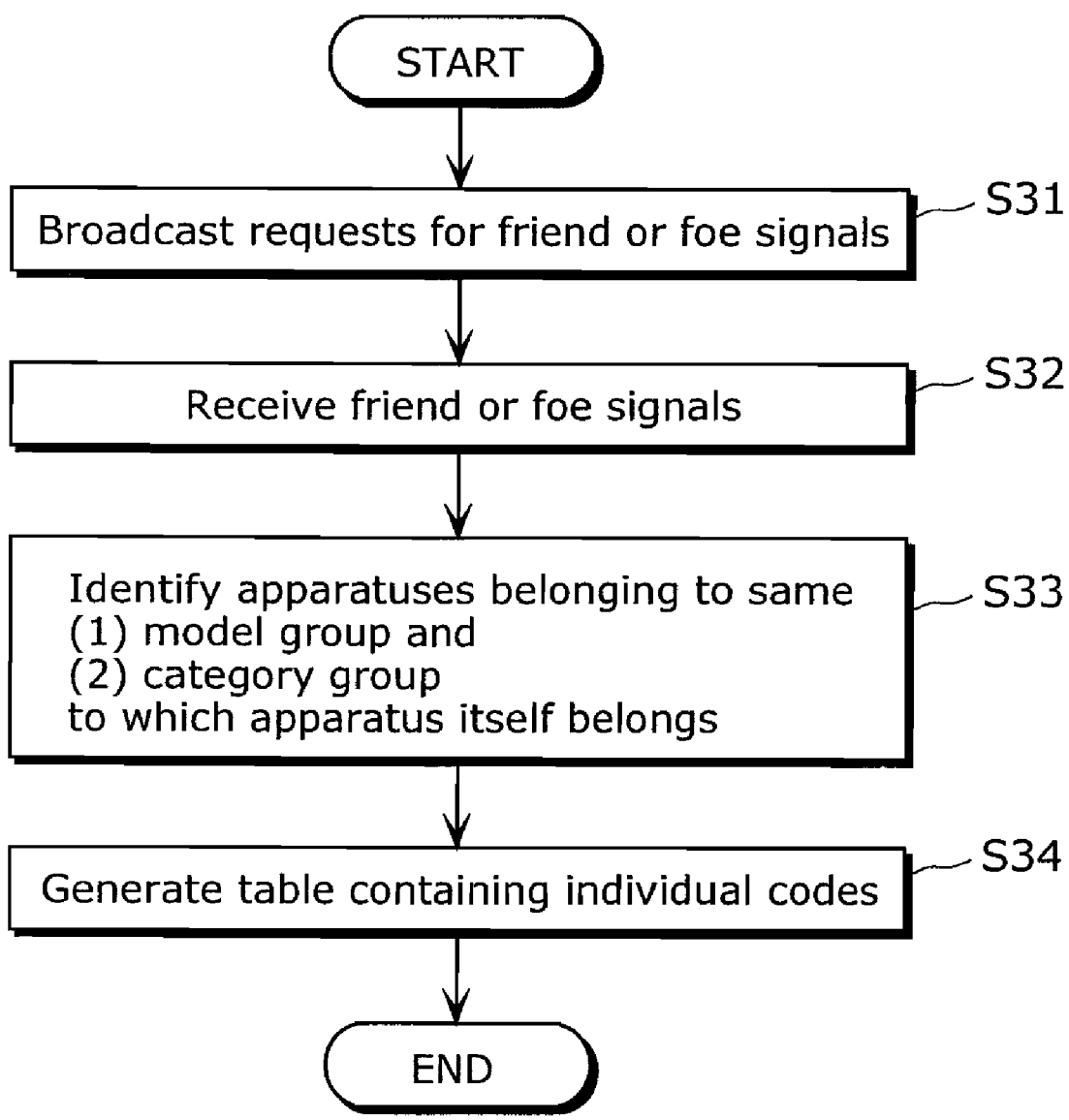
FIG. 10 is a flowchart indicating the operation flow in the case where the component mounting apparatus in the first embodiment identifies other component mounting apparatuses.

FIG. 10 is a flowchart indicating an operation flow in the case where the component mounting apparatus 10 in the first embodiment identifies other component mounting apparatuses. In other words, FIG. 10 is a flowchart specifically illustrating the operation of identifying the apparatuses in the group to which the apparatus itself belongs (S21) shown in the flowcharts of FIGS. 6 and 7.

The flow of an operation for identifying other component mounting apparatuses executed by each component mounting apparatus of the manufacturing system 1 including the component mounting apparatus 10 will be described with reference to FIG. 10.

The communication unit 12 of each component mounting apparatus broadcasts requests for friend or foe signals to all of the other component mounting apparatuses connected via LAN 5 (S31). Each communication unit 12 receives one of the friend or foe signals transmitted in response to the requests (S32).

The identifying unit 13 reads out the respective individual codes indicating the component mounting apparatuses from which the friend or foe signals have been transmitted based on the friend or foe signals received by the communication unit 12. Further, the identifying unit 13 identifies whether the component mounting apparatuses from which the individual codes have been transmitted are (1) the apparatuses belonging to the same model group to which the apparatus itself belongs and (2) the apparatuses belonging to the same category group to which the apparatus itself belongs, based on the model codes and category codes included in the individual codes (S33).

The identifying unit 13 generates, based on the above identification result, a table storing the individual codes of the component mounting apparatuses belonging to the same model group to which the apparatus itself belongs and a table storing the individual codes of the component mounting apparatuses belonging to the same category group to which the apparatus itself belongs (S34). Each of the generated tables is stored in the group storing unit 14.

Each of the component mounting apparatuses in the manufacturing system 1 is capable of identifying whether or not each of the other component mounting apparatuses belonging to the same group to which the apparatus itself belongs by executing the sequence of operations.

Note that there may be a case where a component mounting apparatus which does not have a function of transmitting and receiving friend or foe signals. For example, in the case where only manufacturer A's component mounting apparatuses have a function of transmitting and receiving friend or foe signals, only the component mounting apparatuses belonging to the manufacturer A's group can become the targets or performers of the processing such as the identification. In other words, only the component mounting apparatuses belonging to the manufacturer A's group are commonly given the optimum mounting conditions.

In addition, for example, in the case where both of manufacturer A's component mounting apparatuses and the manufacturer B's component mounting apparatuses have a function of transmitting and receiving friend or foe signals, each of the component mounting apparatuses does not need to respond to the request for the task performance information and mounting conditions from the other manufacturer's component mounting apparatuses.

In other words, for example, in the case where mounting conditions for an apparatus such as a component mounting apparatus relate to a unique know-how of a manufacturer, the component mounting apparatus does not need to provide the information to the apparatuses of other manufacturers. Even in such a case, all of the apparatuses belonging to each manufacturer group are commonly given the mounting conditions optimum for the group. Therefore, productivity is increased.

Figure 11:
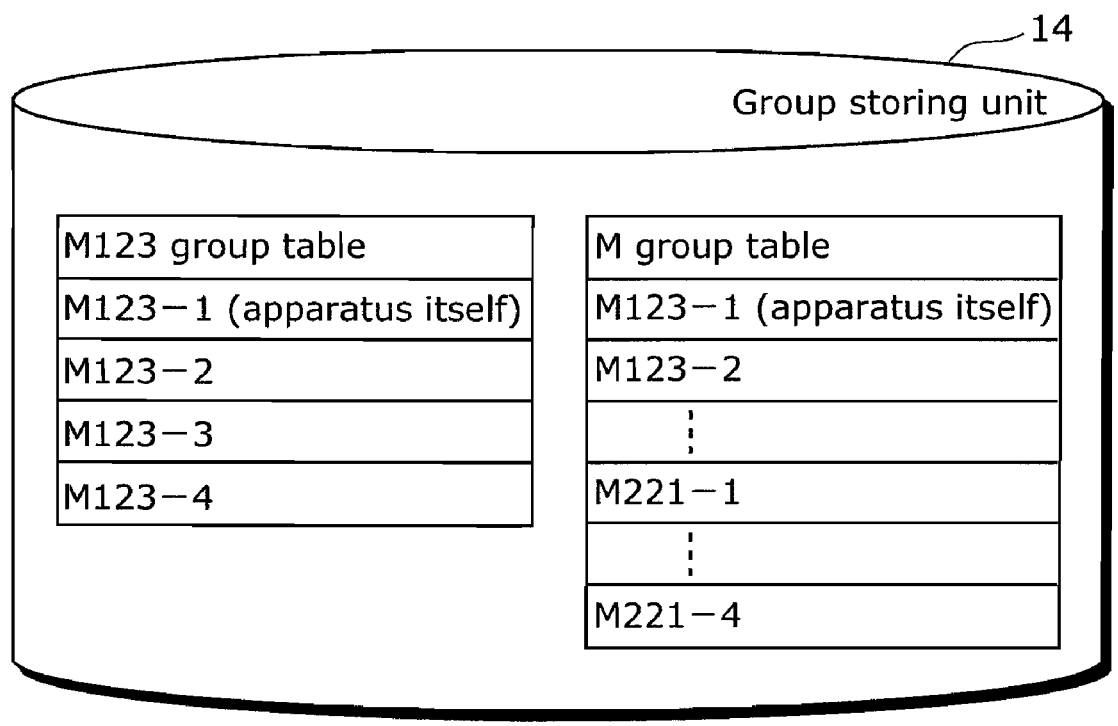
FIG. 11 is a diagram showing examples of group tables stored in a group storing unit which the component mounting apparatus in the first embodiment has.

FIG. 11 is a diagram showing examples of group tables stored in a group storing unit which the component mounting apparatus 10 in the first embodiment has.

The "M123 group table" shown in FIG. 11 is a table in which the individual codes of the component mounting apparatuses with a model code of "M123" are stored. In other words, it is the table for identifying component mounting apparatuses belonging to the same model group to which the apparatus itself belongs.

In addition, the "M group table" is the table in which the individual codes of the component mounting apparatuses with a category code of "G-AM" are stored. In other words, it is the table for identifying the component mounting apparatuses belonging to the same category group to which the apparatus itself belongs.

The collecting unit 15 of the M123-1 which is the component mounting apparatus 10 is capable of collecting the task performance information from the other component mounting apparatuses belonging to the same category group M to which the apparatus itself belongs and the same model group M123 to which the apparatus itself belongs, with reference to these group tables.

Figure 12:
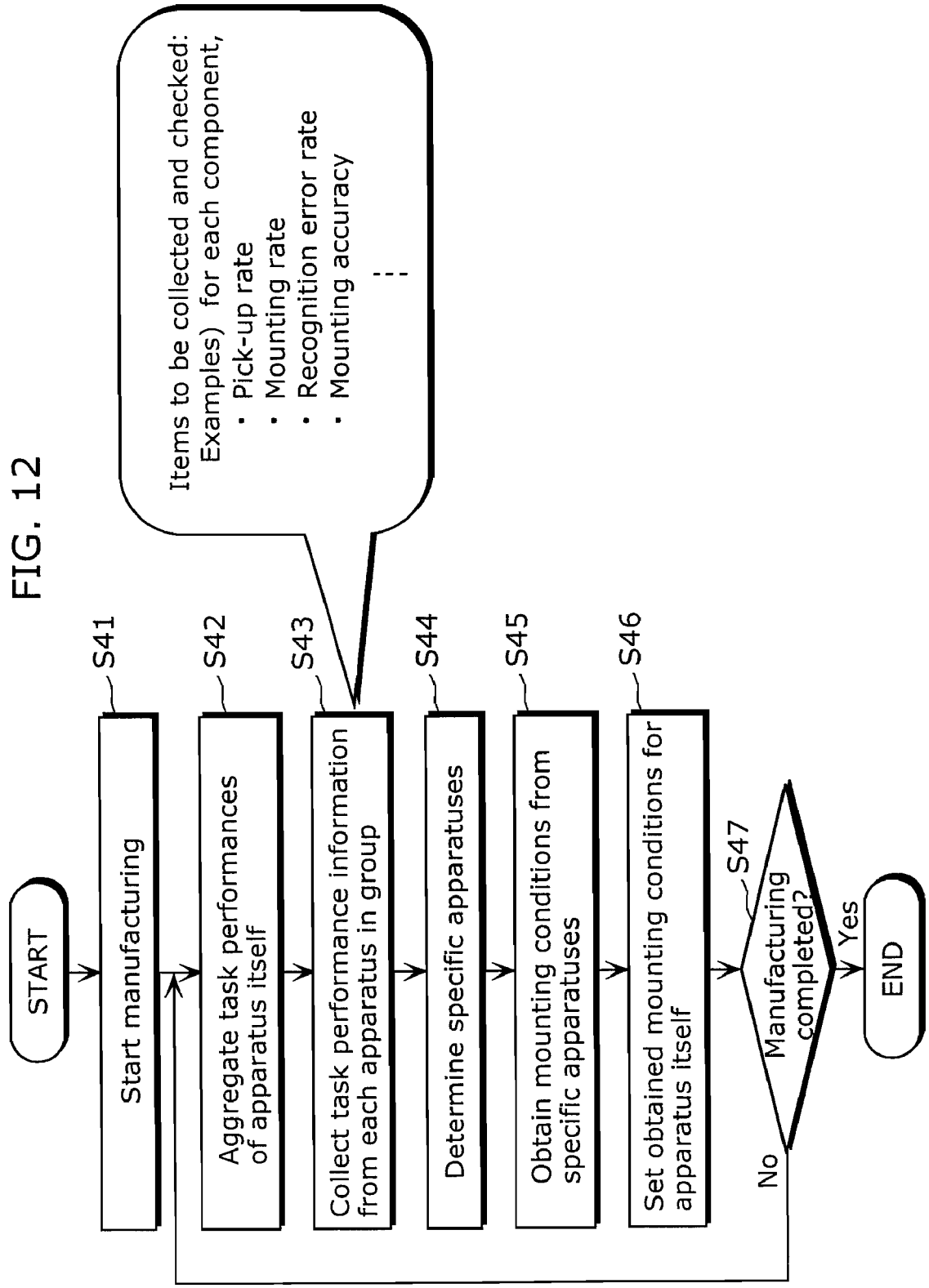
FIG. 12 is a flowchart indicating the operation flow in the case where the component mounting apparatus in the first embodiment obtains a mounting condition from the specific apparatus and sets the obtained mounting condition for the apparatus itself.

FIG. 12 is a flowchart indicating the operation flow in the case where the component mounting apparatus 10 in the first embodiment obtains the mounting conditions from the specific apparatus and sets the obtained mounting conditions for the apparatus itself. In other words, it is a flowchart specifically illustrating the operations of the determination of a specific apparatus (S22) to the settings of mounting conditions (S24) shown in the flowchart of FIG. 6.

The operation flow concerning the obtainment of mounting conditions and the settings of the mounting conditions executed by each component mounting apparatus in the manufacturing system 1 including the component mounting apparatus 10 are described with reference to FIG. 12.

Each component mounting apparatus starts manufacturing of component-mounted boards according to a predetermined instruction, for example, an instruction from an operator (S41). After the manufacturing starts, the error detecting unit 24 aggregates the task performances of the apparatus itself based on the detected error types or the like (S42). The task performance information generated through this aggregation is stored in a performance information storing unit 25.

The collecting unit 15 collects the task performance information from the apparatuses in the group including the apparatus itself (S43). More specifically, in the case of M123-1, it transmits a request for task performance information to an address indicated by each individual code stored in at least one of the M123 group table and M group table stored in the group storing unit 14 with reference to the group table.

The group table to be referred to may be determined according to an explicit instruction by the operator or switched each time of reference.

In addition, as described above, the type of task performance information to be collected is selected depending on the group to be a collection target.

The request for the task performance information includes the information for indicating the type of the task performance information to be transmitted. It includes information indicating, for example, "a pick-up rate of picking up components A". The apparatuses which have received the requests in the group transmit the information indicating "the pick-up rate of picking up components A: 98%" to the component mounting apparatus which transmitted the requests.

The task performance information of the apparatus itself and the other apparatus in the group are collected through the requests and responses. Examples of the task performance information to be collected include a pick-up rate, a mounting rate, a recognition error rate, and a mounting accuracy concerning each type of components.

FIG. 13 is a diagram showing an example of the task performance information collected by the collecting unit 15. Note that FIG. 13 shows an example of the task performance information stored in the determining unit 16 as a result that the collecting unit 15 of M123-1 executes the collection.

As shown in FIG. 13, the task performance information about a pick-up rate concerning components A is collected from each component mounting apparatus belonging to the same model group to which M123-1 belongs, and the component mounting apparatus which provides the highest performance is determined. In the example of the figure, M123-3 provides a pick-up rate concerning components A of "99%", which is the highest performance.

Likewise, the pieces of task performance information about the other combinations of a task performance and a type of component such as a mounting rate concerning components A and a pick-up rate concerning components B are collected, and the determining unit 16 determines, as specific apparatuses, the component mounting apparatuses each of which provides the highest performance (S44).

FIG. 14 is a diagram showing examples of groups of specific apparatuses determined by the determining unit 16.

As shown in FIG. 14, specific apparatuses are determined for each combination of a type of task performance information such as a pick-up rate and a mounting rate and a type of components.

For example, the M123-3 is the specific apparatus in view of the pick-up rate concerning components A, and the M123-1 is the specific apparatus in view of the pick-up rate concerning components B. In addition, the M123-3 is the specific apparatus in view of the mounting rate concerning components A, and the M123-2 is the specific apparatus in view of the mounting rate concerning components B.

Note that the determination of a specific apparatus is executed by the other component mounting apparatuses such as the M123-2. For example, the determining unit 16 of each component mounting apparatus belonging to the M123 group obtains the same determination result as the determination result of the specific apparatus shown in FIG. 14.

The obtaining unit 17 obtains mounting conditions from the specific apparatus determined in this way (S45). More specifically, it obtains the mounting conditions to be transmitted from the specific apparatus as the responses to the requests for mounting conditions. In addition, the types of information to be obtained as mounting conditions will be described later with reference to FIGS. 15 and 16.

The mounting conditions obtained by the determining unit 17 are notified to the setting unit 20 by the communication unit 12, and set at the mechanical control unit 22 by the setting unit 20 (S46). In addition, the mounting conditions are stored in the condition storing unit 21. The mechanical unit 23 mounts components onto boards under the mounting conditions set at the mechanical control unit 22.

Subsequently, while manufacturing is keeping on (No in S47), the above operation is repeated. When the manufacturing is completed according to, for example, an instruction made by the operator (Yes in S47), the sequence of processing concerning the settings of the mounting conditions are also completed.

Note that the operations from the collection of the task performance information from the apparatus in the group (S43) to the settings of the mounting conditions (S46) are voluntarily executed at predetermined timings. For example, the operations are executed for each passage of predetermined time period. The information about the predetermined timings is the information to be set by, for example, the manager of the manufacturing system 1 and stored in the collecting unit 15.

The collecting unit 15 has an internal clock or timer, and starts collecting the task performance information at the timings indicated by the information. In addition, triggered by that the task performance information is collected by the collecting unit 15 (S43), the subsequent operations to the settings of the mounting conditions (S46) are executed.

In addition, in the case where the apparatus itself provides the highest performance in view of a type of task performance information, there is no need to change the mounting conditions associated with the task performance information. Thus, the apparatus itself does not execute the operations of the obtainment of the mounting conditions (S45) and the settings of the mounting conditions (S46).

Here, for example, the pick-up rate concerning components A is the information indicating the performance associated with the manufacturing operation of picking up components A as described above. In addition, the performance level like this depends on the mounting conditions under which the manufacturing operation has been executed.

Accordingly, for example, it is possible to increase the pick-up rate of picking up components A in M123-1 by causing M123-1 to obtain the mounting conditions associated with the pick-up of components A from the M123-3 which provided the highest performance in the pick-up rate of picking up components A.

In other words, a type of task performance information such as pick-up rate and mounting conditions can be associated with each other by a type of manufacturing operation.

FIG. 15 is a diagram showing an example of the association between each type of task performance information such as a pick-up rate and mounting conditions.

As shown in FIG. 15, for example, the mounting conditions associated with a pick-up rate are a set of three items of a nozzle, a pick-up operation pattern, and a correction value for pick-up. More specifically, a nozzle number for identifying a nozzle, a pattern number for identifying a pick-up operation pattern, a value for correcting the pick-Lip position of the nozzle in the X-axis direction and Y-axis direction (refer to FIG. 3) are obtained and set by the component mounting apparatuses other than the specific apparatus as the mounting conditions.

For example, it is possible to increase the pick-up rate of picking up components A in the M123-1 by causing the M123-1 to obtain the three items of mounting conditions concerning components A from the M123-3 which is the specific apparatus and set it for the apparatus itself. The other types of task performance information such as a mounting rate are respectively associated with mounting conditions as shown in FIG. 15.

Each of the component mounting apparatuses belonging to the same group to which the specific apparatus belongs voluntarily obtains the mounting conditions from the specific apparatus at a predetermined timing as described above. In this way, the pick-up rate of each component mounting apparatus increases, resulting in an increase in productivity.

Figure 16:
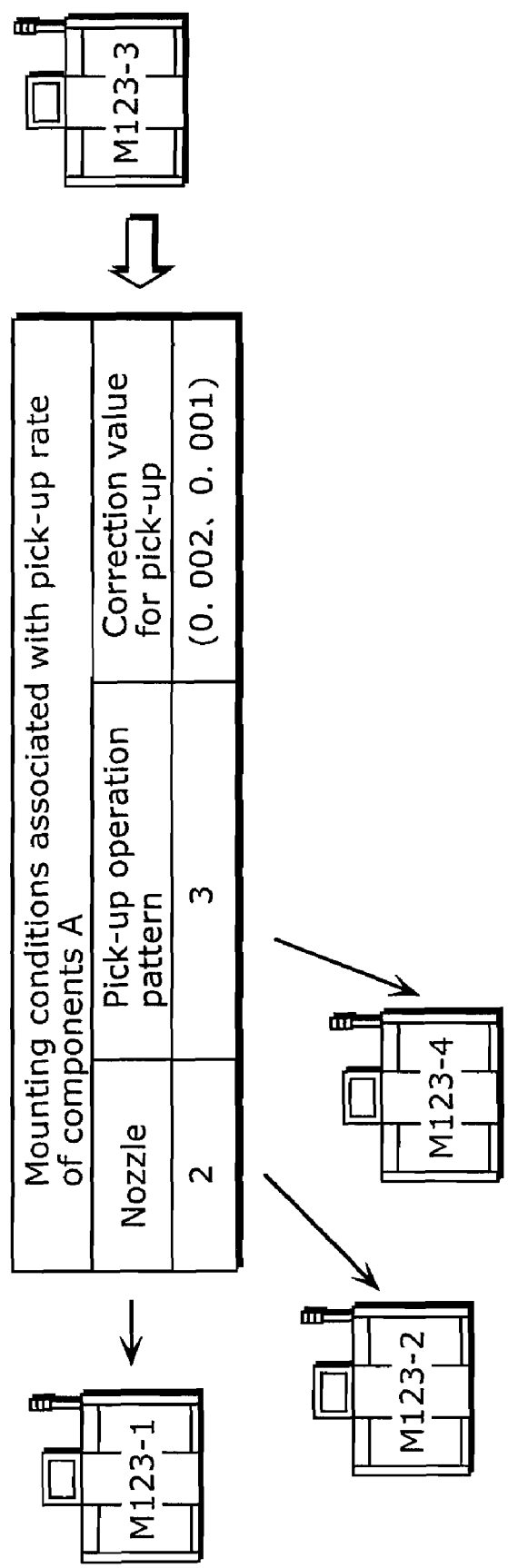
FIG. 16 is a diagram showing examples of mounting conditions obtained from the specific apparatus by each component mounting apparatus.

FIG. 16 is a diagram showing an example of mounting conditions which each component mounting apparatus obtains from a specific apparatus.

The example of FIG. 16 shows how the mounting conditions associated with a pick-up rate of picking up components A is obtained from the M123-3 which is a specific apparatus by the other component mounting apparatuses belonging to the M123 group.

The example of FIG. 16 shows a nozzle with a nozzle number "2", a pick-up operation pattern with a pattern number "3", and a correction value for pick-up with the value "(0.002, 0.001)" (dimensions in mm). These numbers and values are set for each component mounting apparatus as mounting conditions.

In addition, each component mounting apparatus respectively obtains the following mounting conditions from the specific apparatuses: mounting conditions each associated with a combination of a type of component and a type of task performance information such as the mounting conditions associated with the pick-up rate of picking up components B, the mounting conditions associated with the mounting rate of mounting components A, the mounting conditions associated with the recognition error rate of recognizing components C.

For example, in the case where each specific apparatus is determined as shown in FIG. 14, the mounting conditions associated with the pick-up rate concerning components A of the M123-3 is set for the other component mounting apparatuses belonging to the M123 group. In addition, the mounting conditions associated with the pick-up rate concerning components B of the M123-1 is set for the other component mounting apparatuses belonging to the M123 group.

As for a mounting rate, a recognition error rate and the like, the mounting conditions associated with the highest performance in view of each parameter is set for all of the component mounting apparatuses belonging to the M123 group.

In this way, the component mounting apparatus 10 collects pieces of task performance information from the component mounting apparatuses belonging to the same group to which the apparatus itself belongs, and the component mounting apparatus which provides the highest performance in view of each parameter is determined as a specific apparatus. Further, the component mounting apparatus 10 is capable of obtaining the mounting conditions associated with the task performance information from the specific apparatus, and setting the parameter for the apparatus itself.

In addition, the groups of component mounting apparatuses from which the pieces of task performance information are collected and the mounting conditions are obtained are classified depending on the attributes such as models. In other words, the component mounting apparatuses belonging to a group are common in the structures and the like. Therefore, each of the component mounting apparatuses can set the mounting conditions, as they are, obtained from a specific apparatus determined in the group to which the apparatus itself belongs. Thus, the component mounting apparatus 10 can increase the productivity of the apparatus itself.

In addition, each of the other component mounting apparatuses has a mounting condition determining apparatus 11 likewise the component mounting apparatus 10 does, and thus it is capable of obtaining the best mounting conditions in the group to which the apparatus itself belongs and setting the mounting conditions for the apparatus itself. In other words, each component mounting apparatus is capable of autonomously optimizing the mounting conditions.

As a result, the mounting conditions for increasing the productivity to the maximum in each group are set for all the apparatuses belonging to the manufacturing system 1. Thus, not only the productivity of each component mounting apparatus but also the productivity in the whole manufacturing system 1 are increased.

Note that in this embodiment, the details of the processing at the time of determining mounting conditions, the structure and the like of the mounting condition determining apparatus 11 is not limited to those respectively described above. For this reason, variations of this embodiment will be described below.

First Variation of First Embodiment

A variation of a method of determining mounting conditions is described as a first variation of the first embodiment.

As shown in FIG. 15, the pick-up rate and the mounting rate are associated with a nozzle as an item of mounting conditions. Accordingly, for example, there may be a case where the nozzle which provides the highest pick-up rate of picking up components A is a nozzle with a nozzle number of "2" but the nozzle which provides the highest mounting rate is a nozzle with a nozzle number of "3".

When the mounting conditions corresponding to the highest performances are mutually contradictory in this way, in the case of the above example, the nozzle to be used for picking up and mounting components A may be determined as one of the nozzles based on majority rule. For example, a search is performed to find the type of the nozzles for picking up and mounting components A used by the component mounting apparatuses in a group in the above status each of which provides a predetermined pick-up rate of picking up components A, for example, 97% or more and within the highest to fifth highest rates. In addition, a search is also performed to find the type of the nozzles in view of the mounting rate concerning components A.

Among the nozzles searched for in this way, which type of the nozzle types indicated by a nozzle number "2" and a nozzle number "3" is used by a greater number of apparatuses may be determined as the nozzle type to be used.

In the case where the nozzle is determined based on majority rule in this way, for example, the nozzle with a nozzle number "3" may be selected instead of the nozzle with a nozzle number "2" with which the highest pick-up rate of picking up components A. However, as described above, a pick-up rate and a mounting rate are kept at constant levels by adding the conditions that the pick-up rate and the mounting rate should be predetermined rates or above.

In addition, a method other than the method based on majority rule may be used. For example, a method for determining a nozzle in a pick-up rate-oriented way may be used. Additionally, for example, a method of comparing a product of the pick-up rate and a mounting rate of the nozzle with a nozzle number of "2" with a product of the pick-up rate and a mounting rate of a nozzle with a nozzle number of "3" and employing the nozzle which provides the greater product. Even in these cases, a pick-up rate and a mounting rate are kept at constant levels by adding the restrictions that the pick-up rate and the mounting rate should be predetermined rates or above.

In addition, these predetermined rates may be set as different values for the respective component mounting apparatuses. For example, in the case where the value exceeding the current pick-up rate of picking up components A provided by the M123-1 are set for the M123-1 as a predetermined rate, the pick-up rate concerning the components A of the M123-1 can be increased from the current rate at the least.

Accordingly, in the case where values corresponding to the task performances such as the current pick-up rate are set for the other component mounting apparatuses as predetermined rates, the productivities of the apparatuses can be increased from the current rate at the least.

Second Variation of First Embodiment

A variation of a method of obtaining identification information in the mounting condition determining apparatus 11 is described as a second variation of the first embodiment.

It is assumed that the mounting condition determining apparatus 11 receives the identification information such as the individual code of each component mounting apparatus via LAN 5. However, the mounting condition determining apparatus 11 may obtain the identification information via another means. Here is an example case where the apparatuses in the manufacturing system 1 are rarely exchanged and reclassified. The identification information such as the individual code, which is transmitted in a form of a friend or foe signal to a recording medium such as a CD-ROM by each component mounting apparatus, may be stored in advance, and the mounting condition determining apparatus 11 may obtain these individual codes and the like by reading out the recording medium such as the CD-ROM.

Likewise, the task performance information of each component mounting apparatus may be obtained according to a method other than the method for collecting the information via LAN 5. For example, the task performance information of each component mounting apparatus may be stored in a recording medium such as a CD-ROM, and the mounting condition determining apparatus 11 may read out the information from the CD-ROM or the like and determine a specific apparatus.

Determining the specific apparatus in this way makes it possible to, for example, reduce the communication load of LAN 5.

Third Variation of First Embodiment

What is described as a third variation of the first embodiment is a case of using a unit other than a component as a base unit for the mounting conditions to be obtained by each component mounting apparatus.

In the description of this embodiment, as the mounting conditions which each component mounting apparatus obtains from other component mounting apparatuses and sets for the apparatus itself, the mounting conditions for increasing the pick-Lip rate and the like for each component is obtained and set regarding a component as a base unit.

However, a unit other than a component may be used as a base unit. For example, each component mounting apparatus may aggregate recognition error rates for each nozzle in use regarding a nozzle as a base unit. Further, the component mounting apparatus may collect the recognition error rate for each nozzle in the other component mounting apparatuses and determine the specific apparatus which provides the lowest recognition error rate for each nozzle.

In this way, each component mounting apparatus is capable of obtaining the mounting conditions for improving the recognition error rate for each nozzle from the specific apparatus, and sets the mounting conditions for the apparatus itself. As the result, it can increase the productivity.

For example, here is a case where the M123-1 uses a nozzle with a nozzle number 1. In this case, the M123-1 obtains, for example, the amount of light projected when using the nozzle with a nozzle number 1 as mounting conditions associated with the recognition error rate, from the component mounting apparatus which provides the lowest recognition error rate among the other component mounting apparatuses each using a nozzle with a nozzle number of 1.

In this way, it is possible to reduce the recognition error rate at the time when the M123-1 uses a nozzle with a nozzle number 1.

Likewise, for example, in the group of component mounting apparatuses each having plural cameras, each component mounting apparatus may collect the recognition error rate of each camera and determine a specific apparatus. This makes it possible to set mounting conditions such as the amount of light for reducing the recognition error rate to the maximum for each camera in use, and to increase the productivity.

Fourth Variation of First Embodiment

A variation of the contents of the mounting conditions which each component mounting apparatus obtains is described as a fourth variation of the first embodiment.

In this embodiment, the association of a type of task performance information and mounting conditions is a combination shown in FIG. 15. However, a combination other than the combination shown in FIG. 15 may be used. For example, the mounting conditions associated with a pick-Lip rate concerning components are three items of a nozzle, a pick-up operation pattern, and a correction value for pick-up. However, for example, in the case where whether or not a component is successfully picked up depends greatly on the selection of a nozzle, the item of a mounting condition may only relate to "a nozzle". This is applied for the other types of task performance information.

In other words, it is only necessary for each component mounting apparatus to obtain at least one type of information for increasing the productivity as a mounting condition. As described above, such types of information include the nozzle number and moving speed of the nozzle which provides the highest component pick-up rate and NC data in the component mounting apparatus which provides the highest mounting accuracy.

Each component mounting apparatus obtains at least one type of information among these types of information as mounting conditions and sets or changes into the specific values or the like indicated by the information. This makes it possible to increase the efficiency in the manufacturing operation associated with the mounting conditions.

Fifth Variation of First Embodiment

A variation of a method for selecting the types of task performance information which each component mounting apparatus collects is described as a fifth variation of the first embodiment.

In this embodiment, it is assumed that the types of task performance information which the collecting unit 15 collects from the apparatuses in the group are selected depending on the target group to which the apparatus itself belongs and from which the types of task performance information are collected. However, in a reverse manner, the collection target group may be selected depending on the types of task performance information collected by the collecting unit 15.

For example, here is a case where the collecting unit 15 collects recognition error rates as the task performance information. In this case, the devices associated with the recognition error rates include cameras and light projectors. Accordingly, the group of component mounting apparatuses which commonly have the same cameras, light projectors and the like may be determined as the targets from which the task performance information are collected.

In other words, any one of selecting the types of task performance information to be collected and selecting the group to be a collection target may be focused on. In any of the cases, the component mounting apparatus 10 in this embodiment is capable of obtaining mounting conditions which may increase the productivity of the apparatus itself from another component mounting apparatus.

Sixth Variation of First Embodiment

What is described as a sixth variation of the first embodiment is a case of regarding a single component mounting apparatus as a comparison target at the time when each component mounting apparatus obtains mounting conditions.

In the above description, the following case is described: a case where each component mounting apparatus belonging to the M123 group collects pick-up rates and the like from the other component mounting apparatuses in the M123 group and determines the specific apparatuses. However, it is only necessary for each component mounting apparatus to collect the task performance information such as the pick-up rate from at least one of the component mounting apparatuses in order to increase the pick-up rate and the like of the apparatus itself.

For example, the component mounting apparatuses belonging to the T121 group shown in FIG. 2 are the apparatus T121-1 and the apparatus T121-2. In this case, the T121-1 collects the pick-up rate concerning, for example, components A from the T121-2, and compares the collected pick-up rate with the pick-Lip rate of the apparatus itself. The comparison shows that the pick-up rate of the T121-2 is the higher, the T121-1 obtains the mounting conditions associated with the pick-up rate concerning components A from the T121-2 and sets the obtained mounting conditions for the apparatus itself. This makes it possible to increase the pick-up rate concerning components A of the T121-1.

In the opposite case where the comparison shows that the pick-up rate of the T121-1 is the higher; that is, the performance of the apparatus itself is the higher, the T121-1 may give the T121-2 the mounting conditions associated with the pick-up rate concerning components A of the apparatus itself. This makes it possible to increase the pick-up rate concerning components A of the T121-2.

Note that the method for determining the mounting conditions to be set for the apparatus itself through comparison with the other apparatus in this way can be executed even when the apparatus itself can communicate with plural apparatuses. In this case, the mounting conditions corresponding to the highest performance in the group is to be set in the end.

FIG. 17 is a schematic diagram showing how plural component mounting apparatuses execute the method for determining and obtaining mounting conditions to be set for the apparatuses themselves through comparison with other apparatus.

It is assumed in FIG. 17 that the pick-up rates concerning components A of the respective apparatuses M123-1, M123-2, and M123-3 increase in this sequence. Further, it is assumed that the mounting conditions associated with the pick-up rates are mounting condition $\alpha$, mounting condition $\beta$, and mounting condition $\gamma$.

In other words, the mounting condition $\gamma$ of the M123-3 is the mounting condition which increases the pick-up rate concerning components A to the maximum, and the pick-up rate associated with the mounting condition $\gamma$, the pick-up rate associated with the mounting condition $\beta$, and the pick-up rate associated with the mounting condition $\alpha$ are the highest, the second highest and the lowest pick-up rates respectively in this sequence.

As shown in FIG. 17, the M123-1 compares the pick-up rate concerning components A of the apparatus itself with the pick-up rate concerning components A of the M123-2. Since the M123-1 finds that the pick-up rate of the M123-2 is the higher through this comparison, and it obtains the mounting condition $\beta$ from the M123-2 and sets it for the apparatus itself.

This makes it possible to increase the pick-up rate concerning components A of the M123-1 to the rate equal to the pick-up rate of the M123-2.

Subsequently, as shown in the lower part of FIG. 17, the M123-1 compares the pick-up rate concerning components A of the apparatus itself with the pick-up rate concerning components A of the M123-3. The M123-1 finds that the pick-up rate of the M123-3 is the higher through this comparison, and thus it obtains the mounting condition $\gamma$ from the M123-3 and sets it for the apparatus itself.

This makes it possible to set the mounting condition $\gamma$ which provides the highest pick-up rate among the three mounting conditions for the M123-1.

The mounting conditions corresponding to the highest performance in the M123 group are set for the M123-1 by causing the M123-1 to execute the method on the other component mounting apparatuses belonging to the M123 group in sequence in this way.

Further, the mounting conditions for all the component mounting apparatuses belonging to the M123 group are commonly changed to the optimum mounting conditions by causing the other component mounting apparatuses belonging to the M123 group to execute the same operations as those executed by the M123-1.

Seventh Variation of First Embodiment

What is described as a seventh variation of the first embodiment is a case where each component mounting apparatus gives mounting conditions to the other component mounting apparatuses.

It is assumed in this embodiment that each component mounting apparatus obtains mounting conditions from the other component mounting apparatuses. However, each component mounting apparatus may notify the other component mounting apparatuses of the mounting conditions which are factors for the improvement in the manufacturing status of the apparatus itself. For example, after mounting conditions associated with a pick-up rate concerning components A is changed by the operator or according to the mounting conditions obtained from one of the other component mounting apparatuses, the determining unit 16 compares the post-change pick-up rate concerning components A with the pre-change pick-up rate concerning components A stored in the performance information storing unit 25. In the case where the comparison shows that the post-change pick-up rate is increased from the pre-change pick-up rate, the mounting conditions associated with the post-change pick-up rate is sets for each of the other component mounting apparatuses by reading out the post-change pick-up rate from a condition storing unit 21 and notifies the other component mounting apparatuses of the mounting conditions.

In other words, the component mounting apparatus 10 is capable of setting the mounting conditions for each of the other component mounting apparatuses by transmitting the mounting conditions to the other apparatuses. In this case, the communication unit 12 functions as a unit for setting the mounting conditions for the other apparatuses.

According to the method like this, it is possible to increase the pick-up rate concerning components A of the other component mounting apparatuses.

Eighth Variation of First Embodiment

What is described as an eight variation of the first embodiment is a variation other than the above-described variations concerning the structure, functions and the like of each component mounting apparatus in the manufacturing system 1.

LAN 5 to which each component mounting apparatus is connected in the manufacturing system 1 shown in FIG. 1 may be wired or wireless. In addition, the communication protocol is not limited to the above-described TCP/IP, and another protocol may be used. It is only necessary that an environment where each component mounting apparatus can transmit and receive a friend and foe signal, task performance information and mounting conditions is realized.

In addition, a description is given in this embodiment assuming that each of the apparatuses for manufacturing component-mounted boards is a component mounting apparatus. However, there is a case where plural component mounting apparatuses are connected and they operate under common mounting conditions.

In this case, each of the plural component mounting apparatuses operated under the common mounting conditions does not need to identify the other component mounting apparatuses other than the plural component mounting apparatuses and obtains the mounting conditions from the other component mounting apparatuses. In other words, one of the plural component mounting apparatuses may identify the other component mounting apparatuses and obtain the mounting conditions for the plural component mounting apparatuses. Further, the obtained mounting conditions may be set for the respective component mounting apparatuses. In addition, it is only necessary for the other component mounting apparatuses, other than the plural component mounting apparatuses handled as the one of the plural component mounting apparatuses, to transmit and receive the information to the one of the plural component mounting apparatuses.

In this way, the mounting condition determining method of the present invention is effective even in the case where plural component mounting apparatuses are handled as a single component mounting apparatus. In addition, the same thing is applied in the case where the apparatuses constituting a line are operated in the same way under common mounting conditions. In this case, the apparatuses in the line may be handled as a single apparatus.

In addition, it is assumed in the description of the flowchart of FIG. 12 that the component mounting apparatus 10 in this embodiment executes a sequence of operations starting with collecting the task performance information from the apparatuses in a group (S43) and ending with setting mounting conditions (S46) for each passage of predetermined time period. However, other timings may be employed, and for example, the sequence of operations may be executed only at power-on.

In addition, for example, each component mounting apparatus may adjust the timings in order to diverse the communication load of LAN 5 by communicating with each other so that each component mounting apparatus or each group of component mounting apparatuses executes the sequence of operations at timings each shifted on the time axis.

Additionally, the component mounting apparatus 10 may be caused to obtain mounting conditions according to an explicit instruction by the operator, in addition to voluntarily obtaining the mounting conditions.

In addition, each component mounting apparatus may detect a change in the productivity of the apparatus itself, for example, detect that the pick-up rate of picking up components A falls below a predetermined value, and execute the sequence of operations.

In other words, for example, a manager of the manufacturing system 1 may properly determine the timings at which the sequence of operations are executed considering the operation rate of each component mounting apparatus, a change in the productivity and the like, and set the timings for each component mounting apparatus. By doing so, each component mounting apparatus can voluntarily obtain mounting conditions from the other apparatuses in accordance with the status of the component mounting apparatus.

In addition, FIG. 3 shows the component mounting apparatus 10 structured to have an internal mounting condition determining apparatus 11. However, the component mounting apparatus 10 may have an external mounting condition determining apparatus 11. In other words, it is only necessary for each component mounting apparatus in this embodiment to exchange information with the single mounting condition determining apparatus 11 exclusive to the apparatus itself, irrespective of the type of communication; that is, wired communication or wireless communication.

In this way, for example, mounting conditions can be autonomously optimized even in the case of externally attaching a mounting condition determining apparatus 11 of this embodiment to an existing component mounting apparatus.

In addition, it is assumed that an M123 group table for each model group and an M group table for each category group are stored in the group storing unit 14 of the mounting condition determining apparatus 11 which the component mounting apparatus 10 has. Further, it is assumed that the mounting condition determining apparatus 11 collects task performance information with reference to one of the two tables.

However, the mounting condition determining apparatus 11 may store a table for each group classified based on another criteria other than models and categories, and collect task performance information with reference to the table.

For example, a manufacturer table based on manufacturers may be generated and stored in this embodiment. Since the component mounting apparatuses have been manufactured by the same manufacturer, the component mounting apparatuses manufactured by the same manufacturer may have the common structure, functions, or way of handling NC data. Therefore, mounting conditions optimum for all the component mounting apparatuses made by the same manufacturer may be commonly set depending on the mounting conditions.

In this way, the same mounting conditions can be given to a greater number of component mounting apparatuses. Therefore, for example, the management of the mounting conditions for the respective component mounting apparatuses becomes easier for the manager of the manufacturing system 1.

Ninth Variation of First Embodiment

What is described as a ninth variation of the first embodiment is a case where the mounting condition determining apparatus 11 does not identify the other component mounting apparatuses.

The mounting condition determining apparatus 11 of the component mounting apparatus 10 in this embodiment identifies a component mounting apparatus belonging to the same group to which the apparatus itself belongs.

However, this identification may not be executed. For example, in the case where the component mounting apparatus 10 and the plural component mounting apparatuses capable of communicating with the component mounting apparatus 10 in the manufacturing system 1 are made by the same manufacturer, the mounting conditions optimum for all the component mounting apparatuses can be commonly set as described above.

Accordingly, the mounting condition determining apparatus 11 is capable of obtaining the mounting conditions which may voluntarily increase the productivity to the maximum from among the mounting conditions for the plural apparatuses, and sets the obtained mounting conditions for the apparatus itself, without identifying the group to which each of the apparatuses belongs.

In addition, even in the case where these apparatuses are made by different manufacturers, some mounting conditions can be commonly set for the apparatuses based on items and the names of the items which can be set as mounting conditions and the association between the set mounting conditions and the operations executed by the mechanical units, although the number of the common mounting conditions are fewer than the one in the case where these apparatuses are made by the same manufacturer.

Further, even in the case where the items and the names of the items which can be set as mounting conditions are different, these apparatuses can absorb the difference in names used by the respectively different manufacturers, as long as one of these apparatuses has information about the conversion between different names.

For example, it is assumed in the manufacturing system 1 that a company A's component mounting apparatus (hereinafter, referred to as "mounting apparatus A") internally handles a correction value for pick-up as a code of "VP", and a company B's component mounting apparatus (hereinafter, referred to as "mounting apparatus B") internally handles a correction value for pick-up as a code of "REP".

In this case, the codes representing correction values for pick-up are different between the mounting apparatus A and the mounting apparatus B. Thus, in the case where one of these apparatuses obtains the correction value for pick-up of the other apparatus as mounting conditions from the other apparatus, the apparatus which obtained the mounting conditions cannot set it properly.

To prevent this, causing at least the component mounting apparatus which obtains mounting conditions to store information about the conversion between different names such as "VP:REP" makes it possible to cause the apparatus to properly recognize the correction value for pick-up obtained as mounting conditions and set it for the apparatus itself.

As an opposite case, the apparatus which transmits the mounting conditions may execute such conversion. For example, in the case where the apparatus B is caused to store the conversion information and the apparatus B transmits the correction value for pick-up as mounting conditions to the apparatus A, the apparatus B transmits the correction value for pick-up used in the apparatus itself as "VP" used in the apparatus A as the code of the correction value for pick-up.

Also in the opposite case, it is possible to cause the apparatus A to properly recognize the correction value for pick-up obtained from the apparatus B and set it for the apparatus itself.

In addition, even in the case where the data formats such as the numbers of digits of mounting conditions are different, it is possible to absorb the data format difference between manufacturers using conversion information as described above or a conversion expression.

Note that the mounting condition determining apparatus 11 executes the conversion operation so as to absorb the difference in the performances of the apparatuses, and the conversion operation and the like will be described later as a supplemental point 3.

Even in the case where apparatuses made by different manufacturers coexist in the manufacturing system in this way, mounting conditions which can be commonly set and effective may exist. Also in this case, the mounting condition determining apparatus 11 is capable of finding out mounting conditions which may increase the productivity from among the mounting conditions for the plural apparatuses as described above without identifying the group to which each apparatus belongs, and setting the mounting conditions for the apparatus itself.

In addition, even in the case where the mounting condition determining apparatus 11 does not identify the other apparatuses, it is only necessary for the mounting condition determining apparatus to communicate with at least one of the other apparatuses in the same way as the case of identifying the other apparatuses.

Even in this case, through a comparison between the two task performances of these apparatuses, the mounting condition of one of the apparatuses which provides the higher performance is to be set for the other apparatus. In other words, the productivity of at least one of the apparatuses is increased. Further, when such a comparison is repeatedly executed by each apparatus so that task performances of the other apparatuses are compared with that of the apparatus itself, the mounting condition which is best among the mounting conditions for the plural apparatuses are set for each apparatus.

Second Embodiment

It is assumed in the first embodiment that each of the plural component mounting apparatuses has a mounting condition determining apparatus 11 and autonomously optimizes mounting conditions.

However, it is assumed in this embodiment that each component mounting apparatus does not have a mounting condition determining apparatus 11 and that a mounting condition determining apparatus 11 independent from each component mounting apparatus obtains a mounting condition from at least one component mounting apparatus and transmits the obtained mounting condition to each component mounting apparatus which made a request for the mounting condition.

In this case, a mounting condition determining apparatus 11 is connected in advance to LAN 5 so that it can communicate with all of the component mounting apparatuses. The mounting condition determining apparatus 11 is caused to identify the component mounting apparatuses for each group, determine specific apparatuses, obtain the mounting conditions for the specific apparatuses, transmit the mounting conditions requested for by each component mounting apparatus, and the like. By doing so, it is possible to set, for the apparatus itself, the optimum mounting conditions in accordance with the attributes of the apparatus itself, in the same way as the first embodiment. In other words, it is possible to increase the productivity of each component mounting apparatus.

Here, a description is given of a manufacturing system constituting plural component mounting apparatuses and a single mounting condition determining apparatus.

Figure 18:
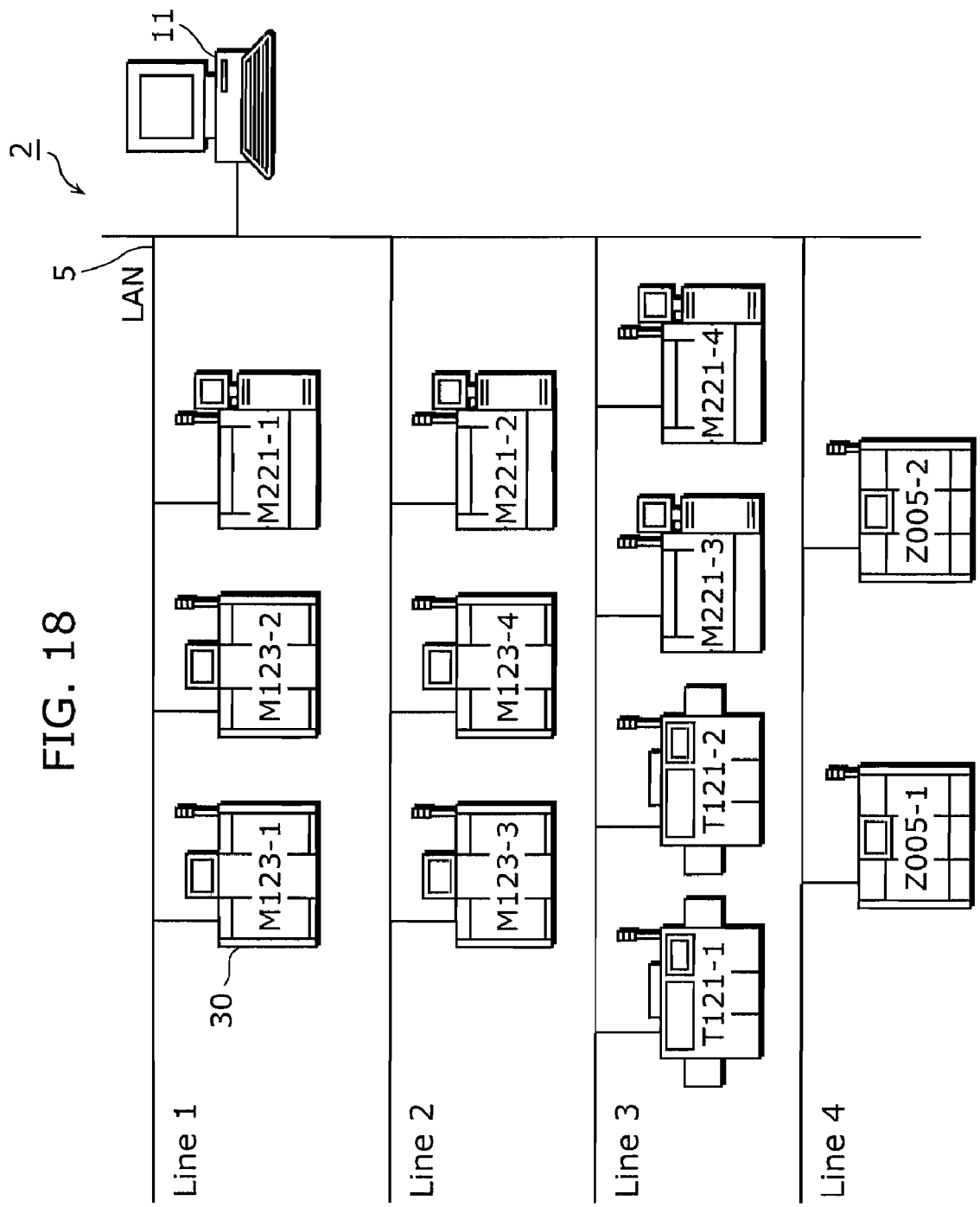
FIG. 18 is a schematic diagram showing the outline of the hardware configuration of the manufacturing system in a second embodiment.

FIG. 18 is a schematic diagram showing the outline of the hardware configuration of the manufacturing system in the second embodiment.

As shown in FIG. 18, the manufacturing system 2 in the second embodiment is configured with four lines likewise the manufacturing system 1 in the first embodiment. In addition, the apparatus configuration in the four lines are also the same, and the model of each component mounting apparatus is the same as those of the plural component mounting apparatuses shown in the first embodiment.

However, each component mounting apparatus does not have a mounting condition determining apparatus 11 unlike the apparatus in the first embodiment. A single mounting condition determining apparatus 11 is connected to LAN 5. Each component mounting apparatus is capable of communicating with the mounting condition determining apparatus 11 through LAN 5.

Note that the component mounting apparatuses are classified into groups based on attributes such as models likewise the apparatuses in the first embodiment. The group name of each group and the component mounting apparatuses constituting the group are the same as those shown in FIG. 2.

In addition, the mounting condition determining apparatus 11 is capable of transmitting information to the component mounting apparatuses using the individual codes of the apparatuses as the addresses of the information, in the same way as the first embodiment.

The functional structures of each component mounting apparatus are described taking, as an example, a component mounting apparatus 30 with the individual code of "M123-1".

Figure 19:
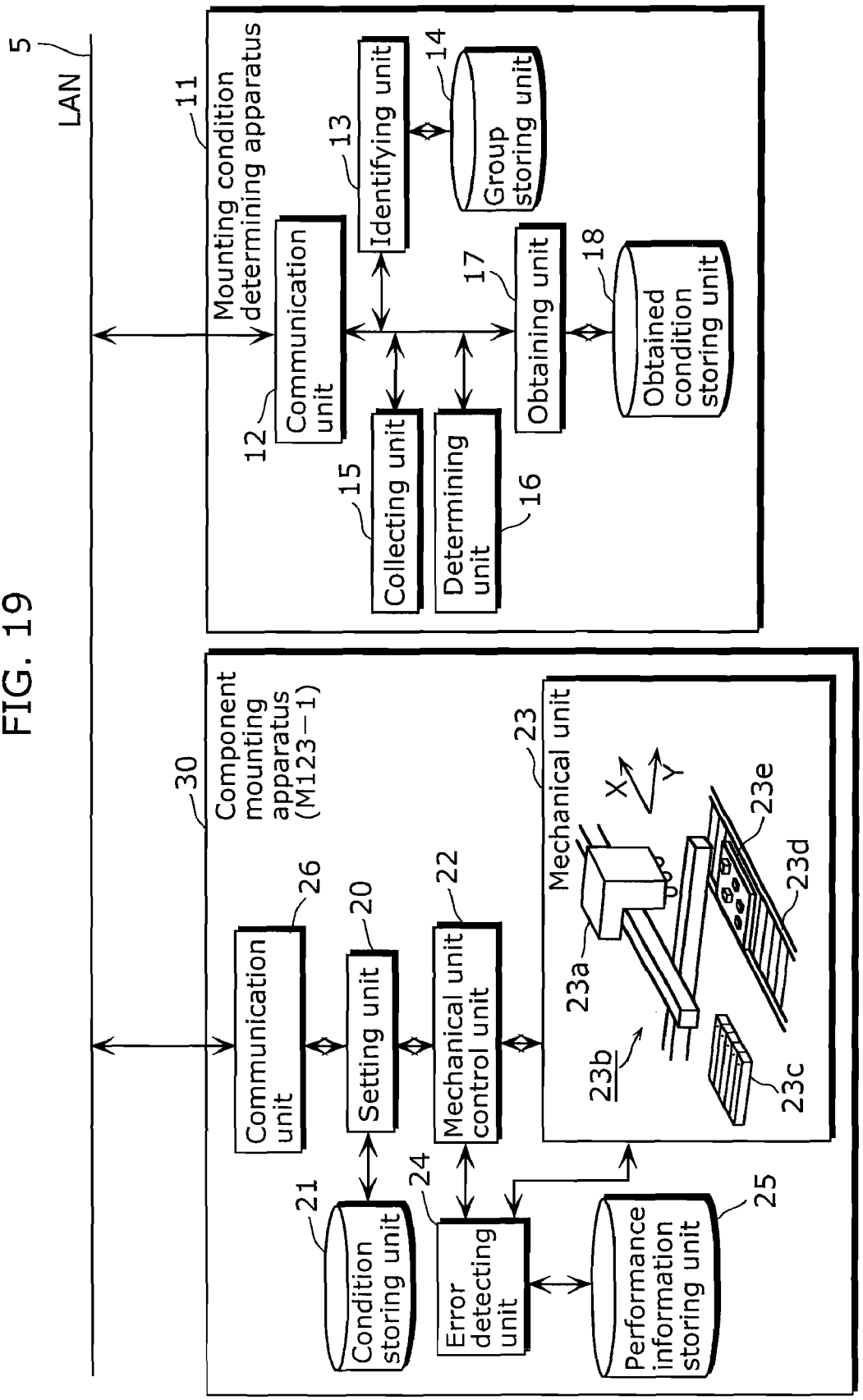
FIG. 19 is a functional block diagram showing the functional structures of the component mounting apparatus and mounting condition determining apparatus in the second embodiment.

FIG. 19 is a functional block diagram showing the functional structures of the component mounting apparatus and mounting condition determining apparatus in the second embodiment.

The component mounting apparatus 30 shown in FIG. 19 does not have a mounting condition determining apparatus 11 unlike the component mounting apparatus 10 in the first embodiment. In addition, the component mounting apparatus 30 has a communication unit 26 which communicates with the mounting condition determining apparatus 11 through LAN 5.

The communication unit 26 is a processing unit capable of transmitting a request for mounting conditions to the mounting condition determining unit 11 and receiving the mounting conditions to be transmitted from the mounting condition determining apparatus 11 in response to the request. In other words, with the communication unit 26, the functions of requesting for and receiving mounting conditions are realized.

The component mounting apparatus 30 is capable of transmitting identification information such as the individual code in a form of a friend or foe signal, likewise the component mounting apparatus 10 in the first embodiment. More specifically, the communication unit 26 transmits the friend or for signal in response to the request from the mounting condition determining apparatus 11 to the mounting condition determining apparatus 11. The contents of the identification information included in the friend or foe signal is the same as those shown in FIG. 8.

The functions of the other mechanical units are the same as those in the first embodiment. The other mechanical units are a setting unit 20, a condition storing unit 21, a mechanical control unit 22, a mechanical unit 23, an error detecting unit 24 and a performance information storing unit 25.

In other words, the setting unit 20 receives, via the communication unit 26, the mounting conditions to be transmitted from the mounting condition determining apparatus 11 in response to the request from the component mounting apparatus 30, and sets the mounting conditions at the mechanical control unit 22. In addition, the mounting conditions are stored in the condition storing unit 21. The mechanical unit 23 mounts components onto boards under the condition set by the mechanical control unit 22.

In addition, the error detecting unit 24 detects errors in the manufacturing operations executed by the component mounting apparatus 30 and aggregates the task performances in the apparatus itself based on the types of the detected errors. The task performance information generated through the aggregation is stored in the performance information storing unit 25.

The mounting conditions stored in the condition storing unit 21 and the task performance information stored in the performance information storing unit 25 are transmitted to the mounting condition determining apparatus 11 via the communication unit 26.

The mounting condition determining apparatus 11 is independent and connected to LAN 5, and is capable of exchanging information with each component mounting apparatus connected to LAN 5.

In addition, the structure of the mounting condition determining apparatus 11 in the second embodiment is different from that of the mounting condition determining apparatus 11 in the first embodiment. The mounting condition determining apparatus 11 has an obtaining condition storing unit 18 for storing the obtained mounting conditions.

The mounting condition determining apparatus 11 in the second embodiment is capable of obtaining the mounting conditions for a specific apparatus in advance, storing the obtained mounting conditions, reading out the mounting conditions from the obtaining condition storing unit 18 in response to the request from each component mounting apparatus, and transmitting it to the component mounting apparatus.

In the first embodiment, the mounting condition determining apparatus 11 executes various types of processing for optimizing mounting conditions on a single component mounting apparatus. In the second embodiment, however, the mounting condition determining apparatus 11 is capable of executing various types of processing for optimizing mounting conditions on the plural component mounting apparatuses as the targets.

Note that the component mounting apparatus 30 shown in FIG. 19 is represented as "M123-1" in FIG. 18, and each of the other component mounting apparatuses has the same functional structures as that of M123-1.

In other words, the model of the other component mounting apparatuses belonging to the M123 group to which the M123-1 belongs is the same model of the M123-1, and each of the other component mounting apparatuses has the same functional structures as the one shown in FIG. 19. In addition, each of the component mounting apparatuses in the other groups differs from the M123-1 in the devices constituting the mechanical unit 23. However, each of the component mounting apparatuses are the same in that it includes, as functional structures, a communication unit 26, a setting unit 20, a condition storing unit 21, a mechanical control unit 22, a mechanical unit 23, an error detecting unit 24 and a performance information storing unit 25.

Accordingly, each of the other component mounting apparatuses such as the M123-2 is capable of transmitting a request for mounting conditions to the mounting condition determining apparatus 11 likewise the component mounting apparatus 30 and receiving the mounting conditions transmitted in response to the request. Further, each of the other component mounting apparatuses is capable of executing various types of manufacturing operations under the received mounting conditions.

The basic operation concerning the obtainment of mounting conditions executed by the component mounting apparatus 30 in this embodiment is the same as the basic operation concerning the obtainment of mounting conditions executed by the component mounting apparatus 10 in the first embodiment shown in FIG. 5.

Put another way, the component mounting apparatus 30 voluntarily obtains the mounting conditions for the other apparatuses, in other words, without receiving any instruction for obtaining mounting conditions from outside the component mounting apparatus 30 (S11). Further, the component mounting apparatus 30 sets the obtained mounting conditions for the component mounting apparatus 30 itself (S12).

However, the component mounting apparatus 30 in this embodiment does not directly obtain mounting conditions from the other component mounting apparatuses. The component mounting apparatus 30 differs in that it obtains the mounting conditions for the other component mounting apparatuses via the mounting condition determining apparatus 11.

For example, from the view point of the M123-1, the procedure for obtaining mounting conditions for the M123-2 is made up of the following two steps in which: (1) the mounting condition determining apparatus 11 obtains mounting conditions from the M123-2; and (2) the M123-1 obtains mounting conditions from the mounting condition determining apparatus 11.

In addition, the mounting condition determining apparatus 11 in this embodiment differs in that it executes a sequence of operations on plural component mounting apparatuses as described above. In other words, in the first embodiment, "a predetermined group" for the mounting condition determining apparatus 11 which each component mounting apparatus has is the group to which the component mounting apparatus itself that includes the mounting condition determining apparatus 11 belongs. However, in the second embodiment, the mounting condition determining apparatus 11 is capable of executing the sequence of operations on the plural groups of apparatuses and optimizing the mounting conditions for the component mounting apparatuses belonging to the plural groups.

Figure 20:
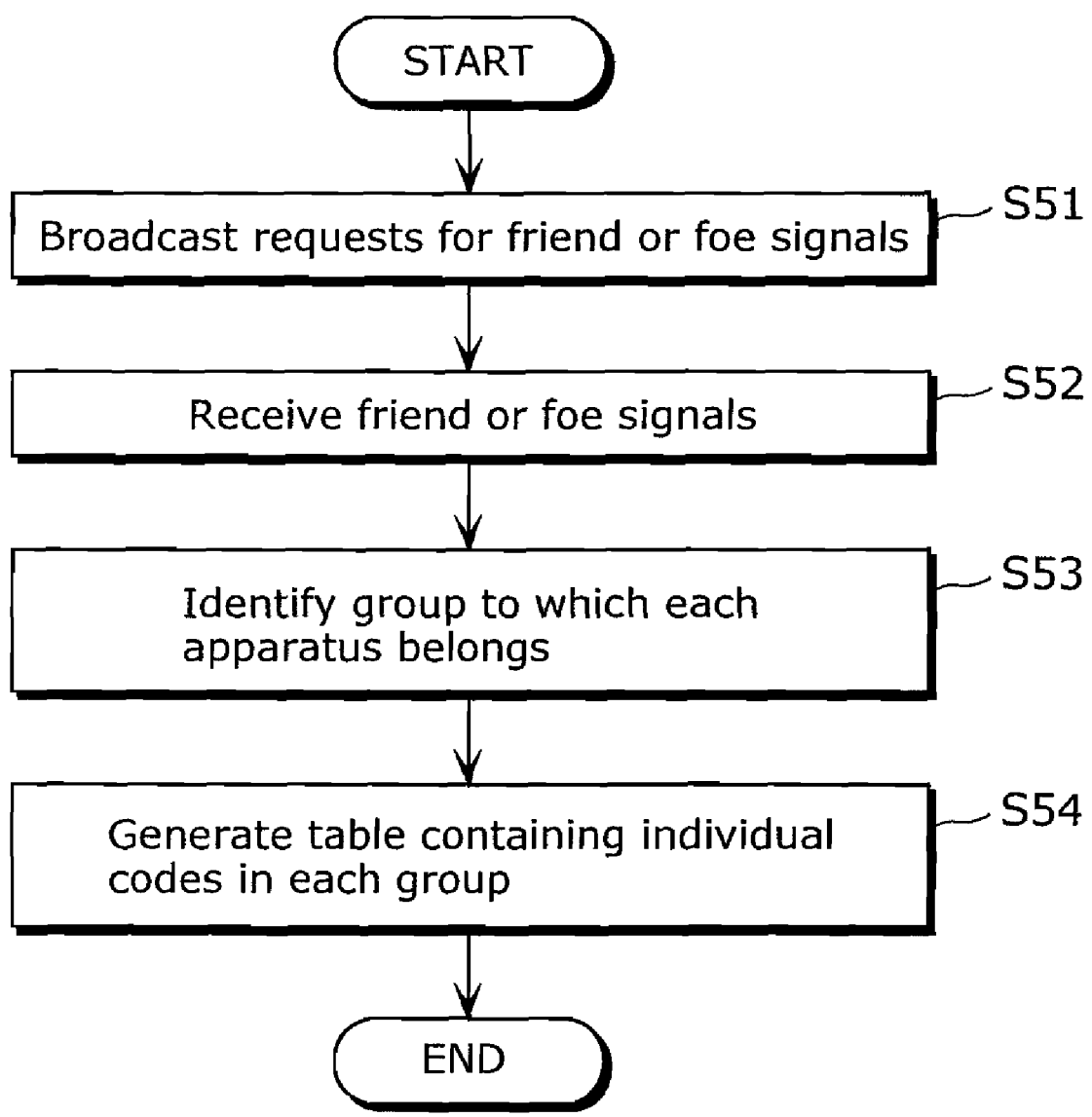
FIG. 20 is a flowchart indicating the operation flow in the case where the mounting condition determining apparatus in the second embodiment identifies plural component mounting apparatuses.

FIG. 20 is a flowchart indicating the operation flow in the case where the mounting condition determining apparatus 11 in the second embodiment identifies plural component mounting apparatuses.

Requests for friend or foe signals are broadcast from the communication unit 12 of the mounting condition determining apparatus 11 to all of the component mounting apparatuses connected to LAN 5 (S51). The communication unit 12 receives the friend or foe signals to be transmitted in response to the requests (S52).

The identifying unit 13 reads out the individual codes identifying the component mounting apparatuses as the sources from which the friend and foe signals have been transmitted. Further, the identifying unit 13 identifies the groups to which the respective component mounting apparatuses as the sources belong, based on the model codes and category codes included in the individual codes of the component mounting apparatuses (S53).

Note that the information necessary for the identification is stored in the group storing unit 14, and the identifying unit 13 executes the identification with reference to the information. For example, the group storing unit 14 stores, for reference, the model codes such as "M123" and the category codes such as "M". In the case where the identifying unit 13 refers to these model codes and finds that one of them is included in the individual code, it identifies the individual code as indicating an apparatus which belongs to the group corresponding to the sequence of characters of the model code.

In this embodiment, the targets of the identification are the model groups of M123, M221, T121, and Z005, and the category groups of M, T and Z (refer to FIG. 2).

The identifying unit 13 generates plural tables for models and plural tables for categories based on the identification (S54). Each of the generated tables is stored in the group storing unit 14.

The mounting condition determining apparatus 11 in the manufacturing system 2 is capable of identifying the group to which each of the component mounting apparatuses in the manufacturing system 2 belongs, by executing the sequence of operations.

Figure 21:
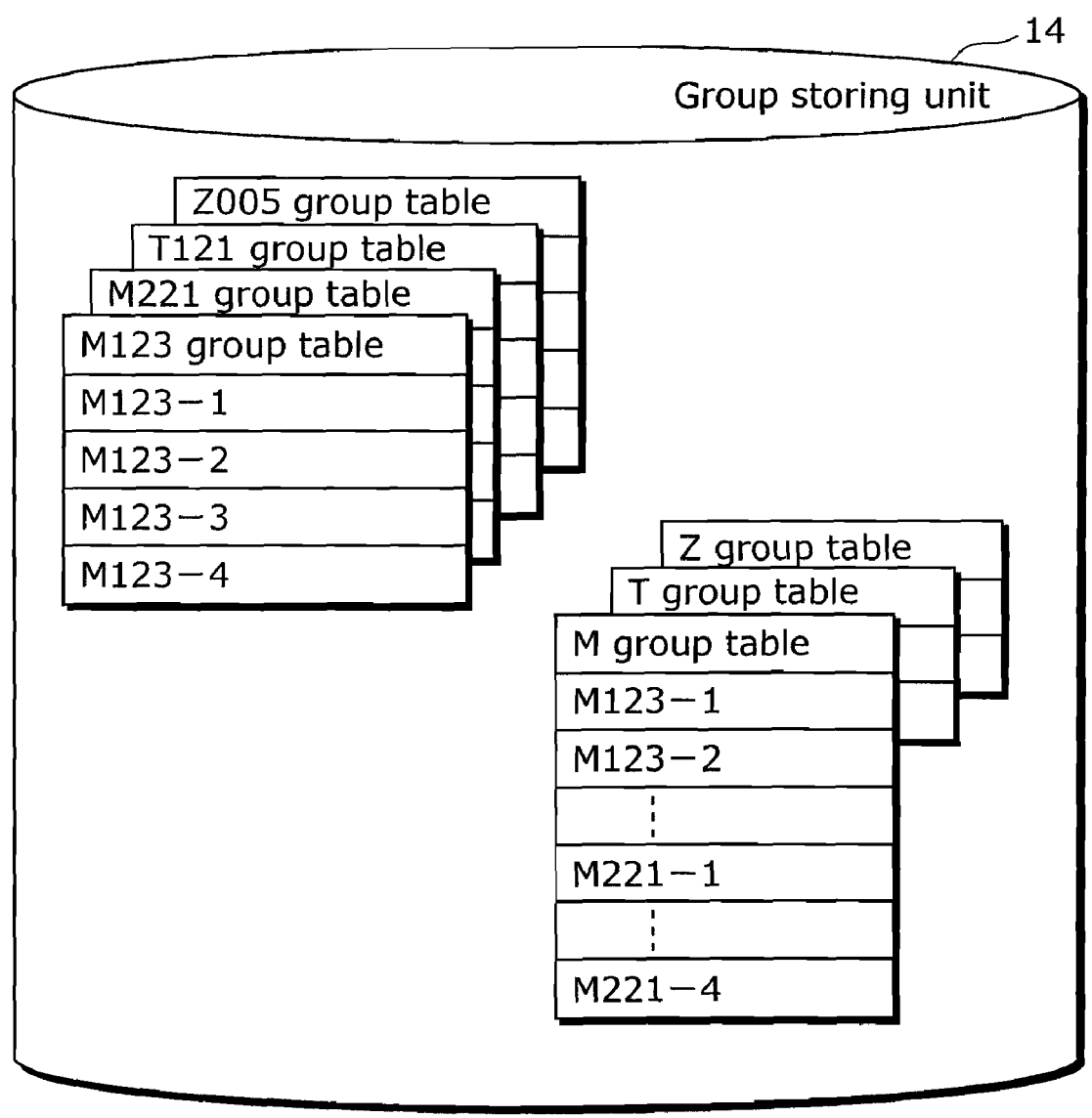
FIG. 21 is a diagram showing examples of group tables stored in a group storing unit which the mounting condition determining apparatus in the second embodiment has.

FIG. 21 is a diagram showing examples of group tables stored in the group storing unit 14 which the mounting condition determining apparatus 11 in the second embodiment has.

The group storing unit 14 shown in FIG. 21 stores the group table for each model and the group table for each category generated based on the result of identification (S53) executed by the identifying unit 13.

In the mounting condition determining apparatus 11, the collecting unit 15 is capable of transmitting and receiving information to all of the component mounting apparatuses belonging to any of the groups with reference to these group tables.

More specifically, the collecting unit 15 is capable of transmitting predetermined requests for task performance information to all of the component mounting apparatuses belonging to each group and collecting the task performance information of the respective component mounting apparatuses as responses to the requests.

Figure 22:
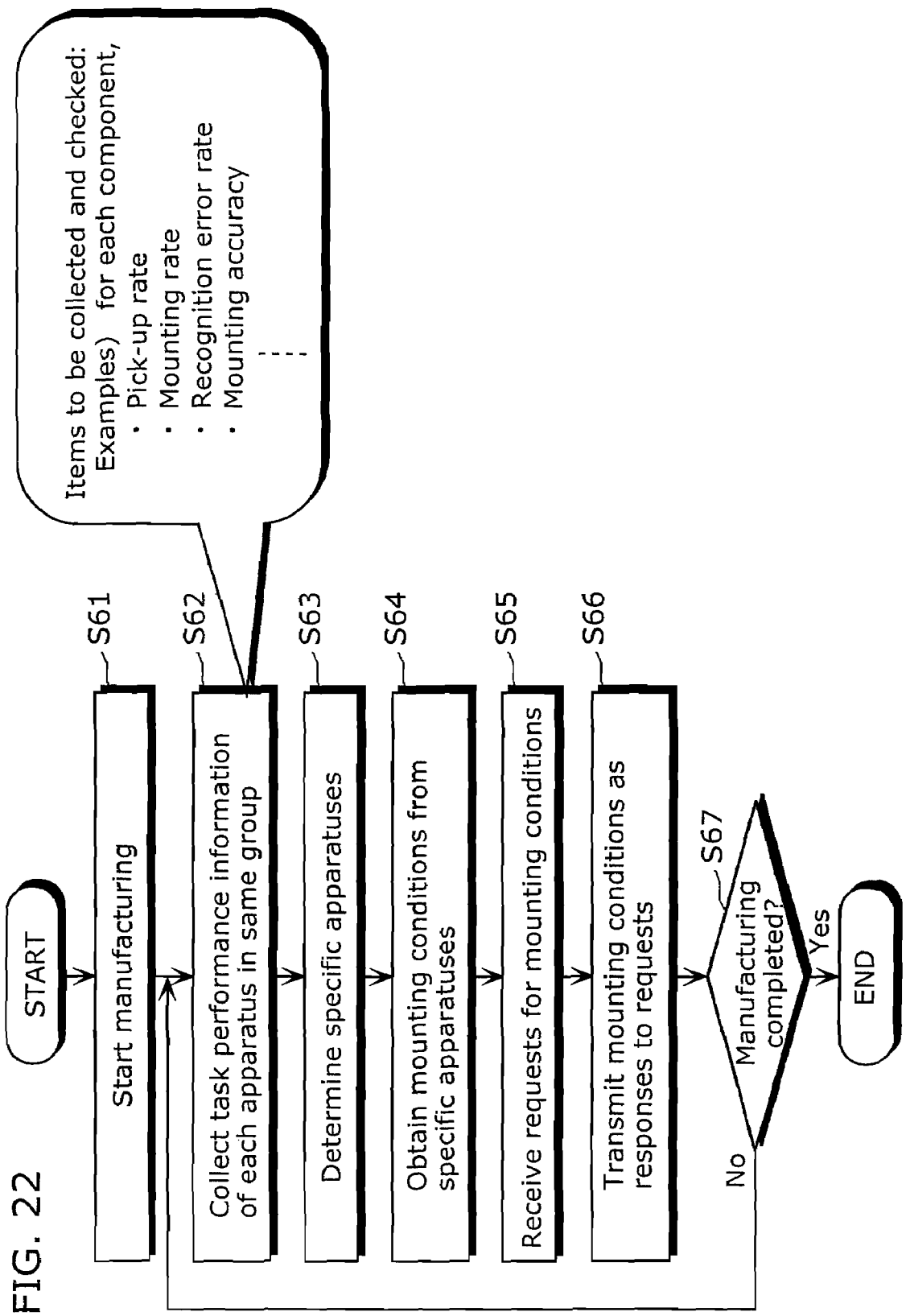
FIG. 22 is a flowchart indicating the operation flow in the case where the mounting condition determining apparatus in the second embodiment obtains the mounting conditions from the specific apparatuses and sets the obtained mounting conditions for the apparatuses.

FIG. 22 is a flowchart indicating the operation flow in the case where the mounting condition determining apparatus 11 in the second embodiment obtains the mounting conditions from specific apparatuses and sets the mounting conditions for each component mounting apparatus.

Each component mounting apparatus starts manufacturing of component-mounted boards according to a predetermined instruction, for example, an instruction from an operator (S61). After the manufacturing starts, each component mounting apparatus generates task performance information such as a pick-up rate for each type of component.

The collecting unit 15 collects task performance information from each apparatus for each group (S62). More specifically, the collecting unit 15 refers to each group table stored in the group storing unit 14 and transmits a request for the task performance information to each apparatus with an individual code stored in each group table. The collecting unit 15 collects the task performance information to be transmitted from each component mounting apparatus in response to the request.

The types of the task performance information to be collected are the same as those in the first embodiment, and thus the types are a pick-up rate, a mounting rate, a recognition error rate and a mounting accuracy for each type of components. In addition, one or plural types of task performance information are collected.

In addition, information about the type of task performance information which should be requested for and about the group to which the request should be made is stored, for example, in the collecting unit 15. For example, collection information identifying the pieces of task performance information to be collected such as "M123: components A, B, C and D: pick-up rates, mounting rates" is stored in the collecting unit 15. The collecting unit 15 collects the task performance information based on the collection information and the individual code of each component mounting apparatus stored in the group storing unit 14.

For example, in the case where the collecting unit 15 stores the collection information, it transmits requests for the pick-up rates and mounting rates concerning the respective types of components A to D to the apparatuses M123-1, M123-2, M123-3, and M123-4 belonging to the M123 group. In this way, the collecting unit 15 collects the pick-Lip rates and mounting rates of the respective types of components A to D from all the component mounting apparatuses belonging to the M123 group.

The collection information about each of the other groups is also stored in the collecting unit 15, and thus the task performance information suitable for each group is collected.

Figure 23:
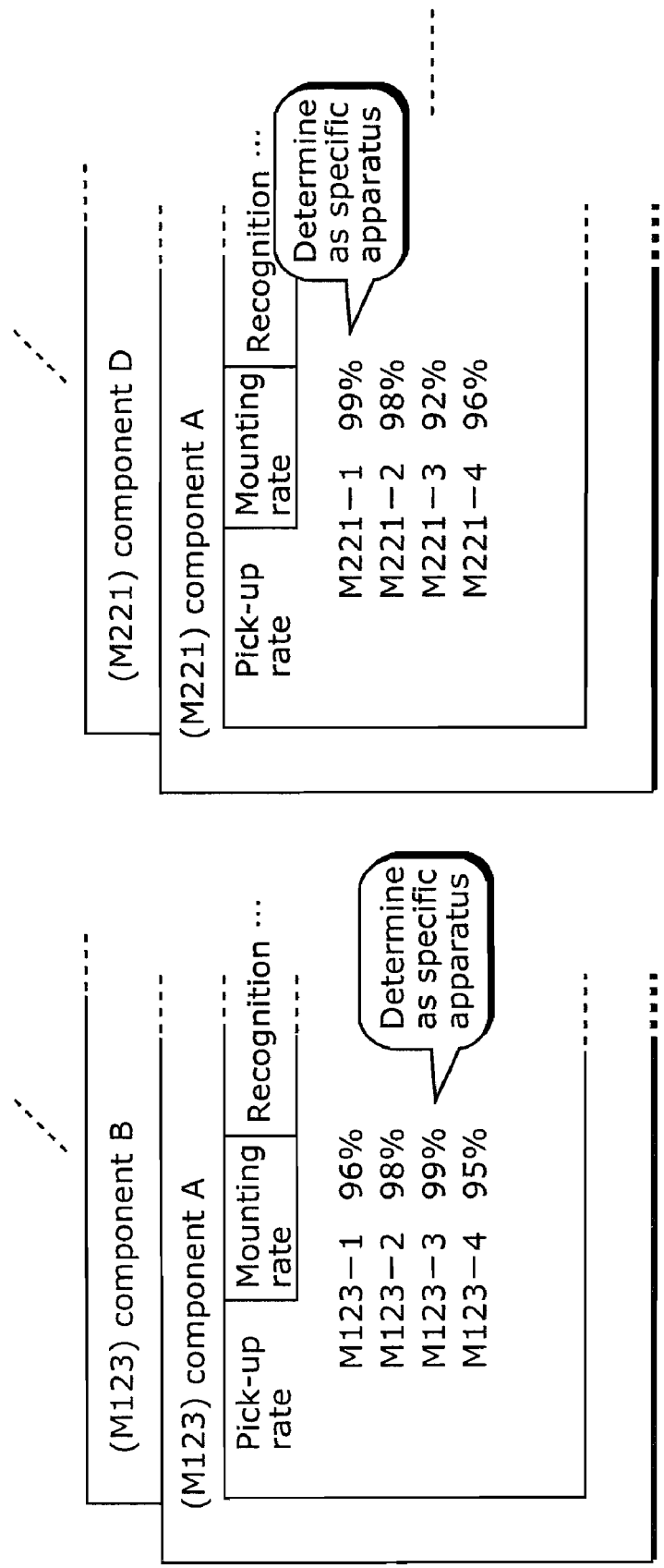
FIG. 23 is a diagram showing examples of task performance information collected by a collecting unit in the second embodiment.

FIG. 23 is a diagram showing examples of pieces of task performance information collected by a collecting unit 15. A determining unit 16 determines specific apparatuses based on the pieces of task performance information collected by the collecting unit 15.

FIG. 23 shows the task performance information of the component mounting apparatuses respectively belonging to the M123 group and M221 group. However, the task performance information of the component mounting apparatuses respectively belonging to the other groups are also collected.

As shown in FIG. 23, when the task performance information such as pick-up rates concerning components A is collected for each group, it is possible to judge which component mounting apparatus provides the highest performance. For example, as for the pick-up rates concerning components A in the M123 group, the M123-3 provides a pick-up rate of 99%, and the rate is the highest performance.

In addition, as for the pick-up rates concerning components A in the M221 group, the M221-1 provides a pick-up rate of 990%, and the rate is the highest performance.

Likewise, the other types of task performance information about each type of components, such as the mounting rates concerning components A and the pick-up rates concerning components B are collected for each model group and for each category group. The determining unit 16 determines the component mounting apparatus which provides the highest performance in view of each of the other types of task performance information about each type of components, is determined as a specific apparatus (S63).

Figure 24:
FIG. 24 is a diagram showing examples of groups of specific apparatuses determined by a determining unit in the second embodiment.

FIG. 24 is a diagram showing examples of groups of specific apparatuses determined by the determining unit 16.

As shown in FIG. 24, a specific apparatus is determined for each type of task performance information such as a pick-up rate and a mounting rate about each type of component.

In the example shown in FIG. 24, in the M123 group, the M123-3 is the specific apparatus in view of the pick-up rates of components A, and the M123-1 is the specific apparatus in view of the pick-up rates of components B. Likewise, the M123-3 is the specific apparatus in view of the mounting rates of components A, and the M123-2 is the specific apparatus in view of the mounting rates of components B.

In addition, plural specific apparatuses are determined for each of the other model group and category group.

The obtaining unit 17 obtains mounting conditions from each specific apparatus determined in this way (S64). More specifically, the obtaining unit 17 obtains the mounting conditions for each specific apparatus to be transmitted from the specific apparatus as a response to the request from the mounting condition determining unit 11. In addition, the types of information to be obtained as mounting conditions are the same as those described in the first embodiment with reference to FIGS. 15 and 16.

For example, the contents of the mounting conditions obtained from the M123-3 which is the specific apparatus in view of the pick-up rates concerning components A are the information respectively identifying the nozzle which the M123-3 uses for picking up components A, the pick-up operation pattern, and the correction value for pick-up.

In addition, the obtaining unit 17 obtains the mounting conditions for the other specific apparatuses determined by the determining unit 16, from the other specific apparatuses. The obtaining unit 17 stores the obtained mounting conditions in the condition storing unit 18.

The communication unit 12 receives the request for mounting conditions to be transmitted from each component mounting apparatus (S65). When the request for the mounting conditions is received by the communication unit 12, the mounting conditions obtained by the obtaining unit 17 is read out from the obtaining condition storing unit 18, and the mounting conditions are transmitted to the component mounting apparatus as a response to the request for the mounting conditions by the communication unit 12 (S66).

In this way, with the communication unit 12 of this embodiment, the functions of receiving the request for mounting conditions and transmitting the mounting conditions are realized.

More specifically, the mounting conditions are transmitted to each component mounting apparatus belonging to the group which corresponds to the mounting conditions. At the time of the transmission, the individual codes for each group stored in the group storing unit 14 are referred to.

For example, the mounting conditions obtained from the specific apparatuses belonging to the M123 group are transmitted as responses to the requests from the component mounting apparatuses other than the specific apparatuses belonging to the M123 group.

Likewise, the mounting conditions obtained from the specific apparatuses belonging to the M221 group are transmitted as responses to the requests from the component mounting apparatuses other than the specific apparatuses belonging to the M221 group.

In this way, the communication unit 12 transmits each of the mounting conditions to the apparatuses in the group to which the specific apparatus from which the mounting condition is obtained belongs.

Each component mounting apparatus mounts components onto boards under the mounting conditions transmitted from the mounting condition determining apparatus 11.

Subsequently, while the manufacturing is keeping on (No in S67), the above operation is repeated. When the manufacturing is completed according to, for example, an instruction made by the operator (Yes in S67), the sequence of processing concerning the settings of the mounting conditions are also completed.

Note that the operations from the collection of the task performance information from the apparatus in the group (S62) to the settings of the mounting conditions (S64) are executed at predetermined timings. For example, the operations are executed for each passage of predetermined time period. The information about the predetermined timings is the information to be stored, for example, in the collecting unit 15.

In addition, these operations may be executed triggered by the reception of the requests for mounting conditions (S65). In other words, as shown in FIG. 22, the mounting condition determining apparatus 11 may determine the specific apparatuses in advance, obtain and store the mounting conditions in advance, and transmit the mounting conditions in response to the requests from the component mounting apparatus. Otherwise, the mounting condition determining apparatus 11 may execute the operations from the collection of the task performance information (S62) to the obtainment of the mounting conditions (S64) on the group to which the component mounting apparatus belongs triggered by the reception of the requests from the component mounting apparatuses and transmit the obtained mounting conditions to the component mounting apparatuses (S66).

In the case of causing the mounting condition determining apparatus 11 to obtain the mounting conditions in advance and store the mounting conditions in the obtaining condition storing unit 18, for example, it is possible to transmit the mounting conditions for the specific apparatuses in response to the requests from the other component mounting apparatuses even in the case where the component mounting apparatuses as the specific apparatuses are in a power-off state.

In addition, in the case where the mounting condition determining apparatus 11 determines specific apparatuses triggered by the reception of requests for mounting conditions, the specific apparatuses are determined based on the performances of the respective component mounting apparatuses at the time of the reception of the requests. Accordingly, the performances such as pick-up rates in each component mounting apparatus reflect, for example, the atmospheric temperature, pressure, humidity and the like at that time. For this reason, each component mounting apparatus can obtain the mounting conditions which are suitable for the environment at that time and which can increase the productivity via the mounting condition determining apparatus 11.

In addition, each component mounting apparatus transmits the requests for the mounting conditions to the mounting condition determining apparatus 11 at predetermined timings. The predetermined timings are, for example, the information set by the manager of the manufacturing system 2 and stored in the communication unit 26.

The communication unit 26 has an internal clock or timer, and transmits the requests for the mounting conditions to the mounting condition determining apparatus 11 at the timing indicated by the information.

In addition, the requests for the mounting conditions may be transmitted, for example, when the power of the component mounting apparatus 30 is turned on instead of being transmitted for each passage of predetermined time period.

In addition, for example, each group of component mounting apparatuses or each component mounting apparatus may adjust the timings of the transmission of the requests for the mounting conditions on the time axis, for example, in order to diverse the communication load on LAN 5. In addition, the component mounting apparatus may detect a change in the productivity of the apparatus itself, for example, detect that the pick-up rate concerning components A falls below a predetermined value, and execute the sequence of operations.

To sum up, it is only necessary for the component mounting apparatus to be capable of voluntarily obtaining a mounting condition irrespective of a trigger for the obtainment of the mounting conditions.

Figure 25:
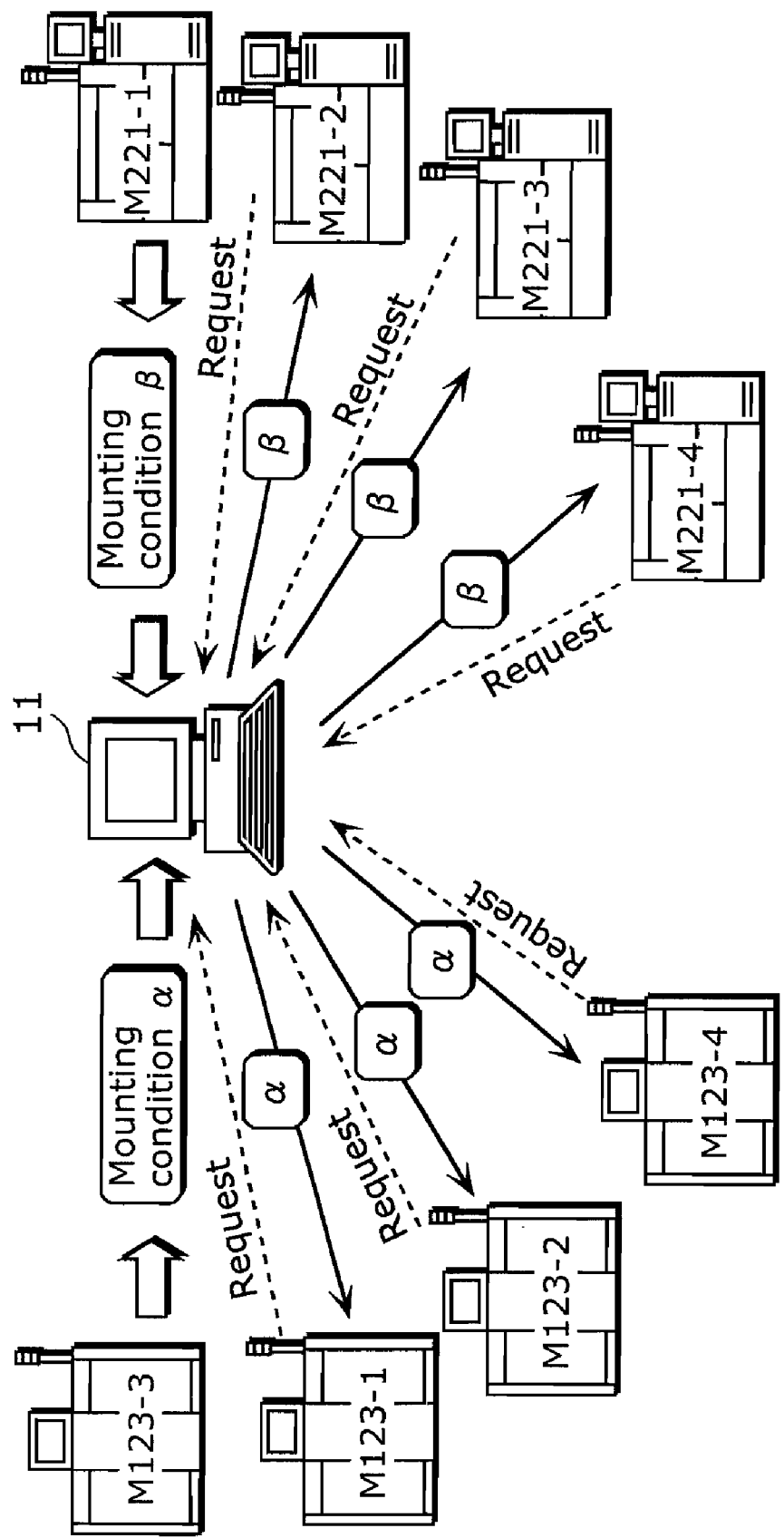
FIG. 25 is a schematic diagram showing how each mounting condition determining apparatus in the second embodiment transmits mounting conditions suitable for the respective groups of component mounting apparatuses to each of the apparatuses in each group.

FIG. 25 is a schematic diagram showing how the mounting condition determining apparatus 11 in the second embodiment transmits the mounting conditions optimum for the respective apparatuses belonging to the plural groups.

As shown in FIG. 25, the mounting condition determining apparatus 11 in this embodiment is capable of optimizing the mounting conditions for the plural groups.

For example, when the mounting condition determining apparatus 11 determines the M123-3 as a specific apparatus which provides the highest pick-up rate concerning components A in the M123 group, it obtains the mounting condition α associated with the pick-up rate from the M123-3 as shown in FIG. 25.

Further, when the mounting condition determining apparatus 11 receives the requests for the mounting conditions from the apparatuses other than the specific apparatuses in the M123 group; that is, the apparatuses M123-1, M123-2, and M123-4, it transmits the obtained mounting condition α to the three component mounting apparatuses as responses to the requests.

Each component mounting apparatus sets the mounting condition α obtained from the mounting condition determining apparatus 11.

In this way, the mounting conditions associated with the pick-up rate concerning components A of the respective component mounting apparatuses belonging to the M123 group are changed into the commonly optimum mounting conditions. For example, the types of nozzles to be used for picking up and mounting components A are changed to the nozzle type optimum for picking Lip components A.

In addition, for example, when the mounting condition determining apparatus 11 determines the M221-1 as a specific apparatus which provides the lowest recognition error rate concerning components D in the M221 group, it obtains the mounting condition β associated with the recognition error rate from M221-1 as shown in FIG. 25.

Further, when the mounting condition determining apparatus 11 receives the requests for the mounting conditions from the apparatuses other than the specific apparatuses in the M123 group; that is, the apparatuses M221-2, M221-3, and M221-4, it transmits the obtained mounting condition β to the three component mounting apparatuses as responses to the requests.

Each component mounting apparatus sets the mounting condition β obtained from the mounting condition determining apparatus 11.

In this way, the mounting conditions associated with the recognition error rate concerning components D of each of the component mounting apparatuses belonging to the M221 group are changed into the commonly optimum mounting conditions. For example, the amounts of light projected at the time when a camera recognizes components D are changed to the optimum amount of light.

The mounting condition determining apparatus 11 finds out the optimum mounting conditions in each of the other groups by executing the same operations on each group and transmits the optimum mounting conditions in response to the requests from the component mounting apparatuses belonging to each group.

In addition, the mounting condition determining apparatus 11 finds out the optimum mounting conditions for increasing or improving the mounting conditions associated with the other types of task performance information, for example, the pick-Lip rates concerning components A, the mounting rates concerning components B, the mounting accuracies concerning a nozzle with the nozzle number of 1 and the like, and transmits the optimum mounting conditions in response to the requests from the component mounting apparatuses in each group.

In this way, the mounting condition determining apparatus 11 of this embodiment is capable of transmitting the optimum mounting conditions to the apparatuses in each of the plural groups.

In this way, the mounting conditions are changed to the mounting conditions commonly optimum for each group, and thus the productivity of each of the apparatuses in the group are increased.

In addition, each component mounting apparatus is capable of obtaining the mounting conditions which may increase the productivity of the apparatus itself without a collecting unit 15 and a determining unit 16 for optimizing mounting conditions, and therefore, there is an economical advantage. In addition, since each component mounting apparatus voluntarily obtains the mounting conditions, it can efficiently optimize the mounting conditions.

In addition, when the manager of the manufacturing system 2 changes or modifies the functions for optimizing the mounting conditions for each component mounting apparatus, the manager can efficiently execute the modification and the like because it is only necessary for the manager to give an instruction to only a single mounting condition determining apparatus 11. In addition, each component mounting apparatus does not need to directly exchange information with the other apparatuses, and thus, for example, there is no possibility that an excessive communication load is placed on LAN 5 due to the communication between the component mounting apparatuses.

As for each component mounting apparatus capable of communicating with the mounting condition determining apparatus 11 in this embodiment, note that they have common items and the like which can be set as mounting conditions as described above, irrespective of whether or not they are products made by the same manufacturer.

In addition, even when the items, the names of the items, and the like which can be set as mounting conditions are different, in the case where the mounting condition determining apparatus 11 or each component mounting apparatus has conversion information for the items, the names of the items and the like, the differences in the names and the like between the manufacturers can be absorbed.

In this case, the mounting condition determining apparatus 11 in this embodiment may not identify the group to which each component mounting apparatus belongs, likewise the mounting condition determining apparatus 11 in the first embodiment.

In addition, it is assumed in this embodiment that the mounting condition determining apparatus 11 determines, as a specific apparatus, the component mounting apparatus which provides the highest performance in each type of task performance information from among the plural component mounting apparatuses.

However, the mounting condition determining apparatus 11 may determine the component mounting apparatuses with mounting conditions to be obtained by comparing the performances of two component mounting apparatuses.

For example, pieces of task performance information such as the pick-up rates concerning components A of the apparatuses M123-1 and M123-2 are collected and compared with each other. When the comparison shows that the pick-up rate of the M123-2 is the higher, the mounting conditions associated with the pick-up rate are obtained from the M123-2.

Subsequently, when the mounting condition determining apparatus 11 receives a request for the mounting conditions from M123-1, it transmits the mounting conditions for the apparatuses M123-2 to M123-1 which made the request as response to the request. In addition, in the case where the comparison shows that the pick-up rate of the M123-1 is the higher, the mounting conditions associated with the pick-up rate are obtained from the M123-1, and the mounting conditions for the M123-1 are transmitted to the M123-2.

Note that the mounting condition determining apparatus 11 may collect these pieces of task performance information and obtain the mounting conditions from component mounting apparatus triggered by receiving the request for the mounting conditions from the component mounting apparatus.

In other words, it is meaningful for a component mounting apparatus to obtain the mounting condition associated with the performance from other apparatus providing a performance associated with the manufacturing operation higher than that of the apparatus itself in view of increasing the productivity of the apparatus itself.

In this way, likewise the mounting condition determining apparatus 11 in the first embodiment, the mounting condition determining apparatus 11 in this embodiment may determine the mounting conditions to be set for a single component mounting apparatus by comparing the performances such as pick-up rates of the two component mounting apparatuses. Even in this case, the productivity of the component mounting apparatus for which the mounting conditions are set is increased.

In addition, it is assumed that the manufacturing system 2 in this embodiment includes plural component mounting apparatuses and a single mounting condition determining apparatus 11 which are connected to LAN 5, and is configured to enable each component mounting apparatus to voluntarily obtain the mounting conditions which may increase the productivity of the apparatus itself from the mounting condition determining apparatus 11.

In the case where a manufacturing system is configured with plural component mounting apparatuses and a single apparatus capable of receiving the mounting conditions for each component mounting apparatus, like the manufacturing system 2, each component mounting apparatus may have functional structures other than the component mounting apparatus 30 in the second embodiment.

For example, it is possible to execute the mounting condition determining method of the present invention in a manufacturing system configured with plural component mounting apparatuses each having the same functional structures as those of the component mounting apparatus 10 in the first embodiment and an apparatus having a function of communicating with each component mounting apparatus and storing information (hereinafter, referred to as "managing apparatus").

For example, each component mounting apparatus transmits the mounting conditions and individual code of the apparatus itself to the managing apparatus in this manufacturing system. The managing apparatus stores the respective mounting conditions and the individual code associated with each other.

The component mounting apparatus collects the task performance information from the other component mounting apparatuses, and determines a specific apparatus. Further, the component mounting apparatus transmits the requests for asking the managing apparatus to transmit the mounting condition including the individual code of the specific apparatus. The managing apparatus transmits the mounting condition of the specific apparatus asked for by the requests to the component mounting apparatuses which made the respective requests.

The mounting condition determining method of the present invention can be executed even in the case where each component mounting apparatus and the managing apparatus executes these operations in this way.

In addition, the managing apparatus may collect the task performance information of each component mounting apparatus, and each component mounting apparatus may receive the task performance information of each component mounting apparatus from the managing apparatus and determine specific apparatus.

In this way, the determination of specific apparatus, more specifically, the processing concerning the determination of mounting conditions which may increase the productivity of each component mounting apparatus may be intensively executed by a single apparatus likewise the processing in the first embodiment, or may be locally executed by the respective component mounting apparatuses.

In addition, likewise the mounting condition determining apparatus 11 in the first embodiment, the mounting condition determining apparatus 11 in this embodiment may obtain the identification information and task performance information of each component mounting apparatus via a recording medium such as a CD-ROM or the like. By doing so, it becomes possible to, for example, reduce a communication load on LAN 5.

In addition, likewise the case of the first embodiment, the contents of the mounting conditions and the types of the task performance information to be obtained by the obtaining unit 17 may differ from those shown in FIG. 15 and the like.

In addition, there are no restrictions on whether LAN 5 in this embodiment is wired or wireless and on the communication protocol in use.

In addition, plural component mounting apparatuses may be handled as a single apparatus, and a line of apparatuses may be handled as a single apparatus.

In other words, the function, of the mounting condition determining apparatus 11 in this embodiment, for optimizing the mounting conditions for the apparatuses such as the plural component mounting apparatuses does not depend on the contents of mounting conditions, the types of task performance information, a communication format, a communication protocol, the unit of devices handled as an apparatus, and thus there is no possibility that the function is impaired.

Third Embodiment

It is assumed that in the first and second embodiments that each component mounting apparatus voluntarily obtains the mounting conditions from the specific apparatuses. However, each component mounting apparatus may be given the mounting conditions by the specific apparatuses.

For example, in the manufacturing system 2 (refer to FIG. 18) of the second embodiment, the mounting condition determining apparatus 11 may voluntarily transmit the mounting conditions obtained from the specific apparatuses to each component mounting apparatus without receiving any request from each component mounting apparatus.

In the case where each component mounting apparatus passively obtains the mounting conditions for the specific apparatuses in this way, it is possible to efficiently increase the productivity of the component mounting apparatus.

Here, a description is given of an embodiment as a third embodiment where each component mounting apparatus passively obtains the mounting conditions for the specific apparatuses.

Note that the hardware configuration of the manufacturing system in the third embodiment and the functional structures of the component mounting apparatus 30 and mounting condition determining apparatus 11 are the same as those in the second embodiment (refer to FIGS. 18 and 19).

In addition, it is assumed that the mounting condition determining apparatus 11 in the third embodiment classifies the respective component mounting apparatuses into groups according to the procedure shown in FIG. 20, and stores the group tables shown in FIG. 21 in the group storing unit 14.

Figure 26:
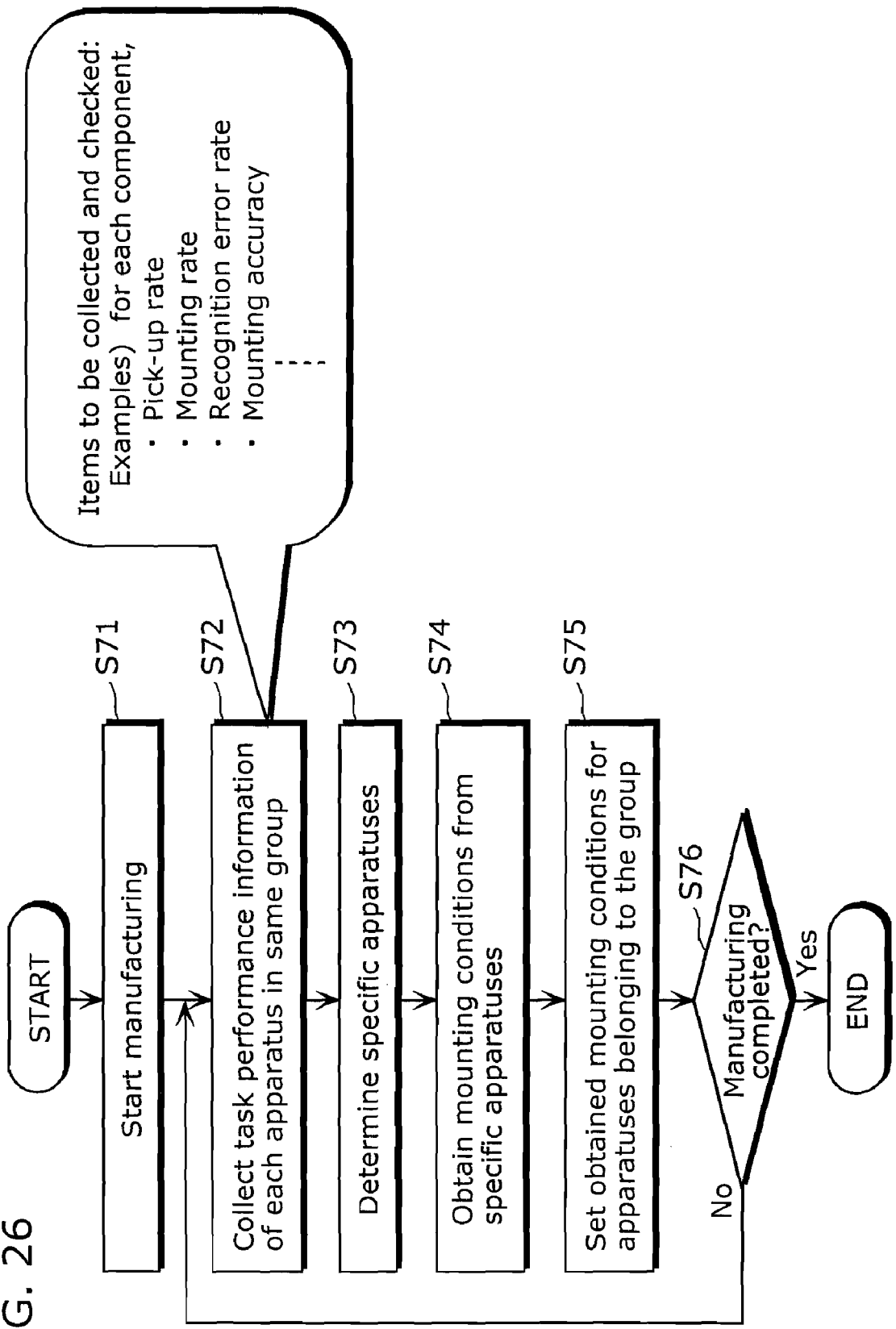
FIG. 26 is a flowchart indicating the operation flow in the case where each mounting condition determining apparatus in a third embodiment obtains mounting conditions from the specific apparatuses and sets the mounting conditions for each component mounting apparatus.

FIG. 26 is a flowchart indicating the operation flow in the case where the mounting condition determining apparatus 11 in the third embodiment obtains the mounting conditions from the specific apparatuses and sets the mounting conditions in each component mounting apparatus.

The operations starting with the start of manufacturing component-mounted boards (S71) executed by each component mounting apparatus and ending with the obtainment of the mounting conditions from the specific apparatuses executed by the mounting condition determining apparatus 11 (S74) are the same as the operation flow (S61 to S64 in FIG. 22) in the second embodiment.

In other words, the determining unit 16 determines the specific apparatuses for each group shown in FIG. 24. In addition, the obtaining unit 17 obtains the mounting conditions from the respective specific apparatuses. The types of information obtained as mounting conditions are the same as those described in the first embodiment with reference to FIGS. 15 to 16.

The various types of mounting conditions obtained by the obtaining unit 17 are voluntarily transmitted by the communication unit 12 to the apparatuses belonging to the group corresponding to the mounting conditions (S75). At the time of the transmission, the individual codes of the apparatuses in each group stored in the group storing unit 14 are referred to.

For example, the mounting conditions obtained from the specific apparatuses belonging to the M123 group are transmitted to the component mounting apparatuses belonging to the M123 group other than the specific apparatuses.

Likewise, the mounting conditions obtained from the specific apparatuses belonging to the M221 group are transmitted to the component mounting apparatuses belonging to the M221 group other than the specific apparatuses.

In this way, the communication unit 12 transmits the mounting conditions to the apparatuses belonging to the corresponding group, depending on the group including the specific apparatus from which the mounting conditions is obtained.

Each component mounting apparatus mounts components onto boards under the mounting conditions transmitted from the mounting condition determining apparatus 11.

Subsequently, while manufacturing is keeping on (No in S76), the above operations are repeated. When the manufacturing is completed according to, for example, an instruction made by the operator (Yes in S76) or the like, the sequence of processing concerning the settings of mounting conditions are also completed.

Note that the operations from the collection of the task performance information from the apparatuses in the group (S72) to the settings of the mounting conditions (S75) are executed at predetermined timings. For example, the information about the predetermined timings is stored in the collecting unit 15.

Note that the predetermined timings may be other timings likewise the case of the first embodiment. For example, the sequence of operations may be executed only at the time when the power of the mounting condition determining apparatus 11 is on. In addition, the timings of executing the sequence of operations for each group may be adjusted by shifting the timings on the time axis, for example, in order to diverse the communication load of LAN 5. Additionally, the sequence of operations may be executed according to explicit instructions by the operator.

In addition, for example, the operations from the collection of the task performance information (S72) to the obtainment of the mounting conditions (S75) may be executed for each passage of predetermined time period, and the settings of the mounting conditions (S75) may be executed by each component mounting apparatus during a period in which the mounting conditions can be set or modified.

In this case, for example, the mounting condition determining apparatus 11 detects an interruption of the manufacturing operations of the respective component mounting apparatuses by communicating with each component mounting apparatus and transmits the mounting conditions to the component mounting apparatus which is not executing a manufacturing operation.

Otherwise, the mounting condition determining apparatus 11 periodically transmits mounting conditions to each component mounting apparatus without detecting any interruption in this way. Each component mounting apparatus which received the mounting conditions stores in advance the mounting conditions, for example, in the condition storing unit 21, and sets the mounting conditions in the apparatus itself during the period in which the mounting conditions can be set or modified.

Note that the types of mounting conditions such as the moving speed of a head which can be set or modified without any interruption of manufacturing operations may be arbitrarily set or modified.

In this way, the mounting condition determining apparatus 11 transmits mounting conditions to each component mounting apparatus during the period in which the settings or modification of the mounting conditions do not greatly affect the continuation of manufacturing operations.

Otherwise, even in the case where mounting conditions are transmitted at a time which is not included in the period, each component mounting apparatus stores the mounting conditions received from the mounting condition determining apparatus 11 in advance and sets the mounting conditions for the apparatus itself during the period in which the mounting conditions can be set.

In any of the cases, when the mounting condition determining apparatus 11 transmits mounting conditions to each component mounting apparatus, the mounting conditions are set for each component mounting apparatus. In other words, the mounting conditions which may increase the productivity of each component mounting apparatus are set for the component mounting apparatus.

Figure 27:
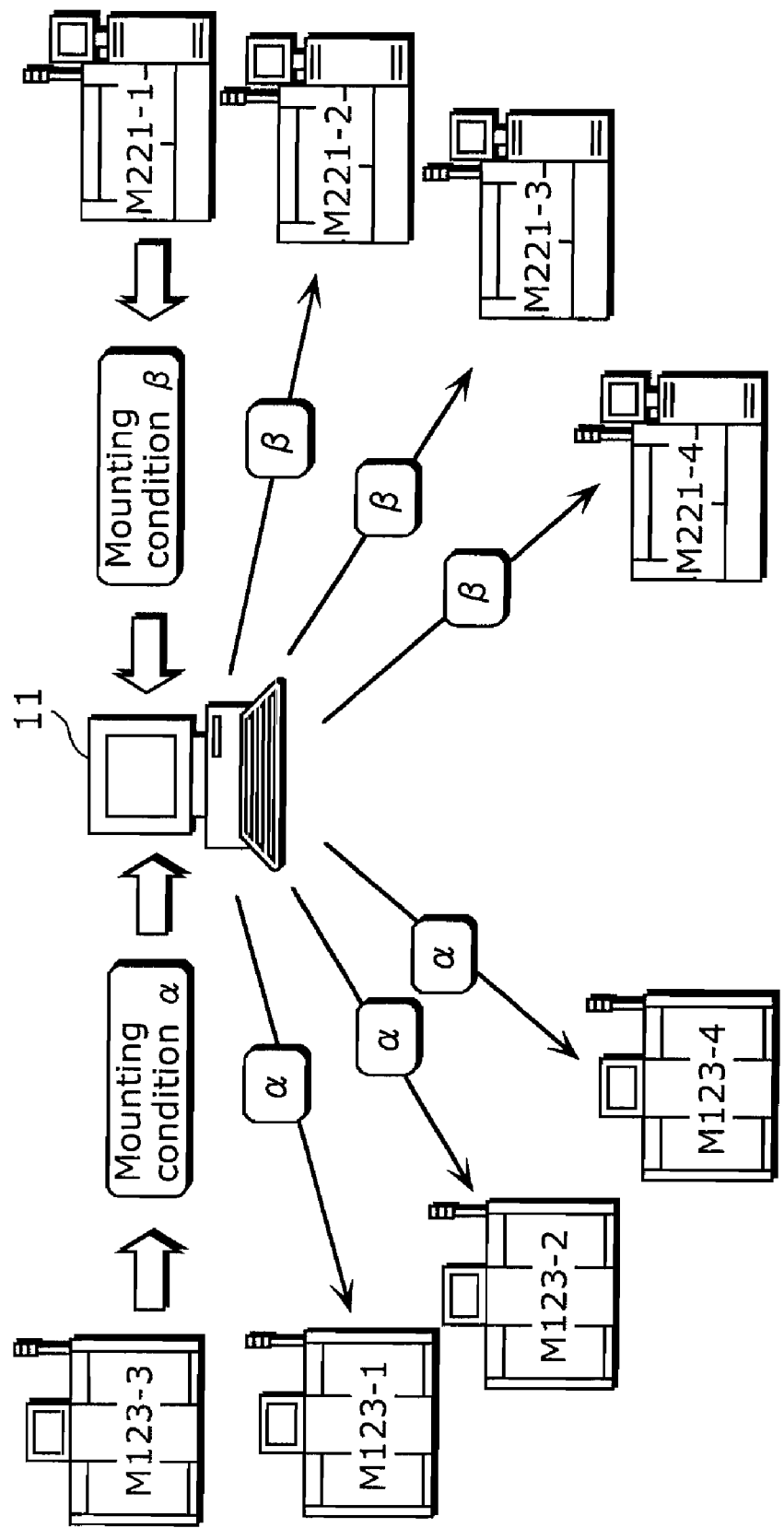
FIG. 27 is a schematic diagram showing how each mounting condition determining apparatus in the third embodiment transmits mounting conditions suitable for the respective groups to the component mounting apparatuses in the respective groups.

FIG. 27 is a schematic diagram showing how the mounting condition determining apparatus 11 in the third embodiment transmits the mounting conditions optimum for the respective apparatuses in the plural groups to the groups.

As shown in FIG. 27, likewise the mounting condition determining apparatus 11 in the second embodiment described with reference to FIG. 25, the mounting condition determining apparatus 11 of this embodiment is capable of optimizing mounting conditions for plural groups of apparatuses.

In other words, for example, when the M123-3 is determined as the specific apparatus which provides the highest pick-up rate concerning components A in the M123 group, the mounting condition determining apparatus 11 obtains the mounting condition a associated with the pick-up rate from the M123-3, and transmits the mounting condition α to the apparatuses M123-1, M123-2, and M123-4 belonging to the M123 group.

In this way, the mounting conditions associated with the pick-up rates concerning components A in all of the component mounting apparatuses belonging to the M123 group are changed to the commonly optimum mounting conditions.

In addition, for example, when the mounting condition determining apparatus 11 determines the M221-1 as the specific apparatus which provides the lowest recognition error rate concerning components D in the M221 group, it obtains the mounting condition β associated with the recognition error rate from the M221-1, and transmits the mounting condition β to the apparatuses M221-2, M221-3, and M221-4 belonging to the M221 group.

In this way, the mounting conditions associated with the recognition error rates concerning components D in all of the component mounting apparatuses belonging to the M221 group are changed to the commonly optimum mounting conditions.

Here, unlike the case of the second embodiment, the mounting condition determining apparatus 11 in this embodiment transmits mounting conditions without receiving any request from each component mounting apparatus.

In other words, each component mounting apparatus does not need to have a function for requesting the mounting condition determining apparatus 11 to transmit mounting conditions.

In addition, in the case where each component mounting apparatus cannot immediately set the mounting conditions received from the mounting condition determining apparatus 11, for example, it may store the mounting conditions in, for example, the condition storing unit 21 in advance, read out the mounting conditions from the condition storing unit 21 during the period in which the mounting conditions can be set, and set the mounting conditions for the apparatus itself, as described above.

In this way, the mounting condition determining apparatus 11 in this embodiment is capable of setting the optimum mounting conditions suitable for each of the plural groups of apparatuses by transmitting the mounting conditions to the respective apparatuses in each group.

In this way, the mounting conditions are changed to the commonly optimum mounting conditions in each group of apparatuses, and thus the productivities of the respective apparatuses in each group are increased.

In addition, likewise the mounting condition determining apparatus 11 in the second embodiment, the mounting condition determining apparatus 11 in this embodiment exerts the function of optimizing the mounting conditions for the apparatuses such as plural component mounting apparatuses, irrespective of the contents of mounting conditions, the types of task performance information, a communication format, a communication protocol, the unit of devices handled as an apparatus.

First Supplemental Point for First to Third Embodiments

It is assumed in the first to third embodiments that the apparatuses which provide performances associated with manufacturing operations satisfy predetermined standards as specific apparatuses in the determination of specific apparatuses.

For example, in the case of focusing on "pick-up rates concerning components A" as a performance associated with a manufacturing operation, the component mounting apparatus which provides the highest pick-up rate concerning components A, which is a performance obtained as a result of a manufacturing operation, in a group is determined as a specific apparatus.

However, "a performance associated with a manufacturing operation" is not limited to a performance obtained as a result of a manufacturing operation, and may be a performance estimated or determined based on other factors.

It is conceivable that performances of the respective apparatuses are determined according to, for example, skills of the operator who is in charge of executing various settings of mounting conditions and operating each apparatus.

For example, in the case of mounting components having a complex structure onto boards, an ordinary operator cannot easily determine various mounting conditions suitable for mounting such components onto boards based on the dimensions of the components. However, an operator who is skilful in operating apparatuses is capable of determining suitable various types of mounting conditions and setting the mounting conditions for each apparatus.

In other words, it is assumed that the apparatuses which are operating under the mounting conditions set by a skilled operator are manufacturing component-mounted boards under the suitable mounting conditions.

Accordingly, it is conceivable to select the apparatuses operating under the mounting conditions set by a skilled operator as the specific apparatuses providing performances associated with manufacturing operations which satisfy predetermined standards.

In this case, for example, it is only necessary for the mounting condition determining apparatus 11 to store the skill levels of the respective operators who set the mounting conditions for the respective apparatuses.

Figures 28, 29:
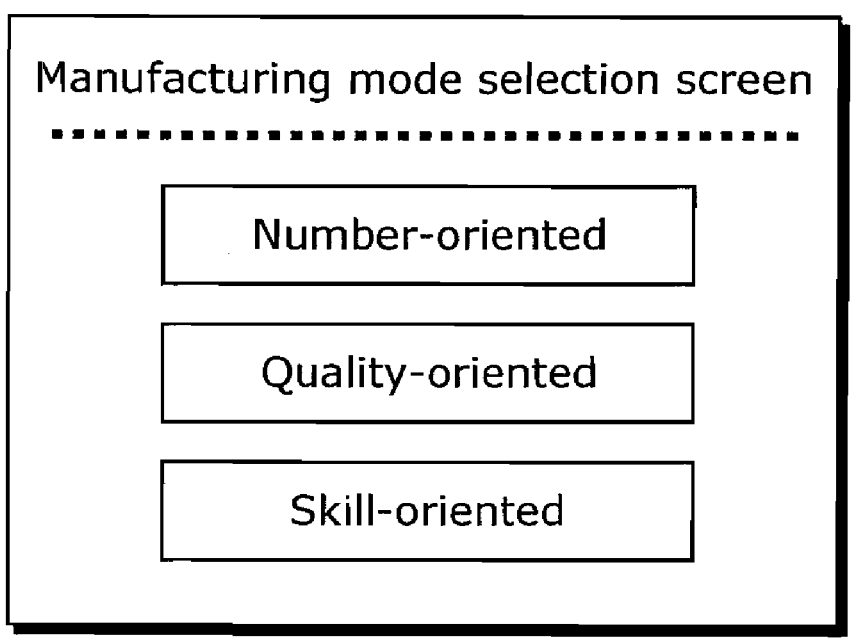
FIG. 28 is a diagram showing an example of a data structure of a skill data table in which the skill levels of operators are associated one-to-one with the individual codes of apparatuses.
FIG. 29 is a diagram showing an example of a manufacturing mode selection screen.

FIG. 28 is a diagram showing an example of the data structure of a skill data table in which the skill levels of operators are associated one-to-one with the individual codes of the apparatuses.

The skill data table contains pieces of information about the skill level of an operator who set the mounting conditions for each apparatus. In addition, pieces of such information are gathered in skill data tables on a per group basis, and each of the tables contains, as data items, the individual codes of apparatuses and the skill levels of the operators who set the mounting conditions for the apparatuses.

An individual code indicates identification information for identifying a component mounting apparatus as described with reference to FIG. 1 and the like. A skill level is represented by a value indicating the degree of the skill of an operator. The value of "1" indicates the highest skill. The greater the value, the lower the skill is.

The skill data table shown in FIG. 28 shows the skill levels of the respective operators who set mounting conditions for the respective component mounting apparatuses in the M123 group.

This skill data table shows that the mounting conditions for the M123-3 have been set by the operator having the highest skill.

Accordingly, the M123-3 is considered to be the apparatus which provides the highest performances associated with manufacturing operations.

Here is a case where the mounting condition determining apparatus 11 incorporated in the M123-1 in the first embodiment uses the skill data table shown as FIG. 28.

In this case, for example, the skill data table is stored in the group storing unit 14, and the determining unit 16 determines the M123-3 associated with the highest skill level as a specific apparatus with reference to the skill data table.

Further, the obtaining unit 17 obtains various mounting conditions from the M123-3, and the mounting conditions are set for the M123-3 which is the apparatus itself.

In addition, here is a case where the mounting condition determining apparatus 11 in the second embodiment uses the skill data table shown as FIG. 28. In this case, for example, the determining unit 16 determines the M123-3 associated with the highest skill level as a specific apparatus with reference to the skill data table stored in the group storing unit 14.

Further, the obtaining unit 17 obtains various types of mounting conditions from the M123-3, and transmits the mounting conditions in response to the requests from the other component mounting apparatuses in the M123 group. In this way, the mounting conditions obtained from the M123-3 are set for the other component mounting apparatuses.

In addition, also in the case where the mounting condition determining apparatus 11 in the third embodiment uses the skill data table shown as FIG. 28, the mounting conditions obtained from the M123-3 are also set for the other component mounting conditions in the M123 group.

In this way, the mounting condition determining apparatus 11 is capable of determining specific apparatuses using the information about the skill levels of the respective operators who set the mounting conditions for the respective apparatuses.

In this way, the mounting conditions set by a skillful operator are obtained and set for each apparatus. In other words, each apparatus is given the mounting conditions which may increase the productivity of the apparatus itself.

Here, each component mounting apparatus in the manufacturing system in the first embodiment includes a mounting condition determining apparatus 11. Accordingly, it is not required that all the mounting condition determining apparatuses 11 store skill data tables in advance.

For example, a single mounting condition determining apparatus 11 may store skill data tables in advance, and the other mounting condition determining apparatuses 11 may obtain the skill data tables through communication and use the tables.

In addition, the mounting condition determining apparatus 11 may receive the information indicating the skill levels of the respective operators from each component mounting apparatus when determining specific apparatuses, instead of storing the skill data tables in advance.

In addition, the mounting condition determining apparatus 11 may determine a specific apparatus considering not simply the skill levels of the respective operators but also other conditions. For example, the mounting condition determining apparatus 11 may determine, as a specific apparatus, the component mounting apparatus having mounting conditions set by the operator whose skill level is the highest from among the component mounting apparatuses which provide a pick-up rate of 98% or more.

Second Supplemental Point for First to Third Embodiments

A standard employed as a predetermined standard in determining specific apparatuses in the first to third embodiments is the standard that the performances associated with manufacturing operations are higher than the performances of the apparatuses which receive the mounting conditions.

In other words, the productivities of the apparatuses other than the specific apparatus are increased by determining specific apparatus based on the standard.

Here, the concept of "an increase in productivity" changes in reality depending on manufacturing plans and the like at different times. The concept may be considered as causing an apparatus to manufacture a greater number of products at higher speed compared to the current status. Otherwise, the concept may be considered as causing the apparatus to manufacture products with quality higher than those of products which are currently being manufactured by reducing the manufacturing speed.

Accordingly, a specific apparatus may be determined focusing on throughput which is the number of boards manufactured per a unit time as a performance associated with manufacturing operation and employing, as a predetermined standard, the requirement that a throughput is higher or lower than a predetermined value.

For example, here is a case where the M123-2 is the component mounting apparatus which provides the highest throughput in the M123 group in the second embodiment. In this case, the mounting condition determining apparatus 11 collects task performance information including a throughput value from each component mounting apparatus belonging to the M123 group, and determines the M123-2 which provides the highest throughput as a specific apparatus.

Further, the mounting condition determining apparatus 11 obtains various mounting conditions from the M123-2, the specific apparatus. Subsequently, the mounting condition determining apparatus 11 transmits the obtained various types of mounting conditions to the component mounting apparatuses other than the M123-2 belonging to the M123 group.

In this way, it is possible to increase the throughputs of the component mounting apparatuses other than the M123-2 belonging to the M123 group. Accordingly, the manufacturing mode like this is effective when it is desired that component-mounted boards are manufactured in a number-oriented way.

In addition, here is a case where the M123-2 is the component mounting apparatus which provides the lowest throughput in the M123 group. In this case, it can be said that the M123-2 is manufacturing component-mounted boards more slowly than the other apparatuses do. Put another way, the M123-2 is manufacturing component-mounted boards having higher quality, for example, in a view of mounting accuracy, compared to the quality of component-mounted boards manufactured by the other component mounting apparatuses.

In other words, it can be said that a component mounting apparatus which provides a low throughput is an excellent component mounting apparatus in view of product quality.

For this reason, the mounting condition determining apparatus 11 obtains various types of mounting conditions such as a head speed from the M123-2, and transmits the mounting conditions to the component mounting apparatuses other than the M123-2 belonging to the M123 group.

In this way, the component mounting apparatuses other than the M123-2 belonging to the M123 group are capable of manufacturing higher-quality component-mounted boards, while the throughputs of the apparatuses themselves decrease. Accordingly, the manufacturing mode like this is effective when it is desired that component-mounted boards are manufactured in a quality-oriented way.

Note that the mounting condition determining apparatus 11 may determine a specific apparatus considering not simply the values of the throughputs of the respective component mounting apparatuses but also other conditions. For example, the mounting condition determining apparatus 11 may determine, as a specific apparatus, the component mounting apparatus which provides the highest or lowest throughput among the component mounting apparatuses which provide a pick-up rate of 98% or more.

In addition, the operators of the respective component mounting apparatuses or the manger of the manufacturing system may be caused to select one of the number-oriented way and the quality-oriented way as a manufacturing mode. Further, the operator's skill-oriented way described in the first supplemental point may be added as an option in selecting a manufacturing mode.

In this case, for example, a manufacturing mode selection screen as shown as FIG. 29 is displayed on the display unit of the mounting condition determining apparatus 11 in the second embodiment.

FIG. 29 is a diagram showing an example of a manufacturing mode selection screen.

When the manager of the manufacturing system 2 would like to manufacture a greater number of component-mounted boards in the manufacturing system 2, the manager selects "Number-oriented" on the manufacturing mode selection screen. On the other hand, when the manager of the manufacturing system 2 would like to manufacture high-quality component-mounted boards in the manufacturing system 2, the manager selects "Quality-oriented" on the manufacturing mode selection screen.

Further, when the manager of the manufacturing system 2 would like to change the mounting conditions for each apparatus to the mounting conditions determined by a skillful operator, the manager selects "Skill-oriented" on the manufacturing mode selection screen.

The mounting condition determining apparatus 11 executes the above-described operations according to the manufacturing mode selected by the manager.

In this way, with the employed manufacturing mode selection screen, the manager can easily modify the manufacturing mode considering the manufacturing status and the delivery date of the component-mounted boards, and the like.

Third Supplemental Point for First to Third Embodiments

It is assumed in the first to third embodiments that the mounting conditions for the specific apparatuses obtained by each mounting condition determining apparatus 11 are set, as they are, for each component mounting apparatus other than the specific apparatuses in a group.

However, the mounting conditions for the specific apparatuses may not be set, as they are, for each component mounting apparatus. The mounting conditions for the specific apparatuses may be converted for the other component mounting apparatuses considering the differences in functions and the like between the specific apparatuses and the other component mounting apparatuses and be set for the apparatuses.

For example, in the case where the model of a component mounting apparatus is a succeeding model of a specific apparatus in the same group, the component mounting apparatus has a structure similar to that of the specific apparatus, and thus, the component mounting apparatus is considered to have functions higher than those of the specific apparatus.

For this reason, the mounting condition determining apparatus 11 is caused to, for example, store a conversion table for absorbing the differences in functions. Further, the mounting condition determining apparatus 11 is caused to convert the mounting conditions obtained from the specific apparatus with reference to the conversion table and to transmit the mounting conditions to the component mounting apparatus. In this way, it is possible to give the component mounting apparatus the more suitable mounting conditions.

Figures 30, 31:
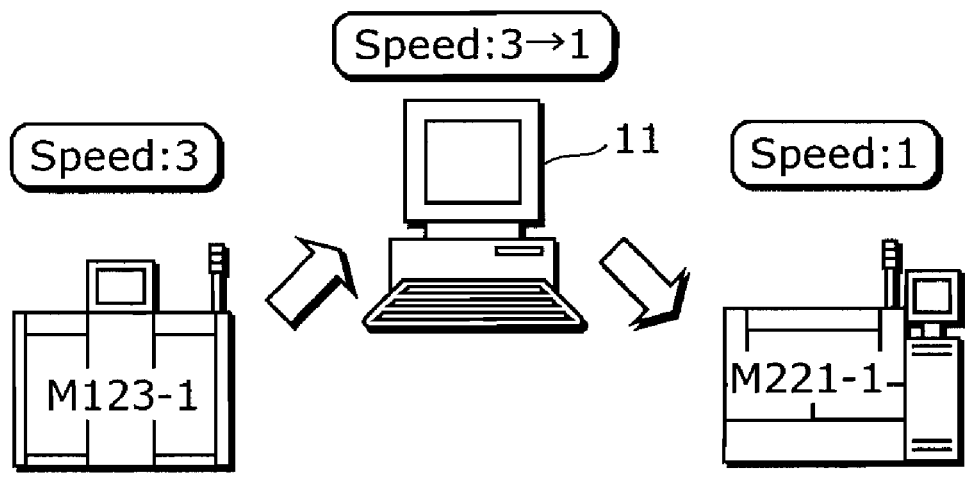
FIG. 30 is a diagram showing an example of a data structure of a conversion table for converting mounting conditions.
FIG. 31 is a schematic diagram showing how a mounting condition is converted to another mounting condition with reference to the conversion table shown as FIG. 30.

FIG. 30 is a diagram showing an example of the data structure of a conversion table for converting mounting conditions.

The conversion table is an example of information indicating the association between the values of the mounting conditions set for the specific apparatus and the values of the mounting conditions set for each apparatus other than the specific apparatus.

The conversion table shown in FIG. 30 specifically shows the association between the speeds of the heads of the respective apparatuses belonging to the M groups.

Note that the speed of each head is represented by a variable number of "1", "2" or "3". Here, "1" indicates the highest speed, and the speed becomes slower as the variable number increases. Additionally, the speed of each head is stored, for example, in the group storing unit 14.

In addition, the conversion table is used in the case where the M221 is a succeeding model of the M123. According to this model, for example, "3" which is the head speed of the M123 corresponds to "1" which is the head speed of the M221.

This means that, since the M221 has functions higher than those of the M123, the M221 is capable of manufacturing the component-mounted boards, which are being manufactured by the M123 at a head speed of "3", at a higher head speed of "1".

FIG. 31 is a schematic diagram showing how a mounting condition is converted to another mounting condition with reference to the conversion table shown in FIG. 30.

As shown in FIG. 31, in the case where the M123-1 is determined as a specific apparatus, the head speed of "3" which the mounting condition determining apparatus 11 obtained from the specific apparatus is converted into a head speed of "1" and transmitted to the M221-1.

Since the mounting condition determining apparatus 11 has a conversion table for absorbing the differences in functions of component mounting apparatuses, the more suitable mounting conditions are set for each component mounting apparatus.

In addition, managing plural component mounting apparatuses becomes easier for the manager. Here is an example of a case where the M123's head speed of "3" is changed to "4" in the example shown in FIG. 31. When the mounting conditions for the M221-1 are set or modified by the mounting condition determining apparatus 11, the head speed is modified to "2" suitable for the M221-1.

In other words, in the case where a mounting condition among the mounting conditions for a specific apparatus is changed, the corresponding mounting conditions for the other component mounting apparatuses are automatically changed into the values suitable for the respective component mounting apparatuses, according to the change.

Note that the mounting condition determining apparatus 11 may store the conversion tables for the plural component mounting apparatuses belonging to different groups in advance. This makes it possible to set, for the component mounting apparatuses, the mounting conditions suitable for the component mounting apparatuses belonging to the groups other than the group to which the specific apparatus belongs.

In addition, the mounting condition determining apparatus 11 may store the conversion tables for the plural component mounting apparatuses of the same models. This makes it possible to absorb individual differences which exist among the same model apparatuses.

In addition, the conversion table shown in FIG. 30 indicates the association of the head speeds of the respective apparatus models in the M groups. However, the conversion table may indicate the association of other types of mounting conditions.

In other words, the respective two component mounting apparatuses may belong to or may not belong to different groups, as long as the values of mounting conditions for the specific apparatus are associated with the values of mounting conditions for each of the other component mounting conditions so as to absorb the differences in functions of these two component mounting apparatuses. Further, the types of the mounting conditions to be converted with reference to conversion tables are not limited to specific types.

Fourth Supplemental Point for First to Third Embodiments

Each mounting condition determining apparatus 11 in the first to third embodiments includes a communication unit 12, an identification unit 13, a group storing unit 14, a collecting unit 15 and a determining unit 16. The operations of these units can be realized by a computer having a central processing unit (CPU), a storing apparatus, an interface for inputting and outputting information, and the like.

For example, the operations of the mounting condition determining apparatus 11 in the first embodiment are realized as the following operations of the respective structural units of a computer.

In other words, the CPU of the computer receives friend or foe signals to be transmitted from the respective component mounting apparatuses via an interface. Further, the CPU recognizes the groups to which the respective component mounting apparatuses which have transmitted the friend or foe signals belong with reference to the information read out from the storage device. The results obtained through the recognition are summarized on a per group basis under control of the CPU and stored in the storage device.

In addition, with reference to the information read out from the storage device, the CPU transmits the requests for the task performance information to the respective component mounting apparatuses via an interface. Further, the CPU receives the task performance information to be transmitted as the responses to the requests via the interface, and identifies each of the component mounting apparatuses which transmitted the task performance information about the performance satisfying a predetermined standard. The CPU transmits the requests for the mounting conditions to the identified component mounting apparatus via the interface, and receives the mounting conditions to be transmitted as the responses to the requests via the interface.

Subsequently, the CPU identifies the component mounting apparatus to which the received mounting conditions are transmitted with reference to the information read out from the storage device, and transmits the identified component mounting apparatus via the interface.

Employing the operations like this makes it also possible to realize the mounting condition determining method of the present invention and the operations of the mounting condition determining apparatus of the present invention.

Likewise, the component mounting apparatuses 10 and 30 each includes a setting unit 20, a mechanical control unit 22, an error detecting unit 24, and a communication unit 26, and the operations of the respective structural units can be realized by a computer having a CPU, a storage device, an interface and the like.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is available as a method for determining the optimum mounting conditions for plural component mounting apparatuses. In particular, the present invention is useful as, for example, a method for determining the optimum mounting conditions in a manufacturing system constituting plural lines of apparatuses for manufacturing various types of component-mounted boards. Employing the present invention makes it possible to efficiently increase the productivities of the plural apparatuses constituting a manufacturing system.

The invention claimed is:

1. A component mounting method for determining a mounting condition to be set for at least one apparatus among apparatuses for manufacturing boards on which components are mounted, and mounting the components onto the boards at the at least one apparatus for which the mounting condition has been set, said component mounting method comprising:
determining, from among the apparatuses, a specific apparatus which satisfies a predetermined standard in performance associated with a manufacturing operation;
obtaining a mounting condition associated with the manufacturing operation from the specific apparatus determined in said determining; and
setting the mounting condition obtained in said obtaining for a first apparatus that is one of the apparatuses and that is not the specific apparatus,
wherein, in said obtaining, the first apparatus obtains the mounting condition from the specific apparatus without receiving an instruction for obtaining the mounting condition from outside the first apparatus,
wherein said component mounting method further comprises:
collecting performance information indicating the performance associated with the manufacturing operation from the first apparatus and another apparatus; and
comparing a performance of the first apparatus with a performance of the other apparatus, the respective performances being associated with the manufacturing operation and indicated by the performance information collected in said collecting, and
wherein, in a case where the comparison in said comparing shows that the performance of the other apparatus is higher than the performance of the first apparatus, the first apparatus obtains the mounting condition associated with the manufacturing operation of the other apparatus, the other apparatus being the specific apparatus in said obtaining.

2. The component mounting method according to claim 1, wherein each of the apparatuses belongs to one of groups classified based on attributes of the apparatuses,
wherein said component mounting method further comprises identifying apparatuses belonging to a predetermined group based on identification information for identifying each of the apparatuses, and
wherein, in said determining, the specific apparatus is determined from among the apparatuses belonging to the predetermined group identified in said identifying.

3. The component mounting method according to claim 2, further comprising
receiving the identification information from the first apparatus,
wherein, in a case where the identification information received in said receiving indicates that the first apparatus belongs to the predetermined group, the first apparatus is identified as one of the apparatuses in the predetermined group in said identifying.

4. The component mounting method according to claim 2, wherein, in said determining, an apparatus which provides a highest performance among the apparatuses belonging to the predetermined group is determined as the specific apparatus which satisfies the predetermined standard.

5. The component mounting method according to claim 2, wherein said component mounting method is executed by the first apparatus,
wherein the predetermined group is a group to which the first apparatus belongs,
wherein, in said determining, one of the apparatuses that is in the predetermined group and provides a performance higher than the performance of the first apparatus is determined as the specific apparatus which satisfies the predetermined standard, the respective performances being associated with the manufacturing operation, and
wherein in said setting, the mounting condition obtained in said obtaining is set for the first apparatus that is in the predetermined group and that is not the specific apparatus.

6. The component mounting method according to claim 2, wherein each of the apparatuses communicates with a mounting condition determining apparatus,
wherein said collecting, comparing, determining, and obtaining are executed by the mounting condition determining apparatus, and wherein, in said setting, the mounting condition is set for the first apparatus other than the specific apparatus within the predetermined group by transmitting the mounting condition from the mounting condition determining apparatus to the first apparatus.

7. A component mounting method for determining a mounting condition to be set for at least one apparatus among apparatuses for manufacturing boards on which components are mounted, and mounting the components onto the boards at the at least one apparatus for which the mounting condition has been set, said component mounting method comprising:

determining, from among the apparatuses, a specific apparatus which satisfies a predetermined standard in performance associated with a manufacturing operation;

obtaining a mounting condition associated with the manufacturing operation from the specific apparatus determined in said determining; and setting the mounting condition obtained in said obtaining for a first apparatus that is one of the apparatuses and that is not the specific apparatus, wherein each of the apparatuses belongs to one of groups classified based on attributes of the apparatuses, wherein said component mounting method further comprises identifying apparatuses belonging to a predetermined group based on identification information for identifying each of the apparatuses, wherein, in said determining, the specific apparatus is determined from among the apparatuses belonging to the predetermined group identified in said identifying, wherein said component mounting method is executed by the first apparatus, wherein the predetermined group is a group to which the first apparatus belongs, and wherein, in said determining, one of apparatuses that is in the predetermined group and provides a performance higher than a performance of the first apparatus is determined as the specific apparatus which satisfies the predetermined standard, the respective performances being associated with the manufacturing operation.

8. The component mounting method according to claim 7, further comprising receiving the identification information from the first apparatus, wherein, in a case where the identification information received in said receiving indicates that the first apparatus belongs to the predetermined group, the first apparatus is identified as one of the apparatuses in the predetermined group in said identifying.

9. The component mounting method according to claim 7, wherein, in said determining, an apparatus which provides the highest performance among the apparatuses belonging to the predetermined group is determined as the specific apparatus which satisfies the predetermined standard.

* * * * *